(12) United States Patent
Park et al.

(10) Patent No.: US 9,437,607 B2
(45) Date of Patent: Sep. 6, 2016

(54) SEMICONDUCTOR DEVICE AND METHOD OF MANUFACTURING THE SAME

(71) Applicants: Kwangmin Park, Seoul (KR); Byongju Kim, Seoul (KR); Jumi Yun, Pocheon-si (KR); Jaeyoung Ahn, Seongnam-si (KR)

(72) Inventors: Kwangmin Park, Seoul (KR); Byongju Kim, Seoul (KR); Jumi Yun, Pocheon-si (KR); Jaeyoung Ahn, Seongnam-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 8 days.

(21) Appl. No.: 13/967,492

(22) Filed: Aug. 15, 2013

(65) Prior Publication Data

US 2014/0073099 A1  Mar. 13, 2014

(30) Foreign Application Priority Data

Sep. 11, 2012  (KR) .......................... 10-2012-0100517

(51) Int. Cl.
| | |
|---|---|
| H01L 21/8239 | (2006.01) |
| H01L 21/8247 | (2006.01) |
| H01L 27/115 | (2006.01) |
| H01L 29/423 | (2006.01) |
| H01L 29/788 | (2006.01) |
| H01L 29/792 | (2006.01) |

(52) U.S. Cl.
CPC ... *H01L 27/11582* (2013.01); *H01L 27/11556* (2013.01); *H01L 29/42332* (2013.01); *H01L 29/7889* (2013.01); *H01L 29/7926* (2013.01)

(58) Field of Classification Search
CPC ................... H01L 27/11556; H01L 27/11582; H01L 29/42332; H01L 29/7889; H01L 29/7926

USPC .......................................................... 438/268
See application file for complete search history.

(56) References Cited

U.S. PATENT DOCUMENTS

| | | | |
|---|---|---|---|
| 7,846,797 B2 | 12/2010 | Hong | |
| 8,008,722 B2 | 8/2011 | Kim et al. | |
| 8,187,936 B2 | 5/2012 | Alsmeier et al. | |
| 8,236,650 B2 | 8/2012 | Son et al. | |
| 8,460,998 B2* | 6/2013 | Kim et al. | 438/261 |
| 8,803,222 B2* | 8/2014 | Lee | H01L 27/11556 257/324 |
| 9,012,974 B2* | 4/2015 | Chae et al. | 257/324 |
| 2006/0163644 A1* | 7/2006 | Bhattacharyya | 257/316 |
| 2006/0228841 A1* | 10/2006 | Kim et al. | 438/164 |
| 2006/0267072 A1* | 11/2006 | Bhattacharyya | 257/315 |
| 2008/0096351 A1* | 4/2008 | Kim et al. | 438/257 |
| 2009/0014781 A1* | 1/2009 | Baik | H01L 21/28282 257/324 |
| 2010/0072539 A1* | 3/2010 | Yasuda | H01L 21/28282 257/326 |
| 2010/0157680 A1* | 6/2010 | Higuchi et al. | 365/185.18 |
| 2010/0178759 A1* | 7/2010 | Kim et al. | 438/591 |
| 2010/0297826 A1* | 11/2010 | Yun | 438/424 |

(Continued)

FOREIGN PATENT DOCUMENTS

| | | |
|---|---|---|
| JP | 2009-111227 A | 5/2009 |
| JP | 2011-199194 A | 10/2011 |

(Continued)

*Primary Examiner* — Mary Wilczewski

(74) *Attorney, Agent, or Firm* — Volentine & Whitt, PLLC

(57) ABSTRACT

A semiconductor device has a vertical channel and includes a first tunnel insulating layer adjacent to a blocking insulating layer, a third tunnel insulating layer adjacent to a channel pillar, and a second tunnel insulating layer between the first and third tunnel insulating layers. The energy band gap of the third tunnel insulating layer is smaller than that of the first tunnel insulating layer and is larger than that of the second tunnel insulating layer.

15 Claims, 40 Drawing Sheets

(56) References Cited

U.S. PATENT DOCUMENTS

| | | | |
|---|---|---|---|
| 2011/0049608 A1* | 3/2011 | Kidoh et al. | 257/324 |
| 2011/0156131 A1 | 6/2011 | Ozawa | |
| 2012/0092926 A1 | 4/2012 | Whang et al. | |
| 2012/0098139 A1* | 4/2012 | Chae | H01L 29/7926 257/773 |
| 2013/0062685 A1* | 3/2013 | Yasuda et al. | 257/325 |
| 2014/0073099 A1* | 3/2014 | Park et al. | 438/268 |
| 2014/0367763 A1* | 12/2014 | Yasuda | H01L 29/792 257/324 |

FOREIGN PATENT DOCUMENTS

| | | | | |
|---|---|---|---|---|
| KR | 101052328 | * | 7/2011 | ............ H01L 27/115 |
| KR | 10-2011-0118961 A | | 11/2011 | |
| KR | 1020130116604 | | 10/2013 | |

* cited by examiner

SEMICONDUCTOR DEVICE AND METHOD OF MANUFACTURING THE SAME

PRIORITY STATEMENT

This U.S. non-provisional patent application claims priority under 35 U.S.C. §119 to Korean Patent Application No. 10-2012-0100517, filed on Sep. 11, 2012, the entire contents of which are hereby incorporated by reference.

BACKGROUND

The inventive concept relates to semiconductor devices and methods of manufacturing the same.

There is an ever increasing demand for highly integrated semiconductor devices that offer excellent performance and/or which can be manufactured at low cost. However, the degree to which a memory device is integrated affects its cost of manufacture. Semiconductor memory devices are made up of a plurality of unit memory cells and so, the integration density of a semiconductor memory device may correspond to the number of cells per unit area. That is, in the case of a conventional two-dimensional memory device, the degree to which the device can be integrated depends on the size of a planar area in which the unit memory cell may be fabricated ad the spacing that can be provided between adjacent cells. And, because memory cells are constituted by patterns, the integration density that can be attained in the case of a two-dimensional memory device depends on the fineness to which the patterns can be formed. Therefore, the degree to which two-dimensional semiconductor memory devices can be integrated is limited despite the demands for higher density devices. Moreover, the high cost equipment or apparatuses required to form fine patterns imposes practical limits on manufacturers of semiconductor memory devices.

SUMMARY

According to one aspect of the inventive concept, there is provided a semiconductor device that includes gate structures disposed on a substrate and each including vertically stacked horizontal electrodes, a respective semiconductor pillar penetrating the stacked horizontal electrodes of at least one of the gate structures and electrically connected to the substrate, a charge storage layer interposed between the semiconductor pillar and the horizontal electrodes, first, second and third tunnel insulating layers of reverse type tunnel insulation interposed between the charge storage layer and the semiconductor pillar, and a blocking insulating layer. The horizontal electrodes each extend lengthwise in a first direction, and the gate structures face each other in a second direction crossing the first direction. The blocking insulating layer interposed between the charge storage layer and the horizontal electrodes. The first tunnel insulating layer is the tunnel insulating layer that is closest to the charge storage layer, the third tunnel insulating layer is the tunnel insulating layer that is closest to the semiconductor pillar, and the second tunnel insulating layer is interposed between the first and third tunnel insulating layers. Also, the energy band gap of the third tunnel insulating layer is larger than that of the second tunnel insulating layer.

According to another aspect, there is provided a semiconductor device that includes gate structures disposed on a substrate and each including vertically stacked horizontal electrodes, a respective semiconductor pillar penetrating the horizontal electrodes of at least one of the gate structures and electrically connected to the substrate, a charge storage layer interposed between the semiconductor pillar and the horizontal electrodes, first, second and third tunnel insulating of reverse type tunnel insulation interposed between the charge storage layer and the semiconductor pillar, and a blocking insulating layer interposed between the charge storage layer and the horizontal electrodes. The horizontal electrodes extend lengthwise in a first direction, and the gate structures face each other in a second direction crossing the first direction. The first tunnel insulating layer is the tunnel insulating layer that is closest to the charge storage layer, the third tunnel insulating layer is the tunnel insulating layer that is closest to the semiconductor pillar, and the second tunnel insulating layer is interposed between the first and third tunnel insulating layers. Furthermore, the first tunnel insulating layer comprises at least one of a silicon oxide layer, a hafnium oxide layer, and an aluminum oxide layer, and the second tunnel insulating layer and the third tunnel insulating layer are each of at least one material selected from the group consisting of silicon, hafnium, and aluminum oxynitrides. In addition, the nitrogen concentration of the second tunnel insulating layer is higher than that of the third tunnel insulating layer.

According to still another aspect of the inventive concept, there is provided a semiconductor device that includes a semiconductor pattern, a gate electrode adjacent to the semiconductor pattern, a charge storage layer interposed between the semiconductor pattern and the gate electrode, first, second and third tunnel insulating layers interposed between the charge storage layer and the semiconductor pattern, and a blocking insulating layer interposed between the charge storage layer and the gate electrode, and in which the first tunnel insulating layer is the tunnel insulating layer that is closest to the charge storage layer, the third tunnel insulating layer is the tunnel insulating layer that is closest to the semiconductor pattern, the second tunnel insulating layer is interposed between the first and third tunnel insulating layers, and the energy band gap of the third tunnel insulating layer is smaller than that of the first tunnel insulating layer and is larger than that of the second tunnel insulating layer.

According to still another aspect of the inventive concept, there is provided a method of manufacturing a semiconductor device that includes alternately forming first material layers and second material layers on a substrate, forming a hole through the second material layers and the first material layers and exposing the substrate, forming a first tunnel insulation layer on an inner sidewall surface delimiting sides of the hole, forming a second tunnel insulating layer on the first tunnel insulating layer, and forming a third tunnel insulating layer on the second tunnel insulating layer, and subsequently forming a semiconductor layer directly on the third tunnel insulation layer so as to be in contact with the third tunnel insulation layer, and in which the tunnel insulating layers are formed in such a way that the second tunnel insulating layer is located between the first and third tunnel insulating layers, and such that the energy band gap of the third tunnel insulating layer is smaller than that of the first tunnel insulating layer and is larger than that of the second tunnel insulating layer.

According to still another aspect of the inventive concept, there is provided a method of manufacturing a semiconductor device that includes forming first, second and third tunnel insulating layers on a charge storage layer, and forming a semiconductor layer, and in which the forming of the tunnel insulating layers comprises sequentially forming a first preliminary tunnel insulating layer, a second preliminary tunnel insulating layer and a third preliminary tunnel insulating layer one on the other and such that the energy band gap of the second preliminary tunnel insulating layer is smaller than that of the first preliminary tunnel insulating layer and larger than that of the third preliminary tunnel insulating layer, and performing an oxidation treatment on the preliminary tunnel insulating layers.

BRIEF DESCRIPTION OF THE DRAWINGS

The inventive concept will become more apparent in view of the attached drawings and accompanying detailed description.

DETAILED DESCRIPTION OF THE PREFERRED EMBODIMENTS

Figure 1A:
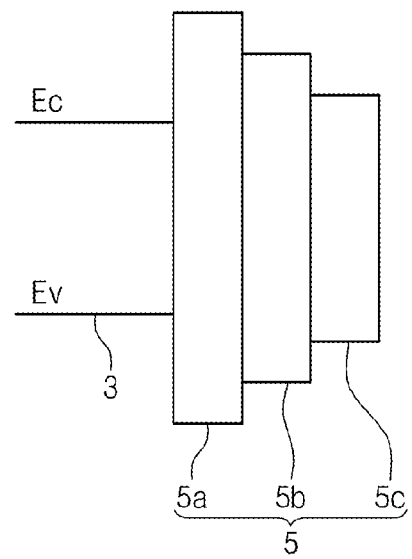
FIGS. 1A, 1B, and 1C are energy band diagrams for explaining a tunnel insulating layer according to examples of the inventive concept.

Various embodiments and examples of embodiments of the inventive concept will be described more fully hereinafter with reference to the accompanying drawings. In the drawings, the sizes and relative sizes and shapes of elements, layers and regions, such as implanted regions, shown in section may be exaggerated for clarity. In particular, the cross-sectional illustrations of the semiconductor devices and intermediate structures fabricated during the course of their manufacture are schematic. Also, like numerals are used to designate like elements throughout the drawings.

Furthermore, as used herein, the term "and/or" includes any and all practical combinations of one or more of the associated listed items.

It will also be understood that when an element or layer is referred to as being "on" or "connected to" another element or layer, it can be directly on or directly connected to the other element or layer or intervening elements or layers may be present. In contrast, when an element or layer is referred to as being "directly on" or "directly connected to" another element or layer, there are no intervening elements or layers present. Also, "on" may be used in a relative sense as the context makes clear. Thus, a second layer that is formed side-by-side with respect to a first layer in the orientation shown in the drawings may be considered as formed or disposed on the first layer.

It will also be understood that although the terms first, second, third etc. are used herein to describe various elements, regions, layers, etc., these elements, regions, and/or layers are not limited by these terms. These terms are only used to distinguish one element, layer or region from another.

Other terminology used herein for the purpose of describing particular examples or embodiments of the inventive concept is to be taken in context. For example, the terms "comprises" or "comprising" when used in this specification specifies the presence of stated features or processes but does not preclude the presence or additional features or processes. Furthermore, unless specified, layers of a multi-layered element may be formed in any sequence. Also, the term "extending" even if not specified will generally connote a longitudinal direction of an element that has a lengthwise dimension in a given plane greater than its width in the same plane. Similarly, as the context will make clear, "connections" generally refer to electrical connections.

Reverse type tunnel insulation according to the inventive concept will now be described with reference to the energy band diagrams of FIGS. 1A, 1B, and 1C. In this respect, reverse type tunnel insulation refers to a tunnel insulating layer(s) formed before a semiconductor layer that will serve as a channel region.

Referring to FIG. 1A, a preliminary tunnel insulating layer 5 is formed on a charge storage layer 3. The charge storage layer 3 may be a charge trap layer, or an insulating layer including nano particles. The charge trap layer may include, for example, a silicon nitride layer. Alternatively, the charge storage layer 3 may be a floating gate formed of poly-silicon. An energy band gap of the preliminary tunnel insulating layer 5 is greater than that of the charge storage layer 3.

The preliminary tunnel insulating layer 5 may include a first preliminary tunnel insulating layer 5a, a second preliminary tunnel insulating layer 5b, and a third preliminary tunnel insulating layer 5c that are sequentially stacked on the charge storage layer 3. The energy band gap of the preliminary tunnel insulating layer 5 may be progressively reduced as a distance from the charge storage layer 3 increases. In other words, in this case, an energy band gap of the second preliminary tunnel insulating layer 5b is smaller than that of the first preliminary tunnel insulating layer 5a and is greater than that of the third preliminary tunnel insulating layer 5c.

The first preliminary tunnel insulating layer 5a may include at least one of a silicon oxide layer and a high-k dielectric layer (e.g., a hafnium oxide layer or an aluminum oxide layer). The second preliminary tunnel insulating layer 5b and the third preliminary tunnel insulating layer 5c may include at least one of a silicon oxynitride layer and a high-k dielectric layer containing nitrogen (e.g., a hafnium oxynitride layer or an aluminum oxynitride layer). A nitrogen concentration of the third preliminary tunnel insulating layer 5c may be greater than that of the second preliminary tunnel insulating layer 5b. In an embodiment, the first, second, and third preliminary tunnel insulating layers 5a, 5b, and 5c are a silicon oxide layer, a silicon oxynitride layer having a low nitrogen concentration, and a silicon oxynitride layer having a high nitrogen concentration that are sequentially stacked, respectively. In another embodiment, the first, second, and third preliminary tunnel insulating layers 5a, 5b, and 5c are a silicon oxynitride layer having a low nitrogen concentration, a silicon oxynitride layer having a medium nitrogen concentration, and a silicon oxynitride layer having a high nitrogen concentration that are sequentially stacked, respectively.

The energy band gap of the preliminary tunnel insulating layer 5 is engineered. Engineering the energy band gap of the preliminary tunnel insulating layer 5 may include thermally treating the preliminary tunnel insulating layer 5. For example, the thermal treatment of the preliminary tunnel insulating layer 5 may be performed under an oxidation atmosphere. The thermal treatment of the preliminary tunnel insulating layer 5 may be performed under, for example, a $N_2O$ gas atmosphere or a NO gas atmosphere. The thermal treatment of the preliminary tunnel insulating layer 5 may be, for example, a radical oxidation process or a plasma oxidation process. A temperature of the thermal treatment may have a range of about 750 degrees Celsius to about 950 degrees Celsius. Thus, the amount of oxygen supplied into the third preliminary tunnel insulating layer 5c may be greater than the amount of oxygen supplied into the second preliminary tunnel insulating layer 5b.

Figure 1B:
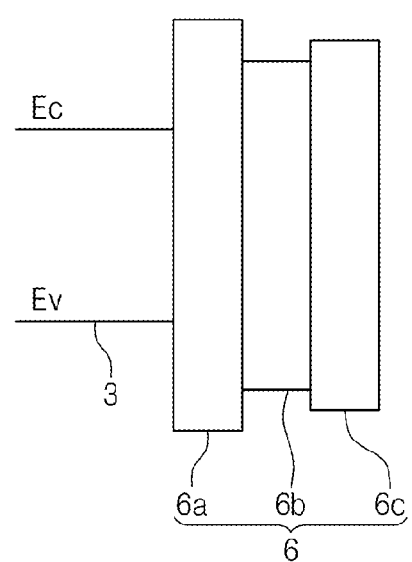

The engineering of the energy band gap of the preliminary tunnel insulating layer 5 forms a tunnel insulating layer 6 as illustrated in FIG. 1B in which an energy band gap of the tunnel insulating layer 6 is progressively reduced and then increased as a distance from the charge storage layer 3 increases. The tunnel insulating layer 6 may include a first tunnel insulating layer 6a, a second tunnel insulating layer 6b, and a third tunnel insulating layer 6c which are sequentially stacked on the charge storage layer 3. In this case, an energy band gap of the third tunnel insulating layer 6c is greater than that of the second tunnel insulating layer 6b. The energy band gap of the third tunnel insulating layer 6c is smaller than that of the first tunnel insulating layer 6a.

The first tunnel insulating layer 6a may include at least one of a silicon oxide layer and a high-k dielectric layer (e.g., a hafnium oxide layer or an aluminum oxide layer). The second tunnel insulating layer 6b and the third tunnel insulating layer 6c may include at least one of a silicon oxide layer and a high-k dielectric layer (e.g., a hafnium oxide layer or an aluminum oxide layer) and may contain nitrogen. For example, the second tunnel insulating layer 6b and the third tunnel insulating layer 6c may include at least one of a silicon oxynitride layer, a hafnium oxynitride layer, and an aluminum oxynitride layer. A nitrogen concentration of the third tunnel insulating layer 6c may be lower than that of the second tunnel insulating layer 6b. In an embodiment, the first, second, and third tunnel insulating layers 6a, 6b, and 6c are a silicon oxide layer, a silicon oxynitride layer having a high nitrogen concentration, and a silicon oxynitride layer having a low nitrogen concentration that are sequentially stacked, respectively. In another embodiment, the first, second, and third tunnel insulating layers 6a, 6b, and 6c are a silicon oxynitride layer having a low nitrogen concentration, a silicon oxynitride layer having a high nitrogen concentration, and a silicon oxynitride layer having a medium nitrogen concentration that are sequentially stacked, respectively.

Figure 1C:
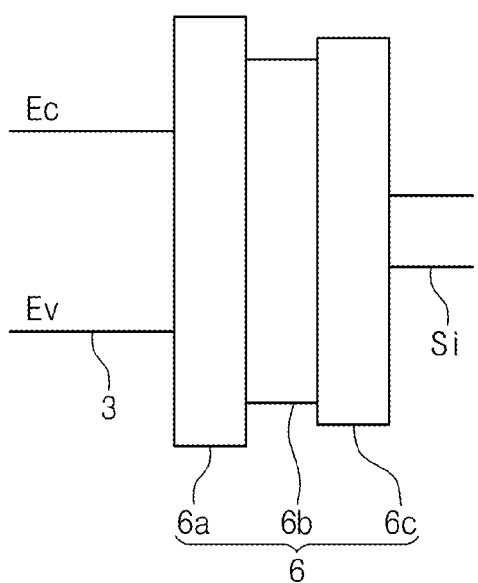

Thereafter, as illustrated in FIG. 1C, a semiconductor layer (e.g., a silicon layer) Si used as a channel region may be formed on the tunnel insulating layer 6.

As described above, according to an aspect of the inventive concept, the preliminary tunnel insulating layer having the progressively reduced energy band gap is formed and then the energy band gap of the preliminary tunnel insulating layer is altered ("engineered") to form the tunnel insulating layer 6. Also, this process is part of a reverse type tunnel insulating layer formation process which includes forming the semiconductor layer Si used as the channel region. Such a reverse type tunnel insulating layer formation process according to the inventive concept results in enhanced retention and endurance characteristics of the tunnel insulating layer 6. Additionally, dangling bonds between the semiconductor layer Si and the tunnel insulating layer 6 are minimized because an interface between the semiconductor layer Si and the tunnel insulating layer 6 is rich in nitrogen atoms. As a result, interface characteristics between a tunnel insulating layer and the semiconductor layer Si are also improved according to the inventive concept.

Figure 2:
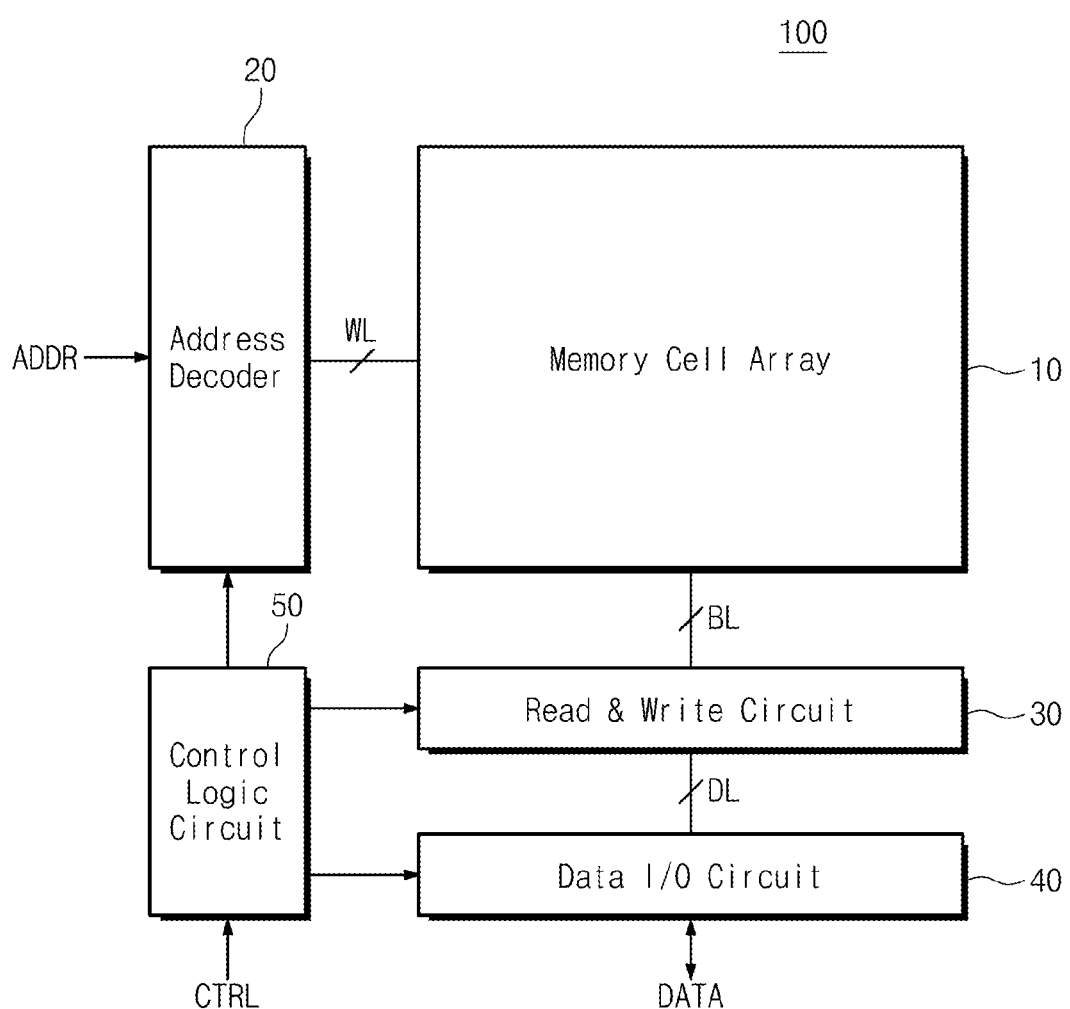
FIG. 2 is a schematic block diagram illustrating an example of a semiconductor device according to the inventive concept.

FIG. 2 illustrates an example of a semiconductor device according to the inventive concept.

Referring to FIG. 2, the semiconductor device of this example includes a memory cell array 10, an address decoder 20, a read/write circuit 30, a data input/output (I/O) circuit 40, and a control logic circuit 50.

The memory cell array 10 is connected to the address decoder 20 through a plurality of word lines WL and is connected to the read/write circuit 30 through a plurality of bit lines BL. The memory cell array 10 includes a plurality of memory cells. For example, the memory cell array 10 may be configured to store one or more bits in one memory cell.

The address decoder 20 is connected to the memory cell array 10 through the word lines WL. The address decoder 20 may be configured to be operated in response to a control signal of the control logic circuit 50. The address decoder 20 may receive address signals ADDR from an external system. The address decoder 20 may decode a row address signal of the received address signals ADDR and then may select a word line corresponding to the decoded row address signal from the plurality of word lines WL. Additionally, the address decoder 20 may decode a column address signal of the received address signals ADDR and then may transmit the decoded column address signal to the read/write circuit 30. For example, the address decoder 20 may include well-known elements such as a row decoder, a column decoder, and/or an address buffer.

The read/write circuit 30 is connected to the memory cell array 10 through the bit lines BL and is connected to the data I/O circuit 40 through data lines DL. The read/write circuit 30 may be operated in response to a control signal of the control logic circuit 50. The read/write circuit 30 may be configured to receive the decoded column address signal from the address decoder 20. The read/write circuit 30 may select one of the bit lines BL by the decoded column address signal. For example, the read/write circuit 30 may receive data from the data I/O circuit 40 and then may write the received data into the memory cell array 10. The read/write circuit 30 may read data from the memory cell array 10 and then may transmit the read data to the data I/O circuit 40. The read/write circuit 30 may read the data from a first storage region of the memory cell array 10 and may write the read data into a second storage region of the memory cell array 10. For example, the read/write circuit 30 may be configured to perform a copy-back operation.

In one example of this embodiment, the read/write circuit 30 includes a page buffer (or a page register) and a column selection circuit. In another example, the read/write circuit 30 includes a sense amplifier, a write driver, and a column selection circuit.

The data I/O circuit 40 is connected to the read/write circuit 30 through the data lines DL. The data I/O circuit 40 may be operated in response to a control signal of the control logic circuit 50. The data I/O circuit 40 may be configured to exchange the data DATA with the external system. The data I/O circuit 40 may be configured to transmit the data DATA inputted from the external system to the read/write circuit 30 through the data lines DL. Additionally, the data I/O circuit 40 may be configured to output the data DATA transmitted from the read/write circuit 30 to the external system through the data lines DL. For example, the data I/O circuit 40 may include a data buffer.

The control logic circuit 50 is connected to the address decoder 20, the read/write circuit 30, and the data I/O circuit 40. The control logic circuit 50 may be configured to control an operation of the semiconductor device. The control logic circuit 50 may be operated in response to a control signal CTRL transmitted from the external system.

Figure 3:
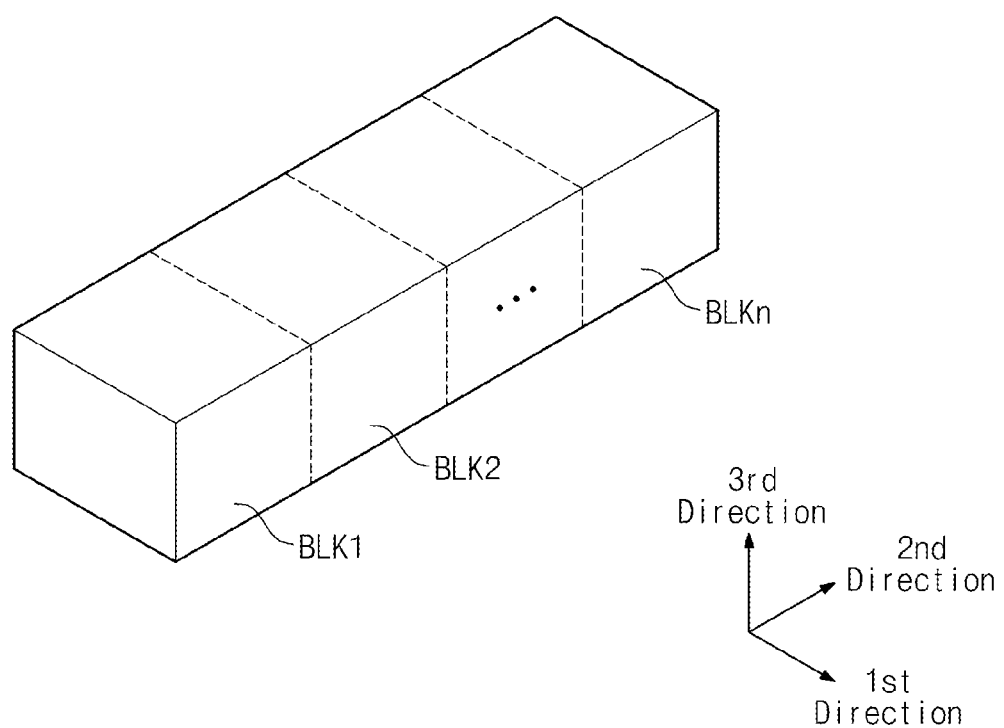
FIG. 3 is a schematic block diagram illustrating an example of a memory cell array of FIG. 2.

FIG. 3 illustrates an example of the memory cell array 10 of the device shown in FIG. 2.

Referring to FIG. 3, the memory cell array 10 of this example includes a plurality of memory blocks BLK1 to BLKn. Each of the memory blocks BLK1 to BLKn may have a three-dimensional (3D) structure (or a vertical structure). For example, each of the memory blocks BLK1 to BLKn may include structures extending in first, second, and/or third directions crossing each other. For example, each of the memory blocks BLK1 to BLKn may include a plurality of cell strings extending in the third direction.

Figure 4:
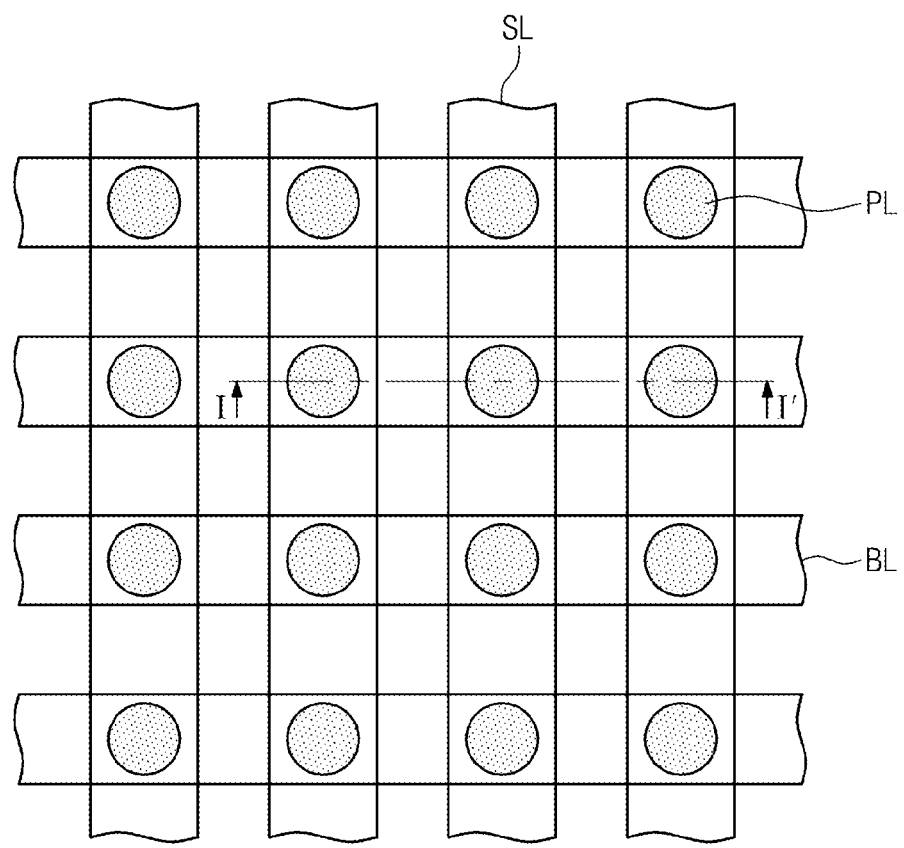
FIG. 4 is a plan view of an example of a memory block of a semiconductor device according to the inventive concept.

FIG. 4 illustrates an example of a memory block of a semiconductor device according to the inventive concept.

Referring to FIG. 4, in this example, selection lines SL extend in a first direction. Bit lines BL may extend in a second direction crossing the first direction. Semiconductor pillars PL are provided at regions where the selection lines SL cross the bit lines BL, respectively. The selection lines SL may be gate electrodes described later.

Figure 5:
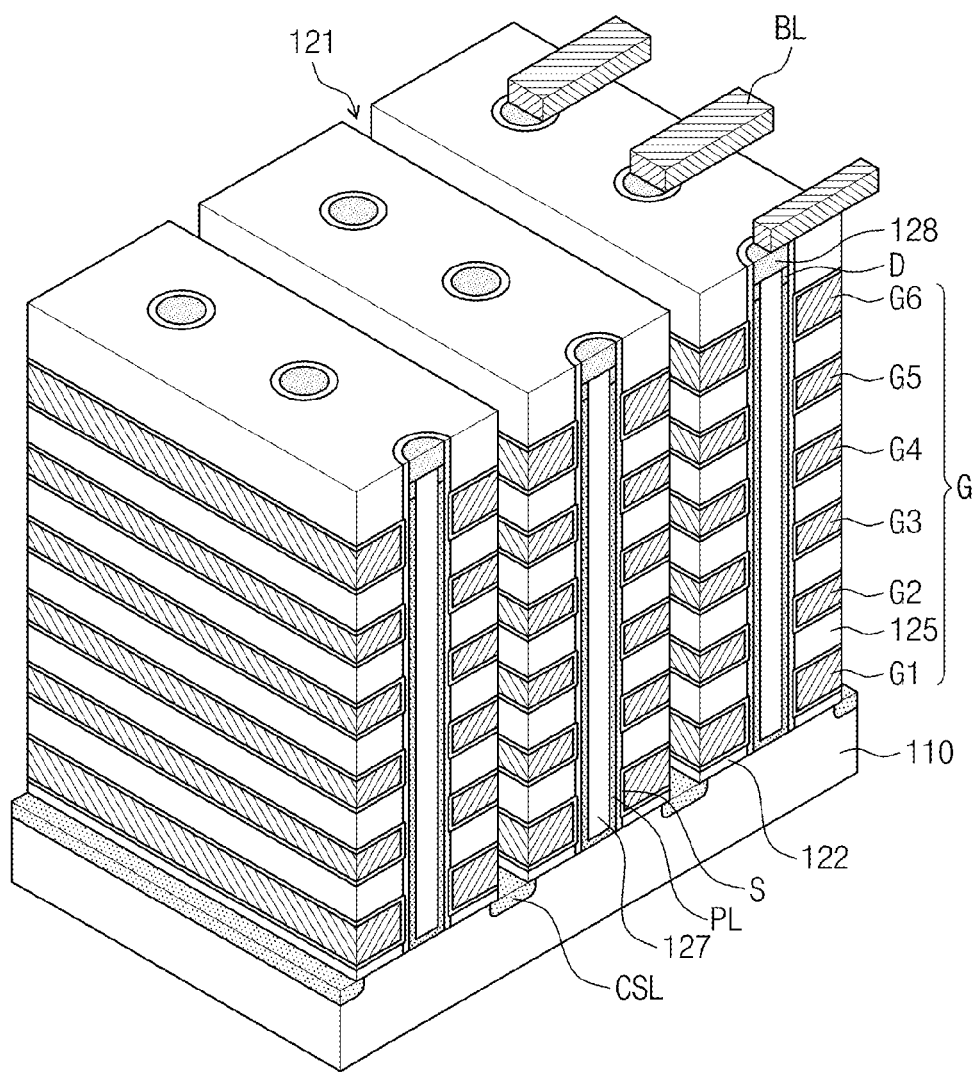
FIG. 5 is a perspective view of a memory block of an example of a semiconductor device according to the inventive concept.

FIG. 5 illustrates an example of a memory block of a semiconductor device according to the inventive concept.

Referring to FIG. 5, a substrate 110 is provided. The substrate 110 may have a first conductivity type (e.g., a P-type). A buffer dielectric layer 122 may be provided on the substrate 110. The buffer dielectric layer 122 may include a silicon oxide layer. Insulating patterns 125 and horizontal electrodes may be provided on the buffer dielectric layer 122. The horizontal electrodes may be vertically spaced apart from each other with the insulating patterns 125 therebetween.

The horizontal electrodes may include first to sixth horizontal electrodes G1 to G6 sequentially stacked on the substrate 110. The insulating patterns 125 may include silicon oxide. The buffer dielectric layer 122 may be thinner than each of the insulating patterns 125. The horizontal electrodes G1 to G6 may include doped silicon, a metal (e.g., tungsten), a metal nitride, a metal silicide, or any combination thereof. The insulating patterns 125 and the horizontal electrodes G1 to G6 may be alternately stacked on the substrate 110. The insulating patterns 125 and the horizontal electrodes G1 to G6 constitute a gate structure G.

The gate structure G may extend longitudinally horizontally in a first direction. A plurality of the gate structures G may be disposed on the substrate 110. The gate structures G may face each other (i.e., may be arrayed) in a second horizontal direction crossing the first direction. The sixth horizontal electrode G6 may be an upper selection gate of a flash memory device. The first horizontal electrode G1 may be a lower selection gate of the flash memory device. The upper selection gate and the lower selection gate may be a string selection gate and a ground selection gate, respectively. Six horizontal electrodes G1 to G6 are illustrated in FIG. 5. However, the inventive concept is not limited thereto. Seven or more horizontal electrodes may be sequentially stacked on the substrate 110.

A separation region 121 extending in the first direction is provided between the gate structures G. The separation region 121 may be filled with a separation insulating layer (not shown in this figure, but designated by reference numeral 143 in FIGS. 14A, 19A, and 24A). As illustrated in FIG. 5, a plurality of the separation regions 121 and the gate structures G are alternately arranged in the second direction. A common source lines CSL may be provided in the substrate 110 under each of the separation regions 121. The common source lines CSL may be spaced apart from each other and may extend in the first direction in the substrate 110. The common source lines CSL may have a second conductivity type (e.g., an N-type) different from the first conductivity type. As an alternative to the example shown in FIG. 5, the common source lines CSL may be line patterns that are provided between the substrate 110 and the first horizontal electrode G1. The line patterns may extend in the first direction.

Semiconductor pillars PL penetrate the horizontal electrodes G1 to G6. The semiconductor pillars PL have long axes extending upward from the substrate 110 (i.e., in the third direction). The semiconductor pillars PL may be coupled to the upper selection gate extending in the first direction. First ends of the semiconductor pillars PL may be connected to the substrate 110, and second ends of the semiconductor pillars PL may be connected to bit lines BL extending in the second direction.

The semiconductor pillars PL include a semiconductor material. Each of the semiconductor pillars PL may have a filled cylinder shape or a hollow cylinder shape (e.g., a macaroni shape or a hollow tube shape). The inside of the semiconductor pillar PL having the macaroni shape may be filled with a filling insulating layer 127. The filling insulating layer 127 may be a silicon oxide layer. The filling insulating layer 127 may be in direct contact with an inner sidewall of the semiconductor pillar PL. The semiconductor pillars PL and the substrate 110 may be contiguous with each other without interfaces therebetween. In other words, the semiconductor pillars PL and the substrate 110 may constitute a unitary structure. In this case, the semiconductor pillars PL may be formed of a single-crystalline semiconductor. Alternatively, the substrate 110 and the semiconductor pillars PL may have discontinuous interfaces. In this case, the semiconductor pillars PL may be poly-crystalline or amorphous semiconductor pillars. Conductive patterns 128 may be provided on the second ends of the semiconductor pillars PL, respectively. End portions of the semiconductor pillars PL, which are in contact with the conductive patterns 128, respectively, may be drain regions D.

A data storage element S is provided between each of the first to sixth horizontal electrodes G1 to G6 and each of the semiconductor pillars PL. In the example of FIG. 5, a portion of the data storage element S extends between the horizontal electrodes G1 to G6 and the insulating patterns 125, and another portion of the data storage elements S extends between the horizontal electrodes G1 to G6 and the semiconductor pillars PL. However, the inventive concept is not limited thereto. The data storage element S may have other forms as described later.

A plurality of cell strings are provided between the bit lines BL and the common source lines CSL. Each of the cell strings may include an upper selection transistor connected to the bit line BL, a lower selection transistor connected to the common source line CSL, and a plurality of memory cells provided between the upper selection transistor and the lower selection transistor. The first horizontal electrode G1 may be a lower selection gate electrode of the lower selection transistor, and the second to fifth horizontal electrodes G2 to G5 may be cell gate electrodes of the plurality of memory cells. The sixth horizontal electrode G6 may be an upper selection gate electrode of the upper selection transistor. The plurality of memory cells are provided at one semiconductor pillar PL.

A method of manufacturing a semiconductor device according to the inventive concept will be described hereinafter.

Figure 6A:
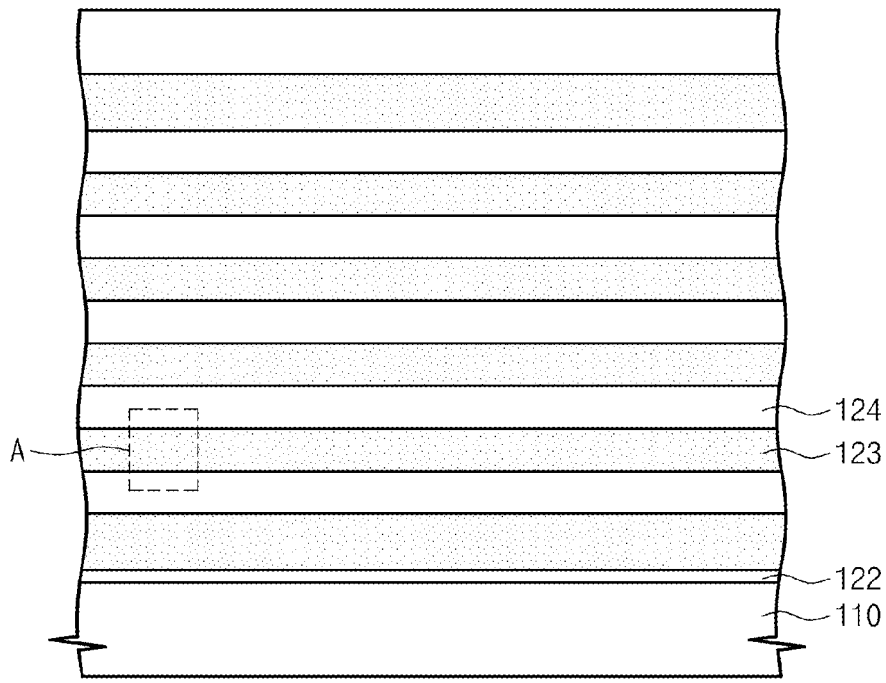
FIGS. 6A, 7A, 8A, 9A, 10A, 11A, 12A, 13A and 14A are cross-sectional views taken along direction corresponding to that of a line I-I' of FIG. 4 illustrating an embodiment of a method of manufacturing a semiconductor device according to the inventive concept.
Figure 6B:
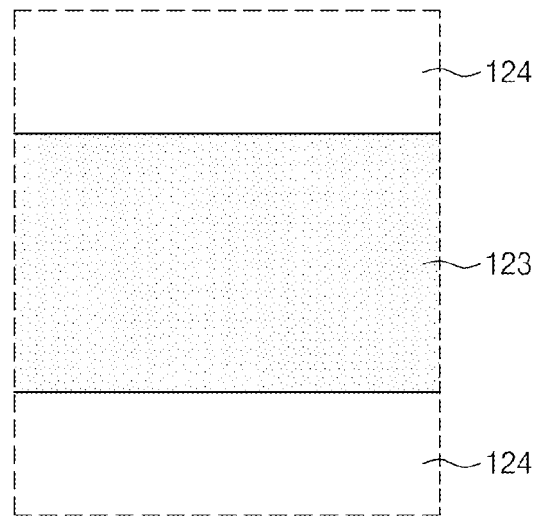
FIGS. 6B, 7B, 8B, 9B, 10B, 11B, 12B, 13B and 14B are enlarged views of portions A of FIGS. 6A, 7A, 8A, 9A, 10A, 11A, 12A, 13A and 14A, respectively.

Referring to FIGS. 6A and 6B, a substrate 110 is provided. The substrate 110 may have a first conductivity type (e.g., a P-type). A buffer dielectric layer 122 may be formed on the substrate 110. The buffer oxide layer 122 may include, for example, a silicon oxide layer. The buffer oxide layer 122 may be formed by, for example, a thermal oxidation process. First material layers 123 and second material layers 124 may be alternately stacked on the buffer dielectric layer 122. The second material layers 124 may be insulating layers (e.g., silicon oxide layers). The first material layers 123 may include a material having an etch selectivity with respect to the buffer dielectric layer 122 and the second material layers 124. The first material layers 123 may be sacrificial layers including silicon nitride, silicon oxynitride, or poly-silicon. The first material layers 123 and the second material layers 124 may be formed by, for example, a chemical vapor deposition (CVD) method.

Figure 7A:
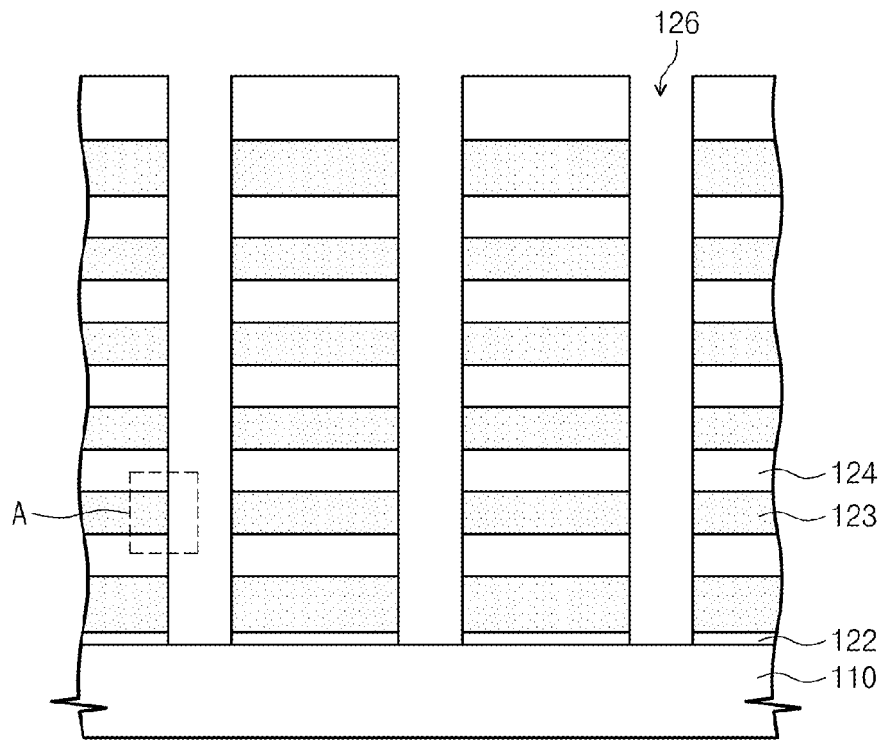
Figure 7B:
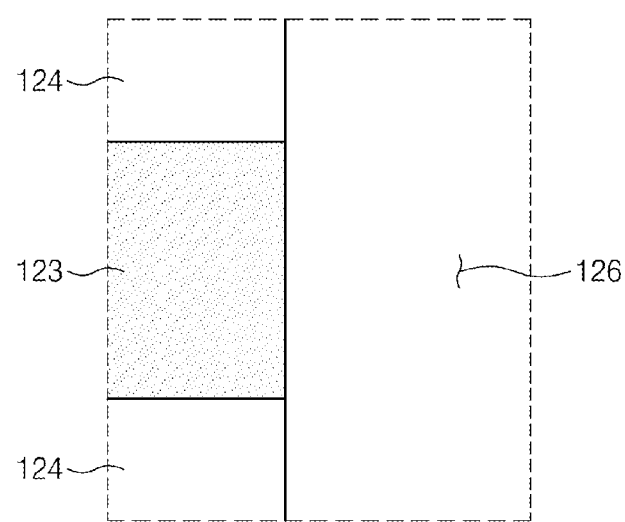

Referring to FIGS. 7A and 7B, cell holes 126 (e.g., through-holes) are formed to penetrate the second material layers 124, the first material layers 123, and the buffer dielectric layer 122. The cell holes 126 expose the substrate 110. The cell holes 126 may be disposed at positions of the semiconductor pillars PL described with reference to FIG. 4, respectively.

Figure 8A:
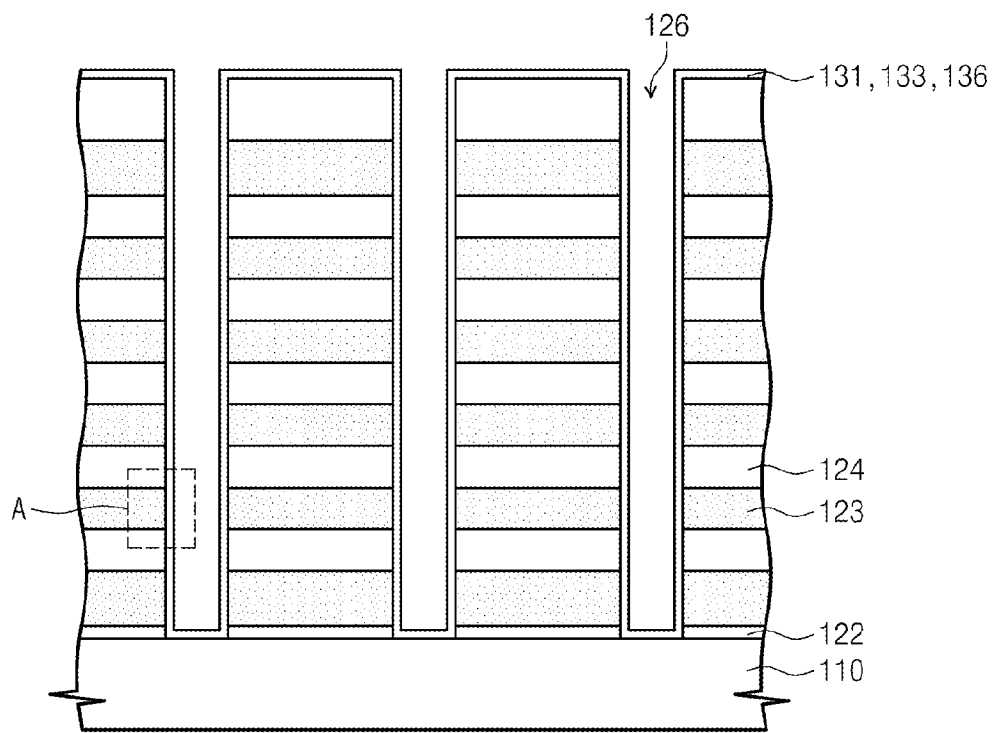
Figure 8B:
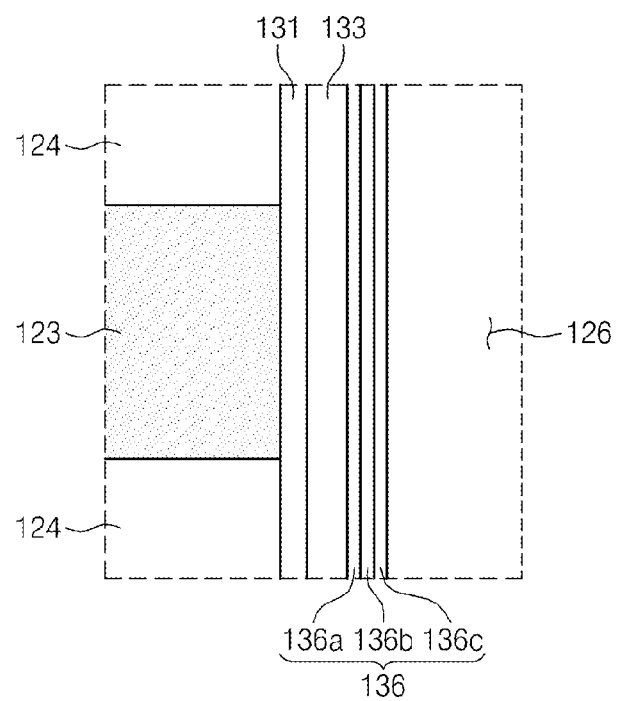
Figure 9A:
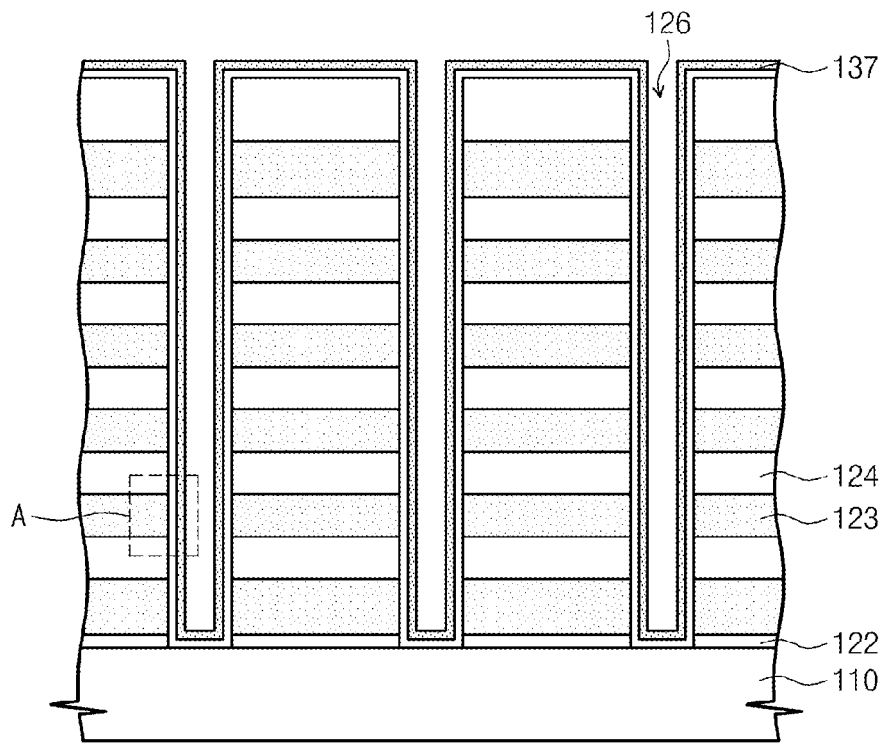
Figure 9B:
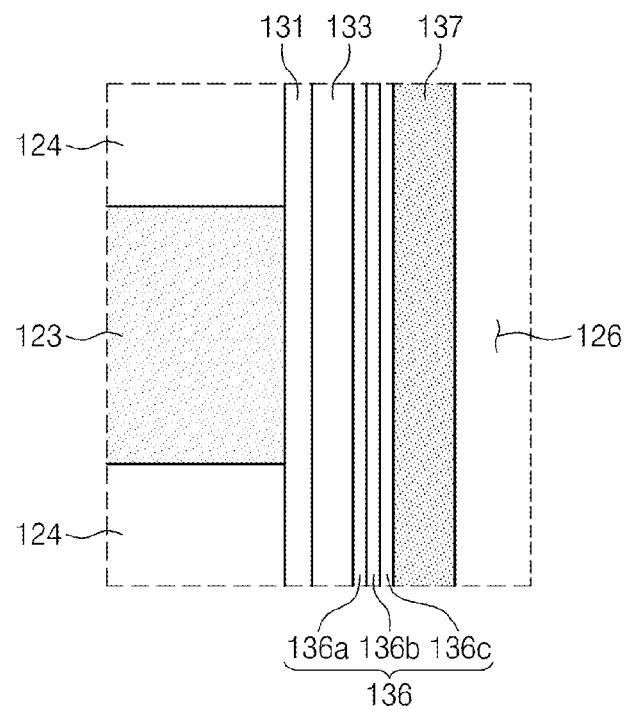
Figure 10A:
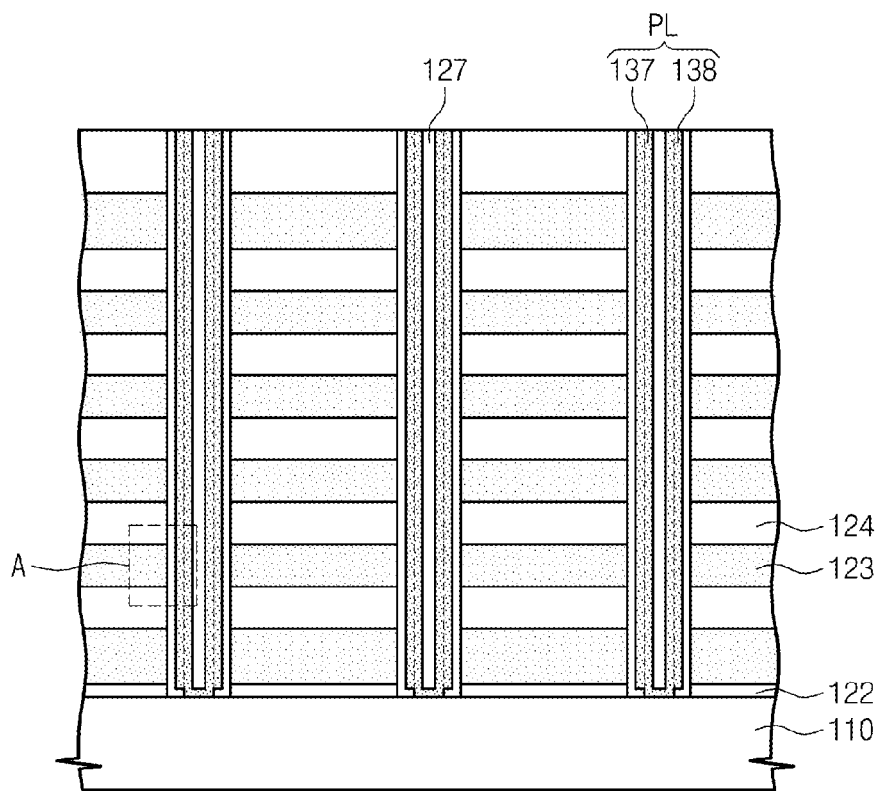
Figure 10B:
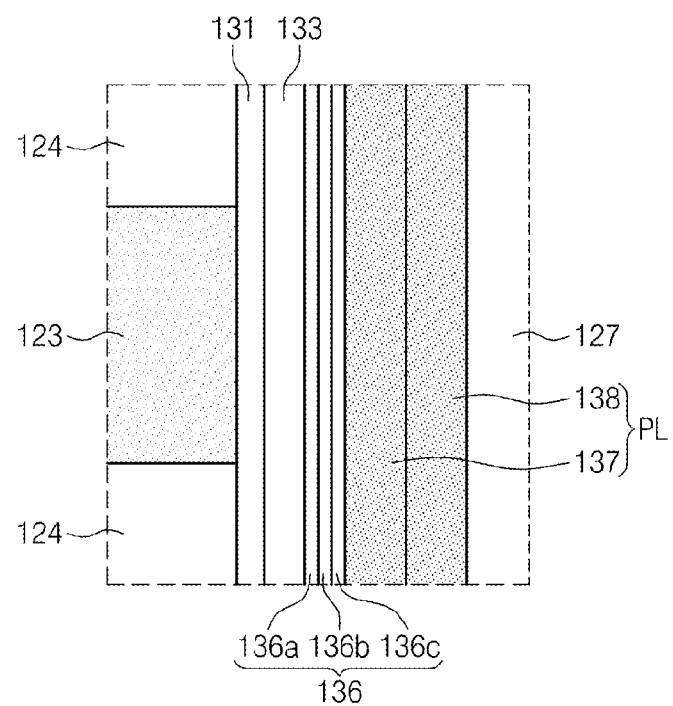

Referring to FIGS. 8A and 8B, a protecting layer 131 may be formed on surfaces delimiting the sides the cell holes 126. The protecting layer 131 may be a silicon oxide layer. A charge storage layer 133 is formed on the protecting layer 131. The charge storage layer 133 may be a charge trap layer or an insulating layer including conductive nano particles. The charge trap layer may include, for example, a silicon nitride layer. The protecting layer 131 and the charge storage layer 133 may be formed by an atomic layer deposition (ALD) method.

A tunnel insulating layer 136 is formed on the charge storage layer 133. The tunnel insulating layer 136 includes a first tunnel insulating layer 136a, a second tunnel insulating layer 136b, and a third tunnel insulating layer 136c. The tunnel insulating layer 136 is formed by the reverse type tunnel insulating layer formation process described with reference to FIGS. 1A and 1B. Thus, in this embodiment, the tunnel insulating layer 136 has any of the structures of and the same energy band gap as the tunnel insulating layer 6 described with reference to FIG. 1B.

Referring to FIGS. 9A, 9B, 10A, and 10B, a first semiconductor layer 137 is formed on the tunnel insulating layer 136. The first semiconductor layer 137 may be anisotropically etched to expose the substrate 110. Thus, the first semiconductor layer 137 may be formed into a spacer semiconductor layer remaining on a sidewall of the tunnel insulating layer 136. A second semiconductor layer 138 may be formed on the first semiconductor layer 137. The first and second semiconductor layers 137 and 138 may be formed by an ALD method. The first and second semiconductor layers 137 and 138 may be in an amorphous state. For example, the first and second semiconductor layers 137 and 138 may be amorphous silicon layers. A thermal treatment process may be performed to convert the amorphous state of the first and second semiconductor layers 137 and 138 into a poly-crystalline state or a single-crystalline state. For example, the amorphous silicon layers of the first and second semiconductor layers 137 and 138 may be converted into poly-silicon layers or single-crystalline silicon layers by the thermal treatment process.

The second semiconductor layer 138 may not completely fill the cell holes 126, and an insulating material may be formed on the second semiconductor layer 138 to completely fill the cell holes 126. The second semiconductor layer 138 and the insulating material may be planarized to expose a top surface of the second material layer. Thus, semiconductor pillars PL may be formed to have cylinder shapes of which the insides are filled with filling insulating layers 127, respectively. The semiconductor pillars PL may have the first conductivity type. As an alternative to the steps shown in and described with reference to FIGS. 10A and 10B, the second semiconductor layer 138 may fill the cell hole 126. In this case, the filling insulating layer 127 is omitted.

Figure 11A:
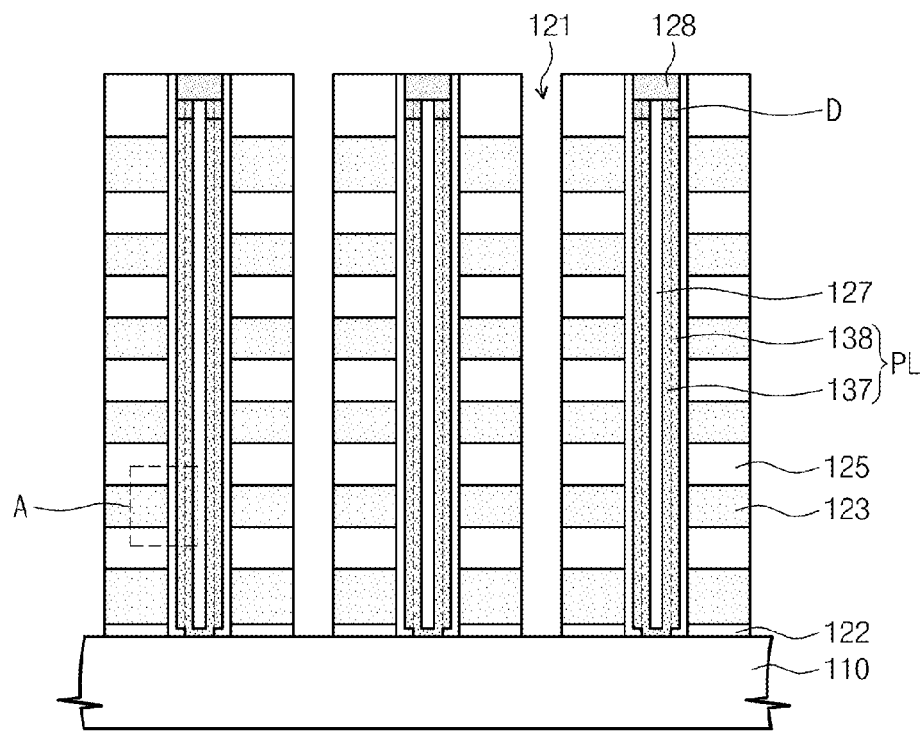
Figure 11B:
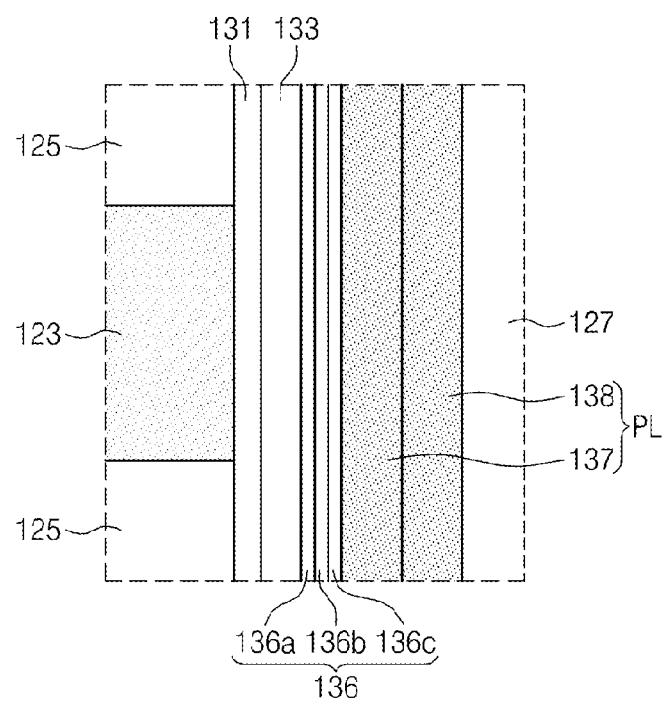

Referring to FIGS. 11A and 11B, upper portions of the semiconductor pillars PL may be recessed to be lower than a top surface of the uppermost second material layer. In this case, conductive patterns 128 are formed in the cell holes 126 on the recessed semiconductor pillars PL, respectively. The conductive patterns 128 may include doped poly-silicon and/or a metal. Dopant ions of a second conductivity type may be implanted into the conductive patterns 128 and upper portions of the semiconductor pillars PL to form drain regions D. The second conductivity type may be, for example, an N-type.

The second material layers 124, the first material layers 123, and the buffer dielectric layer 122 are successively patterned to form separation regions 121 which are spaced apart from each other. The separation regions 121 may extend in the first direction and may expose the substrate 110. The patterned second material layers 124 become the insulating patterns 125 shown in FIG. 5. The separation regions 121 are formed between the semiconductor pillars PL.

Figure 12A:
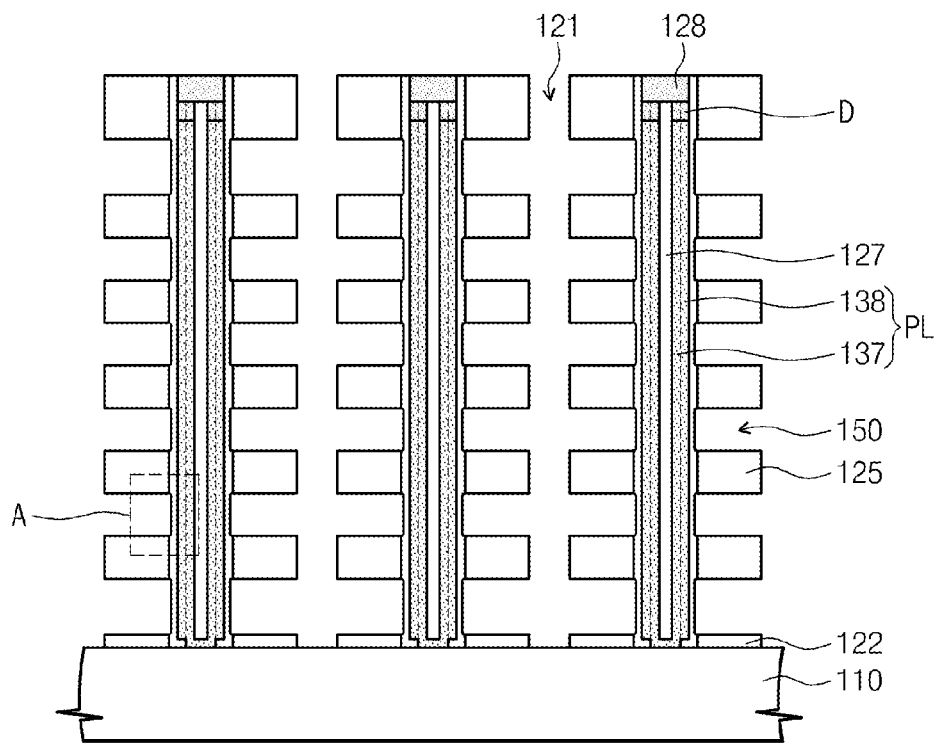
Figure 12B:
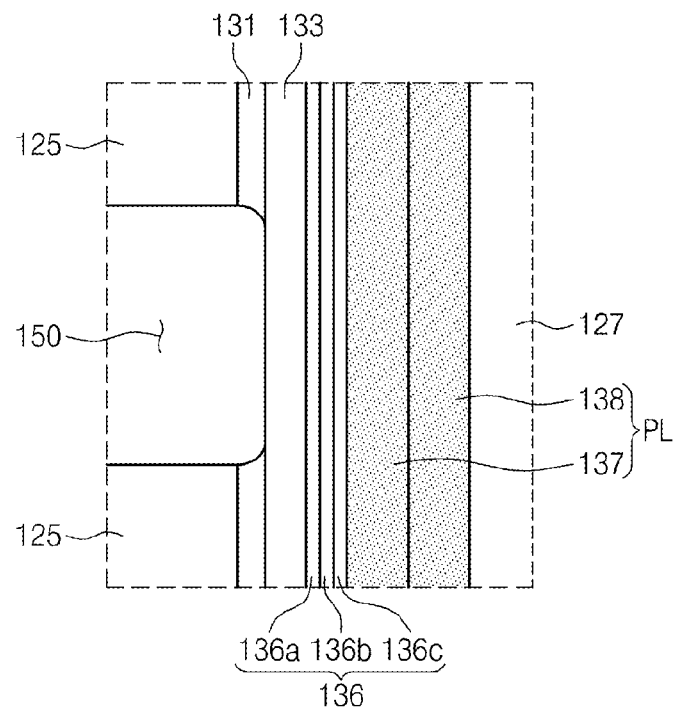

Referring to FIGS. 12A and 12B, the first material layers 123 exposed by the separation regions 121 are selectively removed to form recess regions 150. The recess regions 150 correspond to regions where the first material layers 123 are removed. The recess regions 150 are defined by the semiconductor pillars PL and the insulating patterns 125. If the first material layers 123 are formed of silicon nitride layers or silicon oxynitride layers, the removal process of the first material layers 123 may be performed using an etch solution including phosphoric acid. A portion of a sidewall of the protecting layer 131 is exposed by the recess region 150. The protecting layer 131 may prevent the charge storage layer 133 from being damaged by the etch solution for the removal of the first material layers 123. The protecting layer 131 exposed by the recess region 150 may be selectively removed. If the protecting layer 131 is formed of a silicon oxide layer, the protecting layer 131 may be removed by, for example, an etch solution including hydrofluoric acid. Thus, the recess region 150 may expose a portion of the charge storage layer 133.

Figure 13A:
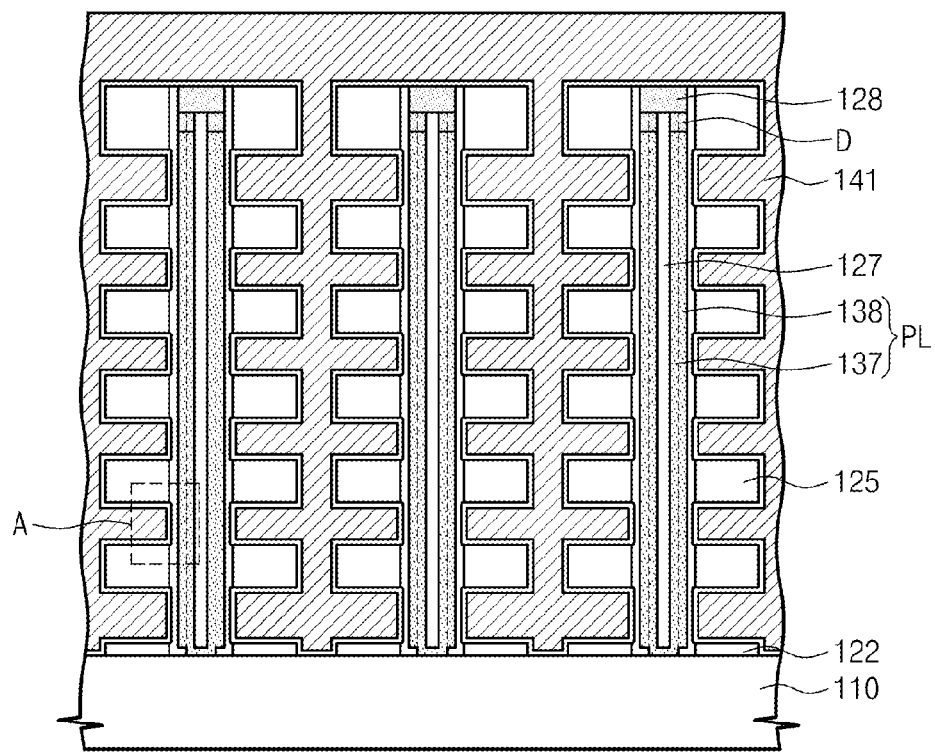
Figure 13B:
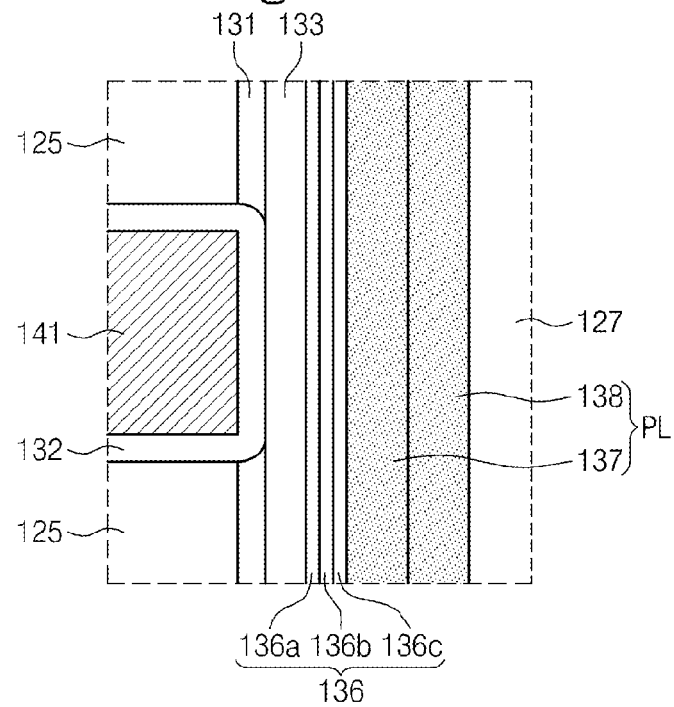

Referring to FIGS. 13A and 13B, a conductive layer 141 is formed in the recess regions 150 through the separation regions 121. The conductive layer 141 may be formed of at least one of a doped poly-silicon layer, a metal layer (e.g., tungsten), and a metal nitride layer. The conductive layer 141 may be formed by an ALD method.

Before the conductive layer 141 is formed, a blocking insulating layer 132 may be formed in the recess regions 150. The blocking insulating layer 132 may be a multi-layer consisting of a plurality of thin layers. For example, the blocking insulating layer 132 may include an aluminum oxide layer and a silicon oxide layer formed (stacked) in either order. The blocking insulating layer 132 may be formed by an ALD method.

Figure 14A:
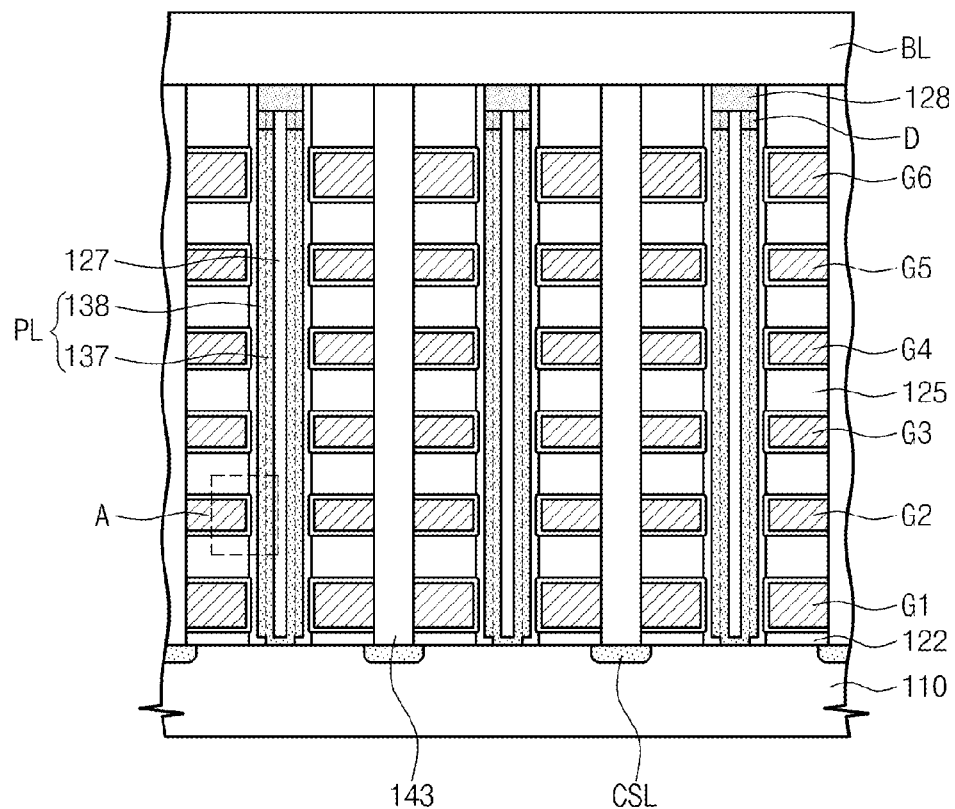
Figure 14B:
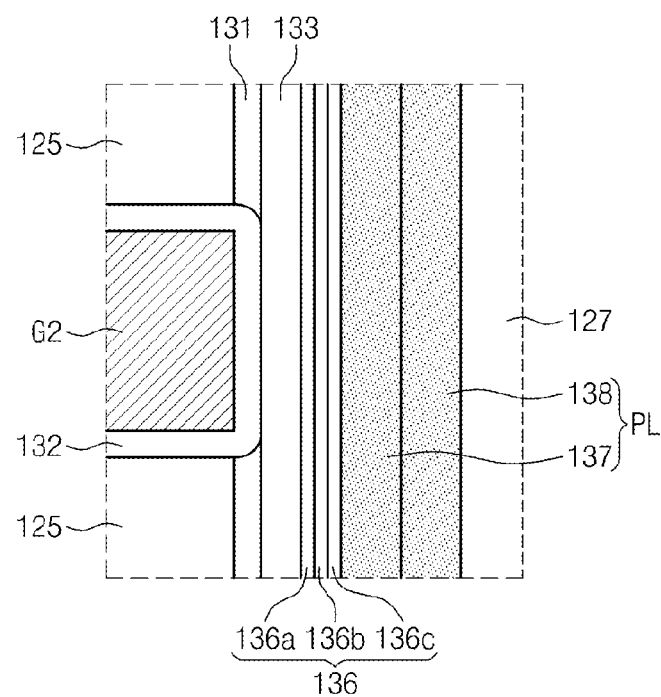

Referring to FIGS. 14A and 14B, the conductive layer 141 outside the recess regions 150 (e.g., in the separation regions 121) is removed to form horizontal electrodes G1 to G6 in the recess regions 150, respectively. If the conductive layer 141 is formed of the doped poly-silicon layer, a metal silicide layer may be additionally formed on the poly-silicon layer of each of the horizontal electrodes G1 to G6 after the horizontal electrodes G1 to G6 are formed. For example, portions of the poly-silicon layers of the horizontal electrodes G1 to G6, which are adjacent to the separation region 121, may be laterally recessed. A metal layer may be formed on the recessed poly-silicon layers of the horizontal electrodes G1 to G6 and then a thermal treatment may be performed on the metal layer to form the metal silicide layers on the recessed poly-silicon layers of the horizontal electrodes G1 to G6, respectively. Afterwards, an unreacted metal layer may be removed. The metal layer for the metal silicide layer may include tungsten, titanium, cobalt, or nickel.

The conductive layer 141 in the separation regions 121 is removed for the formation of the horizontal electrodes G1 to G6, such that the substrate 110 under the separation regions 121 is exposed. Dopant ions of the second conductivity type may be provided into the substrate 110 with a high dose, thereby forming common source lines CSL. A separation insulating layer 143 may be formed to fill each of the separation regions 121. The separation insulating layer 143 may extend in the first direction. The semiconductor pillars PL arranged in the second direction may be connected in common to one bit line BL.

Referring to FIGS. 4, 5, 14A and 14B, the semiconductor device formed by the manufacturing method described above includes the semiconductor pillars PL penetrating the horizontal electrodes G1 to G6 and connected to the substrate 110, the charge storage layer 133 between the semiconductor pillars PL and the horizontal electrodes G1 to G6, the tunnel insulating layer 136 between the charge storage layer 133 and the semiconductor pillars PL, and the blocking insulating layer 132 between the charge storage layer 133 and the horizontal electrodes G1 to G6. A charge storage element S includes the blocking insulating layer 132, the charge storage layer 133, and the tunnel insulating layer 136.

The blocking insulating layer 132 may include a high-k dielectric layer (e.g., an aluminum oxide layer and/or a hafnium oxide layer). The blocking insulating layer 132 may be a multi-layer consisting of a plurality of thin layers. In embodiments, the blocking insulating layer 132 includes the aluminum oxide layer and/or the hafnium oxide layer. In the case in which the blocking insulating layer 132 includes the aluminum oxide layer and the hafnium oxide layer, the aluminum oxide layer and the hafnium oxide layer may be formed in either order (i.e., either may be stacked on the other). In other embodiments, the blocking insulating layer 132 includes at least one high-k dielectric layer (e.g., the aluminum oxide layer and/or the hafnium oxide layer) and a silicon oxide layer, formed in either order. The blocking insulating layer 132 may extend between the insulating patterns 125 and the horizontal electrodes G1 to G6.

The charge storage layer 133 may be a charge trap layer or an insulating layer including conductive nano particles. The charge trap layer may include, for example, a silicon nitride layer. The charge storage layer 133 may extend between the insulating patterns 125 and the semiconductor pillars PL.

As mentioned above, in this embodiment, the tunnel insulating layer 136 has a structure similar to that of and the same energy band gap as any of the tunnel insulating layers 6 described with reference to FIGS. 1B and 1C. That is, the tunnel insulating layer 136 includes first tunnel insulating layer 136a corresponding to first tunnel insulating layer 6a, second tunnel insulating layer 136b corresponding to second tunnel insulating layer 6b, and the third tunnel insulating layer 136c corresponding to third tunnel insulating layer 6b. Thus, the energy band gap of the tunnel insulating layer 136 decreases and then increases as a distance from the charge storage layer 133 increases. Reference may be made, therefore, to the description of FIGS. 1A-1C for different examples of the materials, characteristics, etc. of the tunnel insulating layers 136a, 136b, 136c.

As described above, the protecting layer 131 may be interposed between the charge storage layer 133 and the insulating patterns 125. The protecting layer 131 may include a silicon oxide layer.

Another embodiment of a method of manufacturing a semiconductor device according to the inventive concept will be described hereinafter.

Figure 15A:
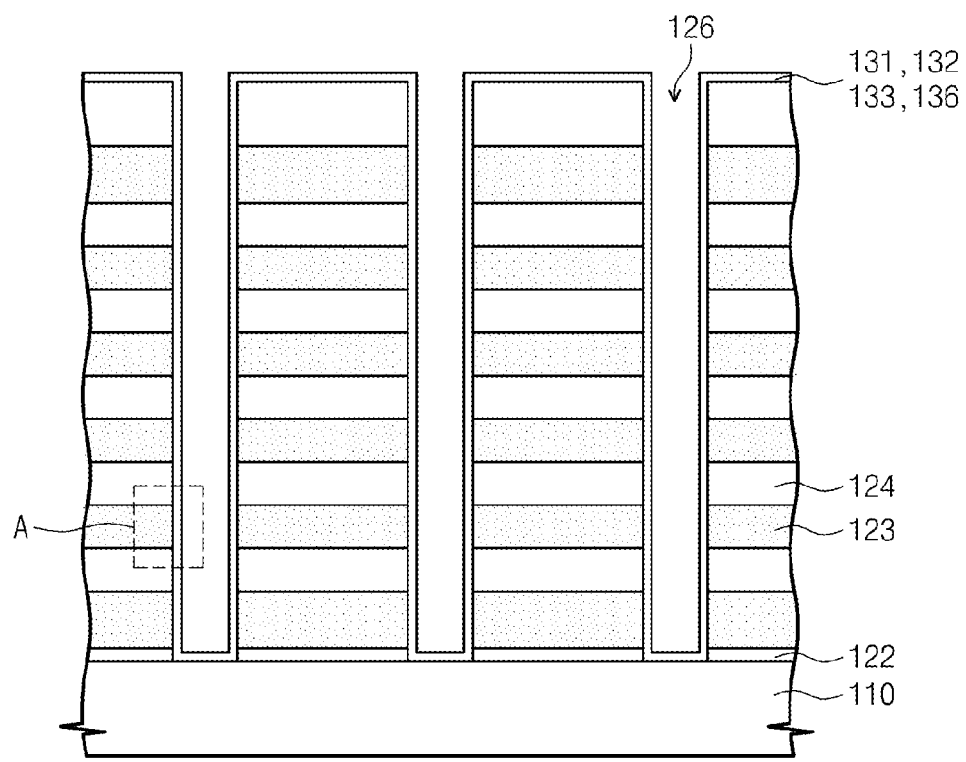
FIGS. 15A, 16A, 17A, 18A and 19A are cross-sectional views taken along a direction corresponding to that of line I-I' of FIG. 4 illustrating another embodiment of a method of manufacturing a semiconductor device according to of the inventive concept.
Figure 15B:
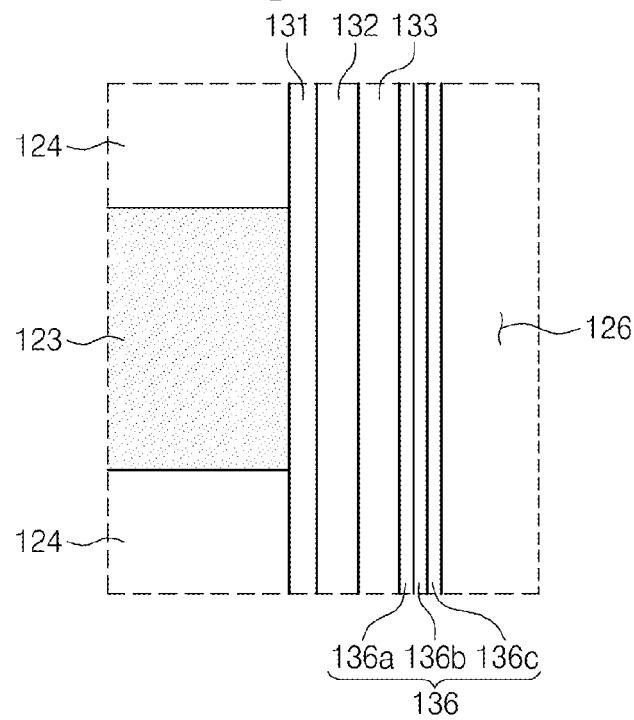
FIGS. 15B, 16B, 17B, 18B and 19B are enlarged views of portions A of FIGS. 15A, 16A, 17A, 18A and 19A, respectively.

Referring to FIGS. 15A and 15B, the cell holes 126 penetrating the second material layers 124, the first material layers 123 and the buffer dielectric layer 122 are formed by the method described with reference to FIGS. 6A, 6B, 7A, and 7B. The cell holes 126 expose the substrate 110.

A protecting layer 131 is formed on surface delimiting the cell holes 126. The protecting layer 131 may include a silicon oxide layer. A blocking insulating layer 132 is formed on the protecting layer 131. The blocking insulating layer 132 may be a multi-layer consisting of a plurality of thin layers. For example, the blocking insulating layer 132 may include an aluminum oxide layer and a silicon oxide layer. The blocking insulating layer 132 may be formed by an ALD process.

A charge storage layer 133 may be formed on the blocking insulating layer 132. The charge storage layer 133 may be a charge trap layer or an insulating layer including conductive nano particles. The charge trap layer may include, for example, a silicon nitride layer.

A tunnel insulating layer 136 is formed on the charge storage layer 133. The tunnel insulating layer 136 includes a first tunnel insulating layer 136a, a second tunnel insulating layer 136b, and a third tunnel insulating layer 136c. The tunnel insulating layer 136 is formed by the reverse type tunnel insulating layer formation process according to the inventive concept, as described with reference to FIGS. 1A and 1B. Thus, the tunnel insulating layer 136 has the same structure and the same energy band gap as any of the tunnel insulating layers 6 described with reference to FIG. 1B.

Figure 16A:
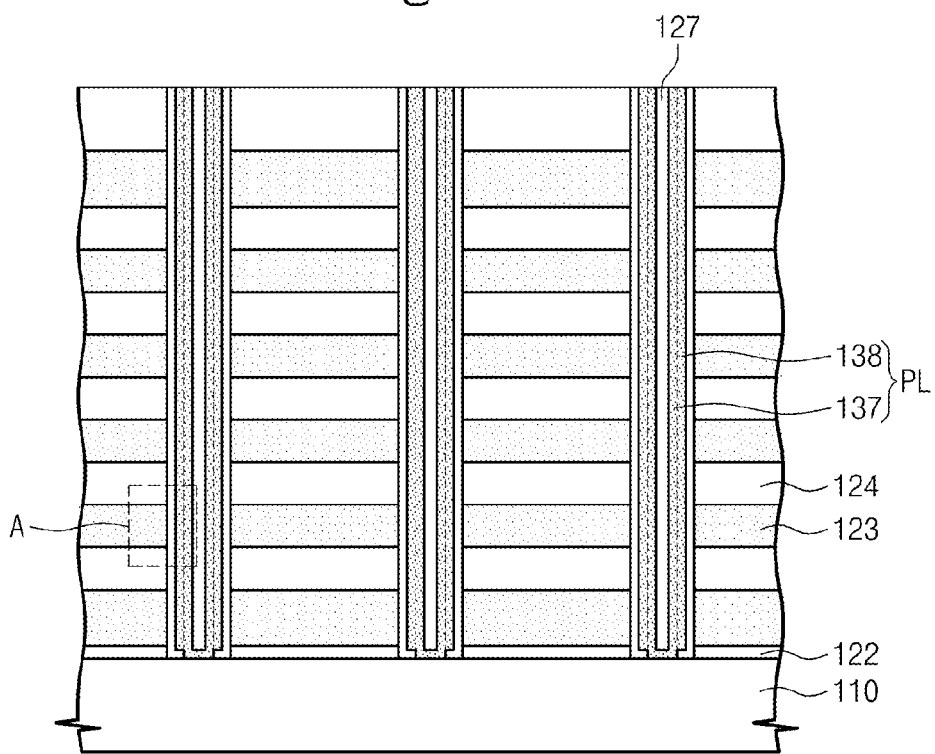
Figure 16B:
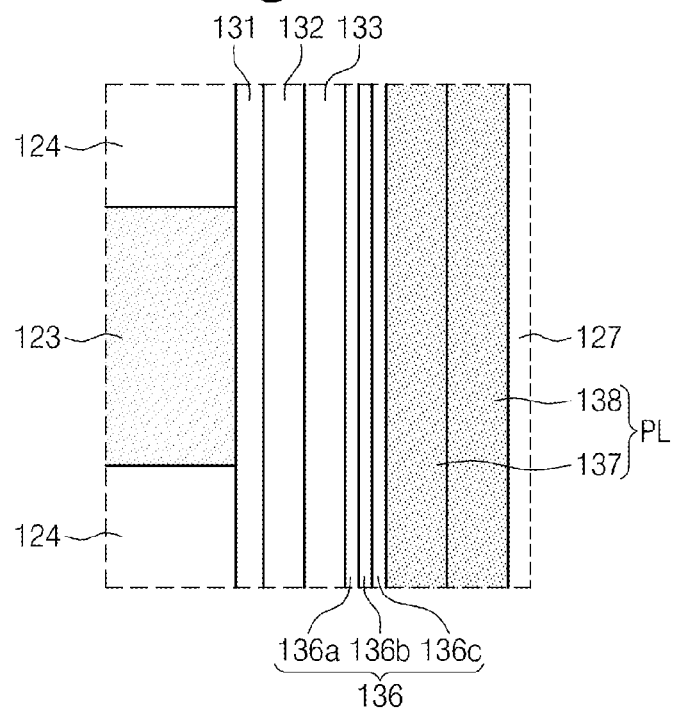

Referring to FIGS. 16A and 16B, a first semiconductor layer 137 is formed on the tunnel insulating layer 136. The first semiconductor layer 137 may be anisotropically etched to expose the substrate 110. Thus, the first semiconductor layer 137 may be formed into a spacer semiconductor layer remaining on a sidewall of the tunnel insulating layer 136. A second semiconductor layer 138 may be formed on the first semiconductor layer 137. The first and second semiconductor layers 137 and 138 may be formed by an ALD method. For example, the first and second semiconductor layers 137 and 138 may be amorphous silicon layers. A thermal treatment process may be performed to convert the first and second semiconductor layers 137 and 138 into poly-silicon layers or single-crystalline silicon layers.

The second semiconductor layer 138 may not completely fill the cell holes 126, and an insulating material may be formed on the second semiconductor layer 138 to completely fill the cell holes 126. The second semiconductor layer 138 and the insulating material may be planarized to expose the uppermost second material layer. Thus, semiconductor pillars PL may be formed to have cylinder shapes of which the insides are filled with filling insulating layers 127, respectively. The semiconductor pillars PL may have the first conductivity type. In an alternative to the steps shown in and described with reference to FIGS. 16A and 16B, the second semiconductor layer 138 may fill the cell hole 126. In this case, the filling insulating layer 127 is omitted.

Figure 17A:
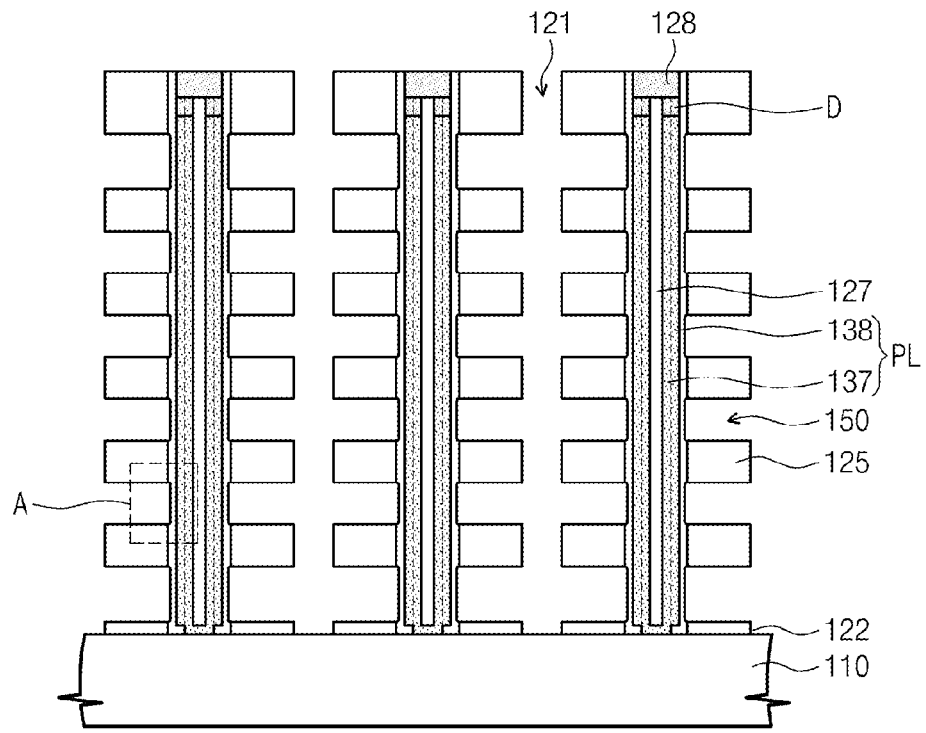
Figure 17B:
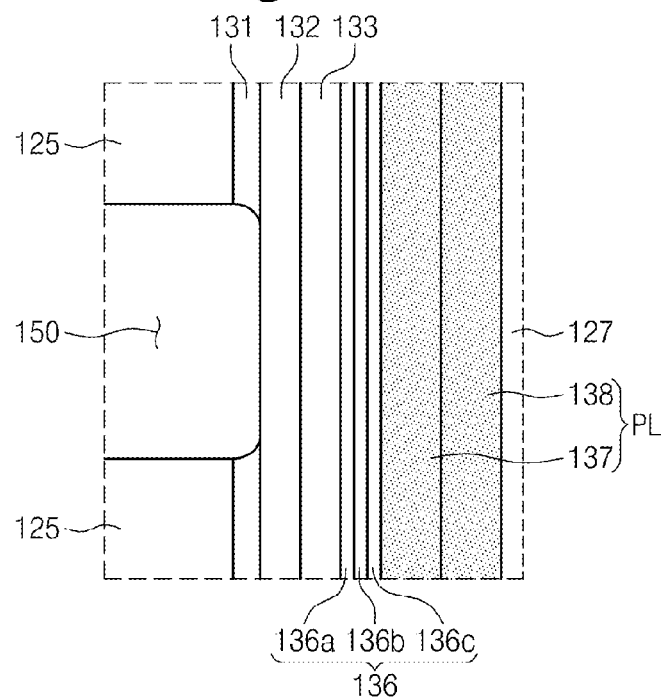

Referring to FIGS. 17A and 17B, upper portions of the semiconductor pillars PL may be recessed to be lower than a top surface of the uppermost second material layer. Conductive patterns 128 are formed in the cell holes 126 on the recessed semiconductor pillars PL, respectively. The conductive patterns 128 may include doped poly-silicon and/or a metal. Dopant ions of a second conductivity type may be implanted into the conductive patterns 128 and upper portions of the semiconductor pillars PL to form drain regions D. The second conductivity type may be, for example, an N-type.

The second material layers 124, the first material layers 123, and the buffer dielectric layer 122 are successively patterned to form separation regions 121 spaced apart from each other. The separation regions 121 may extend in the first direction and may expose the substrate 110. The patterned second material layers 124 correspond to the insulating patterns 125 of FIG. 5. The separation regions 121 may be formed between the semiconductor pillars PL.

The first material layers 123 exposed by the separation regions 121 are selectively removed to form recess regions 150. The recess regions 150 correspond to regions where the first material layers 123 are removed. The recess regions 150 are defined by the semiconductor pillars PL and the insulating patterns 125. If the first material layers 123 are formed of silicon nitride layers or silicon oxynitride layers, the removal process of the first material layers 123 may be performed using an etch solution including phosphoric acid. A portion of a sidewall of the protecting layer 131 is exposed by the recess region 150. The protecting layer 131 may prevent the blocking insulating layer 132 from being damaged by the etch solution for the removal of the first material layers 123. The protecting layer 131, which is exposed by the recess region 150, may be selectively removed. If the protecting layer 131 is formed of a silicon oxide layer, the protecting layer 131 may be removed by, for example, an etch solution including hydrofluoric acid. Thus, the recess region 150 may expose a portion of the blocking insulating layer 132.

Figure 18A:
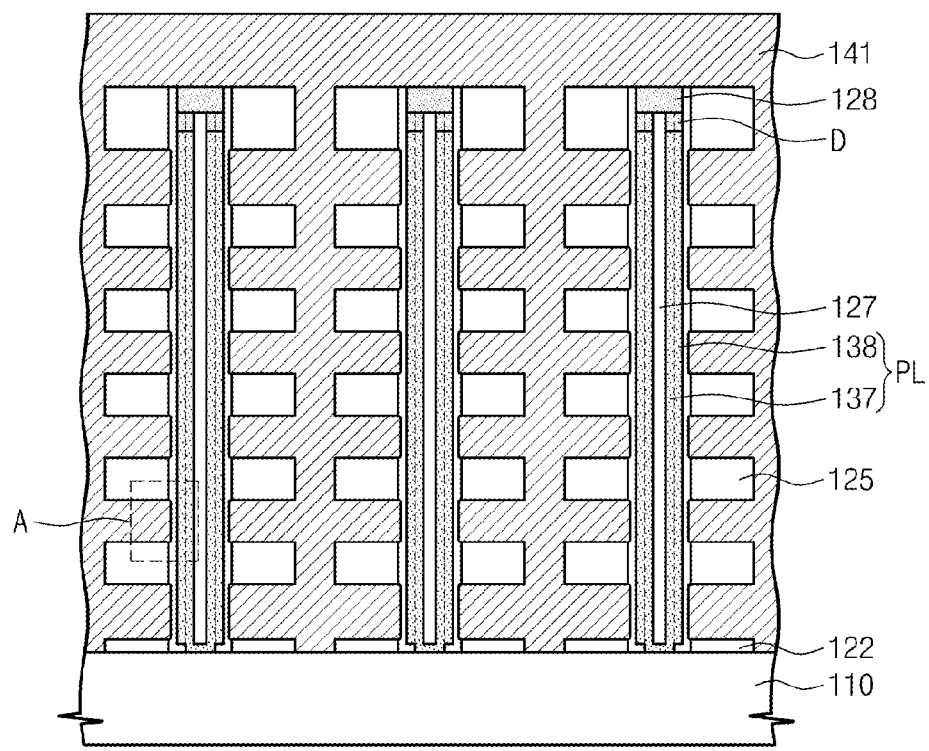
Figure 18B:
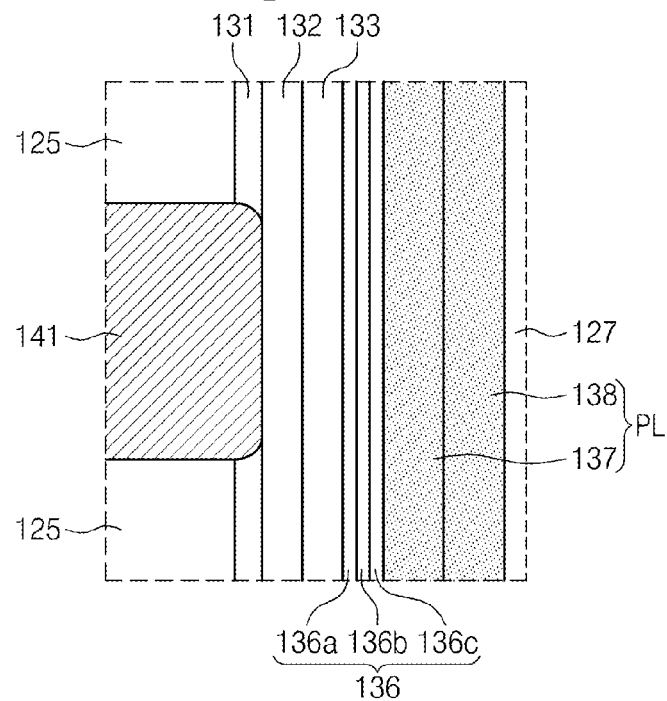

Referring to FIGS. 18A and 18B, a conductive layer 141 is formed in the recess regions 150 through the separation regions 121. The conductive layer 141 may be formed of at least one of a doped poly-silicon layer, a metal layer (e.g., tungsten), and a metal nitride layer. The conductive layer 141 may be formed by an ALD method.

The conductive layer 141 may be in direct contact with top surfaces and bottom surfaces of the insulating patterns 125.

Figure 19A:
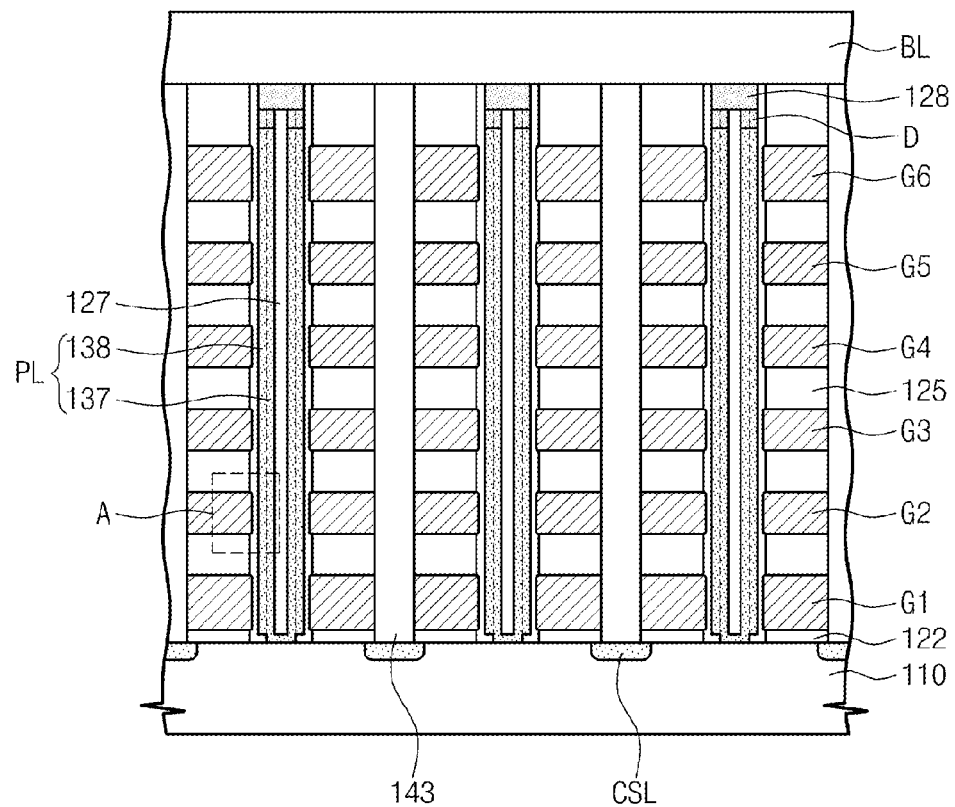
Figure 19B:
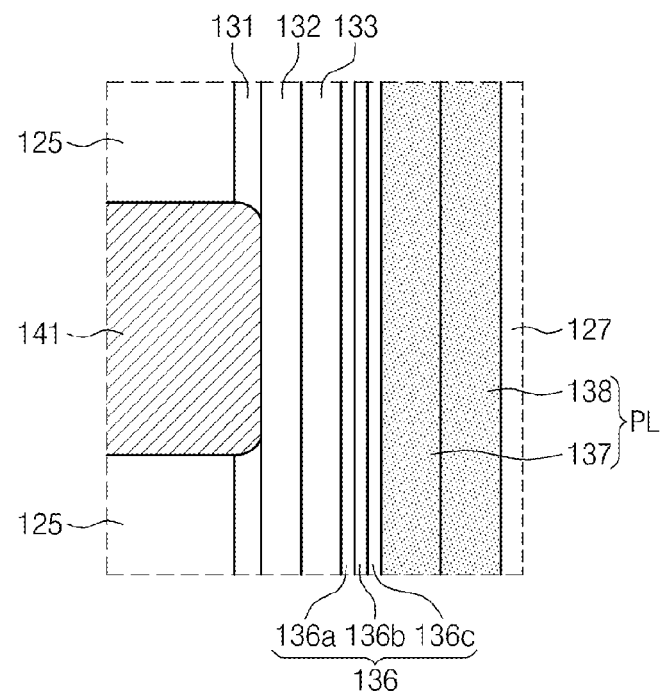

Referring to FIGS. 19A and 19B, the conductive layer 141 outside the recess regions 150 (e.g., in the separation regions 121) is removed to form horizontal electrodes G1 to G6 in the recess regions 150, respectively. If the conductive layer 141 is formed of the doped poly-silicon layer, a metal silicide layer may be additionally formed on the poly-silicon layer of each of the horizontal electrodes G1 to G6 after the horizontal electrodes G1 to G6 are formed. For example, portions of the poly-silicon layers of the horizontal electrodes G1 to G6, which are adjacent to the separation region 121, may be laterally recessed. A metal layer may be formed on the recessed poly-silicon layers of the horizontal electrodes G1 to G6 and then a thermal treatment may be performed on the metal layer to form the metal silicide layers. Thereafter, an unreacted metal layer may be removed. The metal layer for the metal silicide layer may include tungsten, titanium, cobalt, or nickel.

The conductive layer 141 in the separation regions 121 is removed for the formation of the horizontal electrodes G1 to G6, such that the substrate 110 under the separation regions 121 may be exposed. Dopant ions of the second conductivity type may be provided into the substrate 110 with a high dose, thereby forming common source lines CSL.

A separation insulating layer 143 is formed to fill each of the separation regions 121. The separation insulating layer 143 may extend in the first direction. The semiconductor pillars PL arranged in the second direction may be connected in common to one bit line BL.

Referring to FIGS. 4, 5, 19A and 19B, the semiconductor device formed by the aforementioned method includes the semiconductor pillars PL penetrating the horizontal electrodes G1 to G6 and connected to the substrate 110, the charge storage layer 133 between the semiconductor pillars PL and the horizontal electrodes G1 to G6, the tunnel insulating layer 136 between the charge storage layer 133 and the semiconductor pillars PL, and the blocking insulating layer 132 between the charge storage layer 133 and the horizontal electrodes G1 to G6. A charge storage element S includes the blocking insulating layer 132, the charge storage layer 133, and the tunnel insulating layer 136.

The blocking insulating layer 132 may include a high-k dielectric layer (e.g., an aluminum oxide layer or a hafnium oxide layer). The blocking insulating layer 132 may be a multi-layer consisting of a plurality of thin layers. In embodiments, the blocking insulating layer 132 includes the aluminum oxide layer and/or the hafnium oxide layer. In another embodiment, the blocking insulating layer 132 includes at least one high-k dielectric layer (e.g., the aluminum oxide layer and/or the hafnium oxide layer) and a silicon oxide layer. The blocking insulating layer 132 may extend between the insulating patterns 125 and the semiconductor pillars PL.

The charge storage layer 133 may be a charge trap layer or an insulating layer including conductive nano particles. The charge trap layer may include, for example, a silicon nitride layer. The charge storage layer 133 may extend between the insulating patterns 125 and the semiconductor pillars PL.

The tunnel insulating layer 136 is similar to that of the embodiment described with reference to FIGS. 4, 5, 14A and 14B. That is, the tunnel insulating layer 136 may comprise any of the tunnel insulating layers 6 described with reference to FIGS. 1B and 1C.

The protecting layer 131 may be interposed between the blocking insulating layer 132 and the insulating patterns 125. The protecting layer 131 may include a silicon oxide layer.

The horizontal electrodes G1 to G6 may be in direct contact with the top surfaces and the bottom surfaces of the insulating patterns 125. Each of the horizontal electrodes G1 to G6 may include a first portion contacting the blocking insulating layer 132 and a second portion disposed far away from the blocking insulating layer 132. The first portion of the horizontal electrode may have a vertical width smaller than that of the second portion of the horizontal electrode.

Another embodiment of a method of manufacturing a semiconductor device according to the inventive concept will be described hereinafter.

Figure 20A:
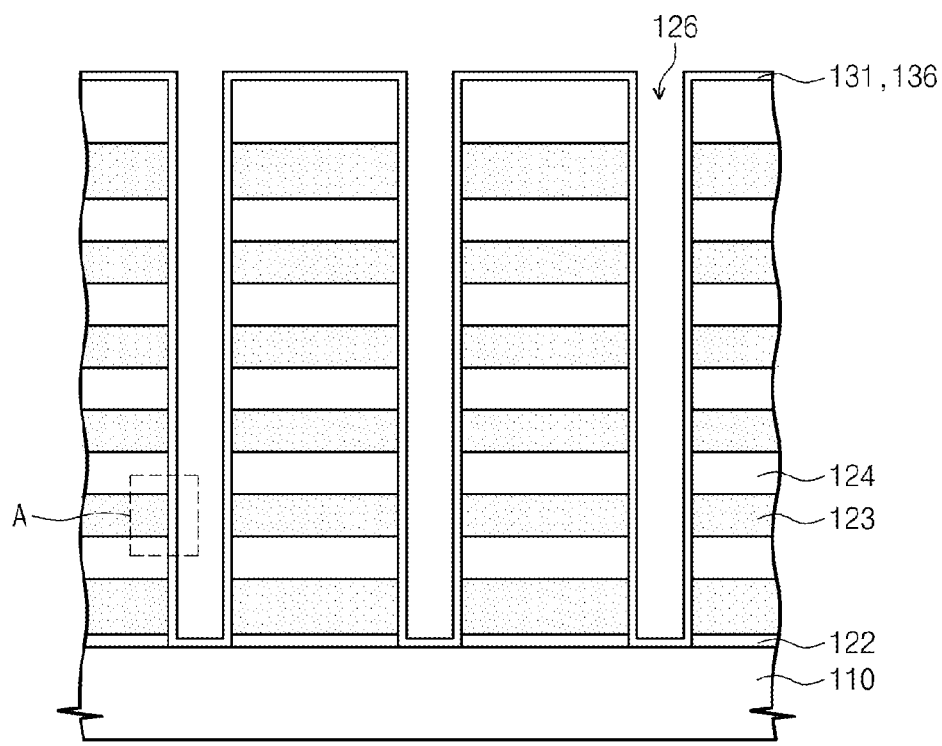
FIGS. 20A, 21A, 22A, 23A and 24A are cross-sectional views taken along a direction corresponding to that line I-I' of FIG. 4 illustrating still another embodiment of a method of manufacturing a semiconductor device according to the inventive concept.
Figure 20B:
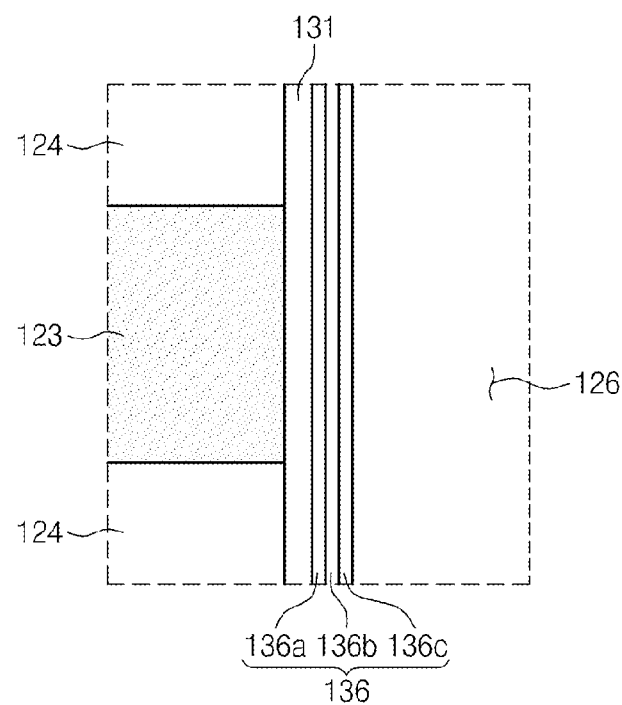
FIGS. 20B, 21B, 22B, 23B and 24B are enlarged views of portions A of FIGS. 20A, 21A, 22A, 23A and 24A, respectively.

Referring to FIGS. 20A and 20B, the cell holes 126 penetrating the second material layers 124, the first material layers 123 and the buffer dielectric layer 112 are formed by the method described with reference to FIGS. 6A, 6B, 7A, and 7B. The cell holes 126 expose the substrate 110.

A protecting layer 131 may be formed on surfaces delimiting the cell holes 126. The protecting layer 131 may include a silicon oxide layer.

A tunnel insulating layer 136 is formed on the protecting layer 131. The tunnel insulating layer 136 includes a first tunnel insulating layer 136a, a second tunnel insulating layer 136b, and a third tunnel insulating layer 136c. The tunnel insulating layer 136 is formed by the reverse type tunnel insulating layer formation process according to the inventive concept, as described with reference to FIGS. 1A and 1B. The tunnel insulating layer 136 thus has the same structure and the same energy band gap as any of the tunnel insulating layers 6 described with reference to FIGS. 1B and 1C.

Figure 21A:
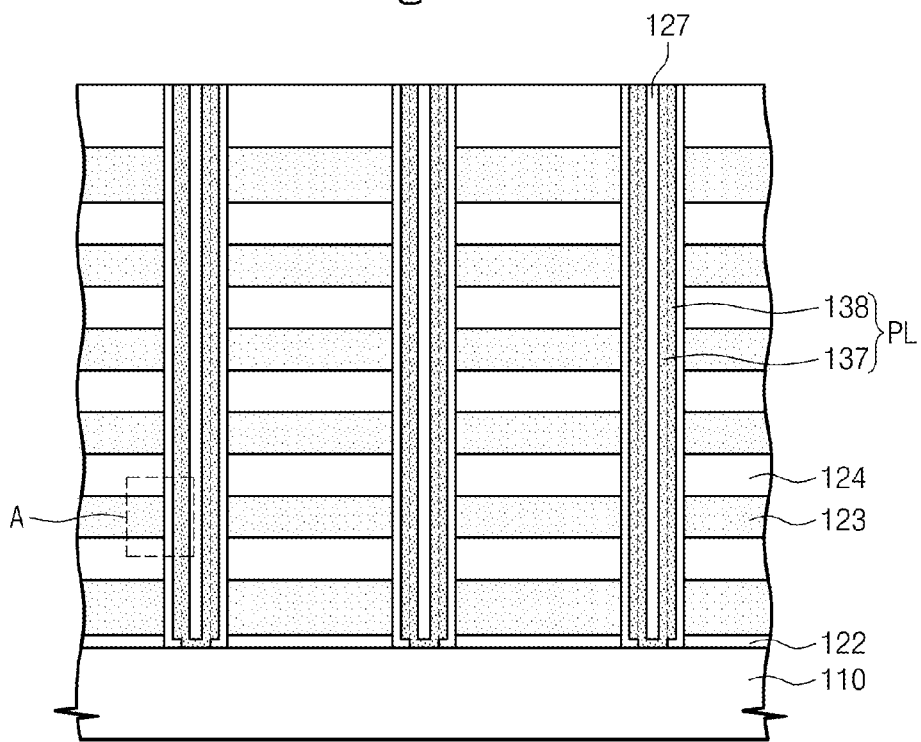
Figure 21B:
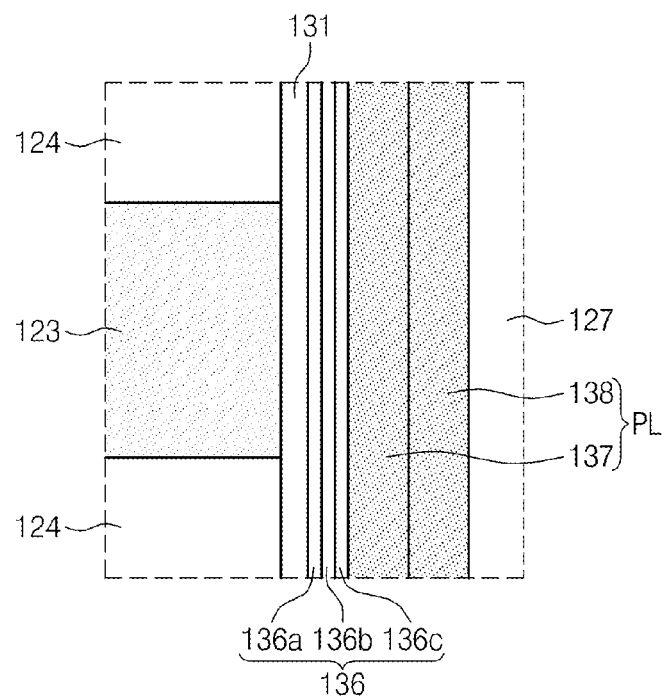

Referring to FIGS. 21A and 21B, a first semiconductor layer 137 is formed on the tunnel insulating layer 136. The first semiconductor layer 137 may be anisotropically etched to expose the substrate 110. Thus, the first semiconductor layer 137 may be formed into a spacer semiconductor layer remaining on a sidewall of the tunnel insulating layer 136. A second semiconductor layer 138 may be formed on the first semiconductor layer 137. The first and second semiconductor layers 137 and 138 may be formed by an ALD method. For example, the first and second semiconductor layers 137 and 138 may be amorphous silicon layers. A thermal treatment process may be performed to convert the first and second semiconductor layers 137 and 138 into poly-silicon layers or single-crystalline silicon layers.

The second semiconductor layer 138 may not completely fill the cell holes 126, and an insulating material may be formed on the second semiconductor layer 138 to completely fill the cell holes 126. The second semiconductor layer 138 and the insulating material may be planarized to expose a top surface of the uppermost second material layer. Thus, semiconductor pillars PL may be formed to have cylinder shapes of which the insides are filled with filling insulating layers 127, respectively. The semiconductor pillars PL may have the first conductivity type. As an alternative to the steps shown in and described with reference to FIGS. 21A and 21B, the second semiconductor layer 138 may fill the cell holes 126. In this case, the filling insulating layer 127 is omitted.

Figure 22A:
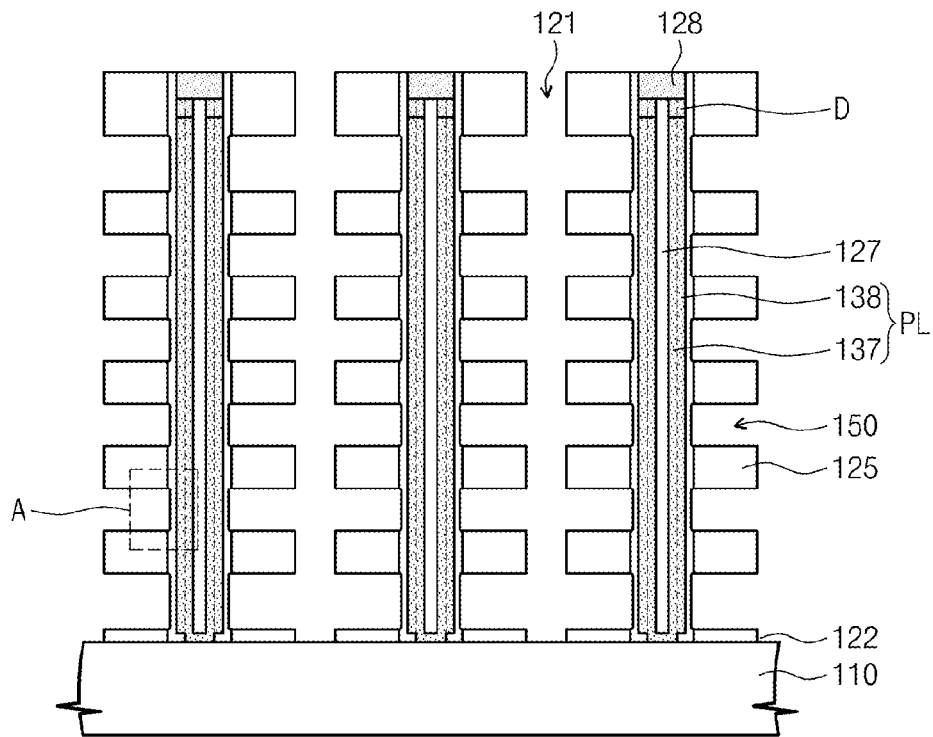
Figure 22B:
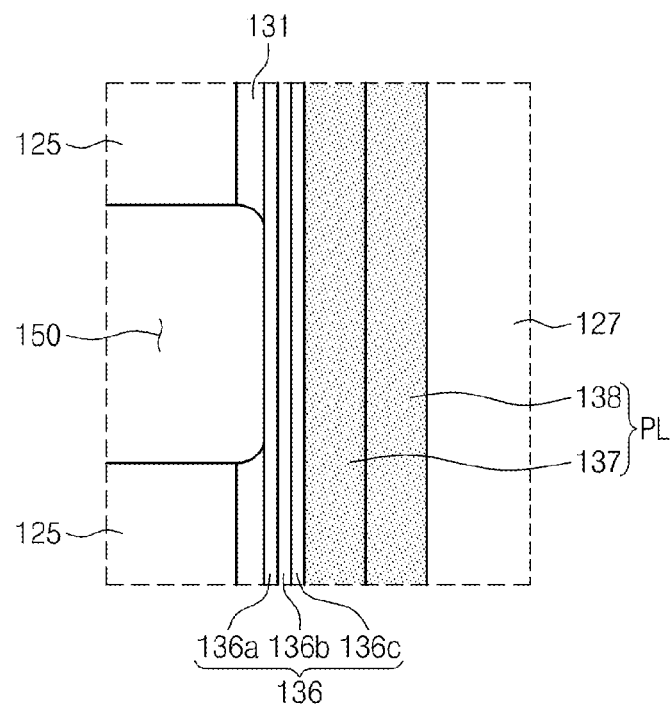

Referring to FIGS. 22A and 22B, upper portions of the semiconductor pillars PL are recessed to be lower than a top surface of the uppermost second material layer. Conductive patterns 128 are formed in the cell holes 126 on the recessed semiconductor pillars PL, respectively. The conductive patterns 128 may include doped poly-silicon and/or a metal. Dopant ions of a second conductivity type may be implanted into the conductive patterns 128 and upper portions of the semiconductor pillars PL to form drain regions D. The second conductivity type may be, for example, an N-type.

The second material layers 124, the first material layers 123, and the buffer dielectric layer 122 are successively patterned to form separation regions 121 spaced apart from each other. The separation regions 121 may extend in the first direction and may expose the substrate 110. The patterned second material layers 124 are defined as insulating patterns 125. The separation regions 121 may be formed between the semiconductor pillars PL.

The first material layers 123 exposed by the separation regions 121 is selectively removed to form recess regions 150. The recess regions 150 correspond to regions where the first material layers 123 are removed. The recess regions 150 are defined by the semiconductor pillars PL and the insulating patterns 125. If the first material layers 123 are formed of silicon nitride layers or silicon oxynitride layers, the removal process of the first material layers 123 may be performed using an etch solution including phosphoric acid. A portion of a sidewall of the protecting layer 131 is exposed by the recess region 150. The protecting layer 131 may prevent the tunnel insulating layer 136 from being damaged by the etch solution for the removal of the first material layers 123. The protecting layer 131 exposed by the recess region 150 may be selectively removed. If the protecting layer 131 is formed of a silicon oxide layer, the protecting layer 131 may be removed by, for example, an etch solution including hydrofluoric acid. Thus, the recess region 150 may expose a portion of the tunnel insulating layer 136.

Figure 23A:
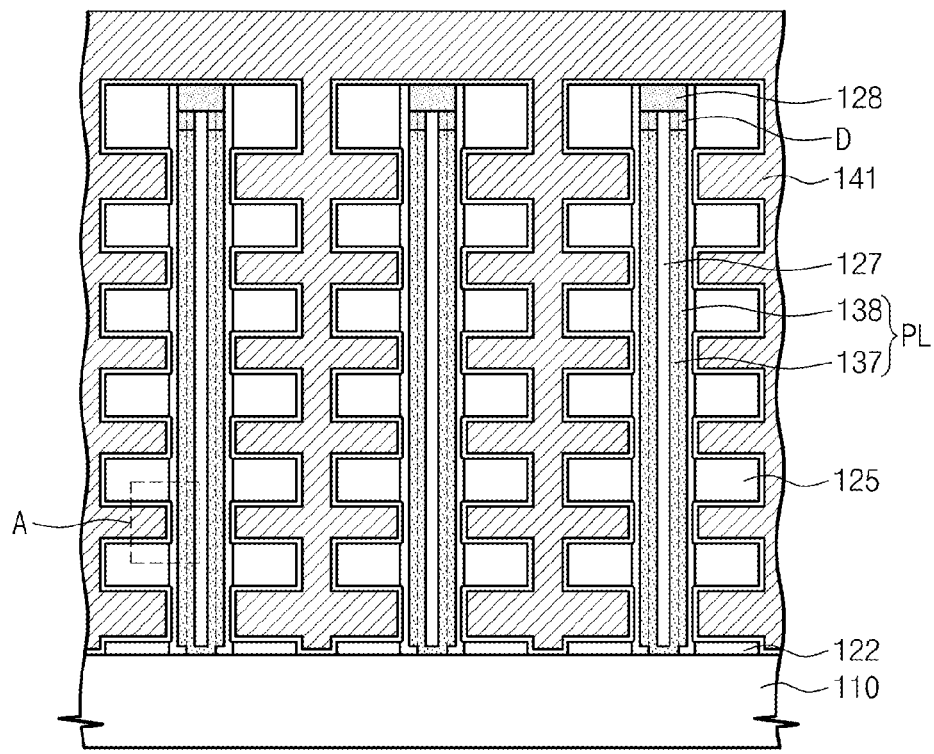
Figure 23B:
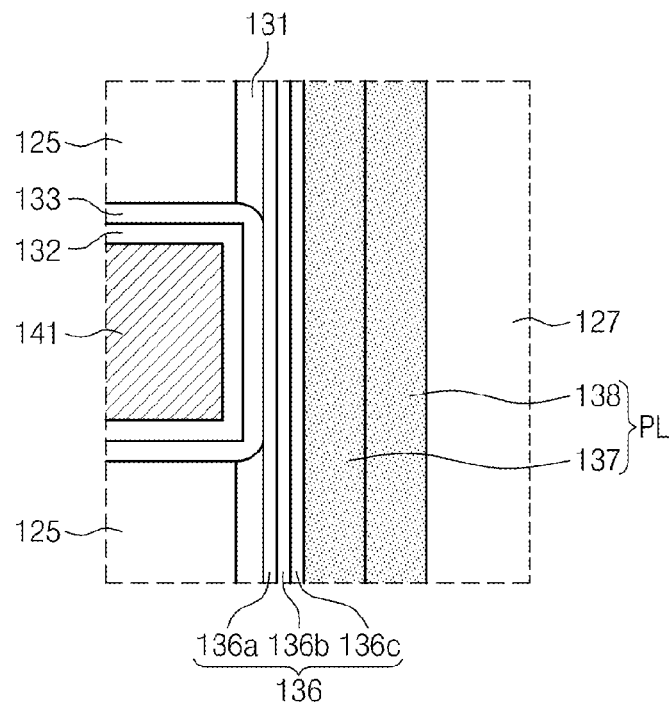

Referring to FIGS. 23A and 23B, a charge storage layer 133 is formed in the recess regions 150. The charge storage layer may be a charge trap layer or an insulating layer including conductive nano particles. The charge trap layer may include, for example, a silicon nitride layer.

A blocking insulating layer 132 is formed on the charge storage layer 133. The blocking insulating layer 132 may be a multi-layer consisting of a plurality of thin layers. For example, the blocking insulating layer 132 may include an aluminum oxide layer and a silicon oxide layer. The blocking insulating layer 132 may be formed by an ALD method.

A conductive layer 141 is formed in the recess regions 150 through the separation regions 121. The conductive layer 141 may be formed of at least one of a doped poly-silicon layer, a metal layer (e.g., tungsten), and a metal nitride layer. The conductive layer 141 may be formed by an ALD method.

Figure 24A:
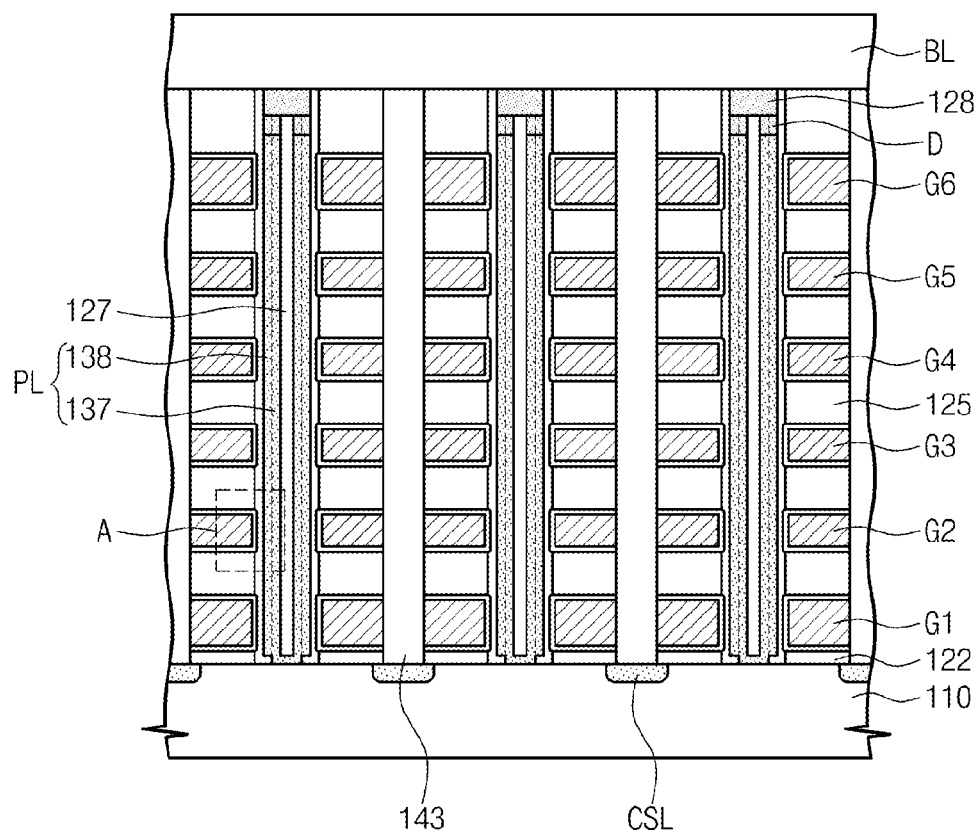
Figure 24B:
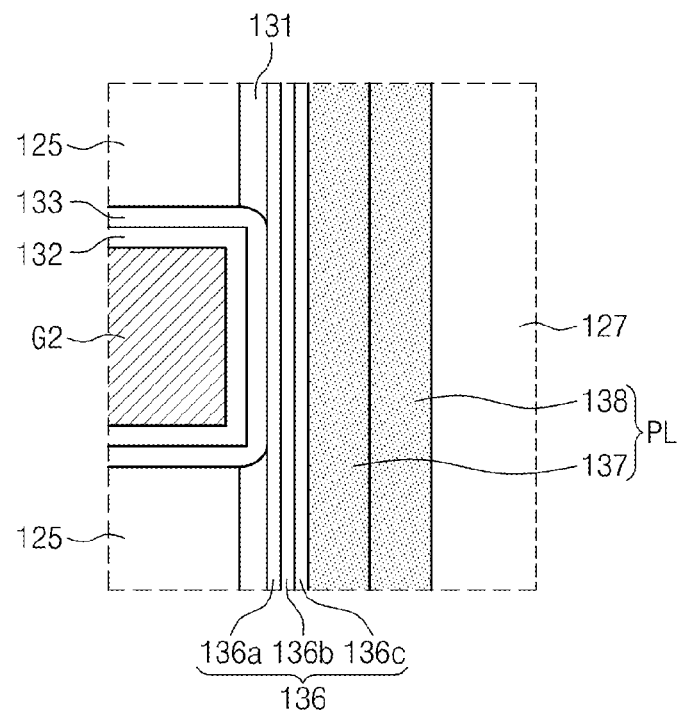

Referring to FIGS. 24A and 24B, the conductive layer 141 outside the recess regions 150 (e.g., in the separation regions 121) is removed to form horizontal electrodes G1 to G6 in the recess regions 150, respectively. If the conductive layer 141 is formed of the doped poly-silicon layer, a metal silicide layer may be additionally formed on the poly-silicon layer of each of the horizontal electrodes G1 to G6 after the horizontal electrodes G1 to G6 are formed. For example, portions of the poly-silicon layers of the horizontal electrodes G1 to G6, which are adjacent to the separation region 121, may be laterally recessed. A metal layer may be formed on the recessed poly-silicon layers of the horizontal electrodes G1 to G6 and then a thermal treatment may be performed on the metal layer to form the metal silicide layers. Afterwards, an unreacted metal layer may be removed. The metal layer for the metal silicide layer may include tungsten, titanium, cobalt, or nickel.

The conductive layer 141 in the separation regions 121 is removed for the formation of the horizontal electrodes G1 to G6, such that the substrate 110 under the separation regions 121 may be exposed. Dopant ions of the second conductivity type may be provided into the substrate 110 with a high dose, thereby forming common source lines CSL.

A separation insulating layer 143 is formed to fill each of the separation regions 121. The separation insulating layer 143 may extend in the first direction. The semiconductor pillars PL arranged in the second direction may be connected in common to one bit line BL.

Referring to FIGS. 4, 5, 24A and 24B, a semiconductor device formed by the aforementioned method includes the semiconductor pillars PL penetrating the horizontal electrodes G1 to G6 and connected to the substrate 110, the charge storage layer 133 between the semiconductor pillars PL and the horizontal electrodes G1 to G6, the tunnel insulating layer 136 between the charge storage layer 133 and the semiconductor pillars PL, and the blocking insulating layer 132 between the charge storage layer 133 and the horizontal electrodes G1 to G6. A charge storage element S includes the blocking insulating layer 132, the charge storage layer 133, and the tunnel insulating layer 136.

The blocking insulating layer 132 may include a high-k dielectric layer (e.g., an aluminum oxide layer or a hafnium oxide layer). The blocking insulating layer 132 may be a multi-layer consisting of a plurality of thin layers. In embodiments, the blocking insulating layer 132 includes the aluminum oxide layer and/or the hafnium oxide layer. In other embodiments, the blocking insulating layer 132 includes at least one high-k dielectric layer (e.g., the aluminum oxide layer and/or the hafnium oxide layer) and a silicon oxide layer. The blocking insulating layer 132 may extend between the insulating patterns 125 and the horizontal electrodes G1 to G6.

The charge storage layer 133 may be a charge trap layer or an insulating layer including conductive nano particles. The charge trap layer may include, for example, a silicon nitride layer. The charge storage layer 133 may extend between the insulating patterns 125 and the horizontal electrodes G1 to G6.

Again, the tunnel insulating layer 136 is similar to any of those described with reference to FIGS. 1B and 1C.

The protecting layer 131 may be provided between the tunnel insulating layer 136 and the insulating patterns 125. The protecting layer 131 may include a silicon oxide layer.

Each of the horizontal electrodes G1 to G6 may include a first portion contacting the blocking insulating layer 132 and a second portion disposed far away from the blocking insulating layer 132. A vertical width of the first portion of the horizontal electrode may be substantially equal to a vertical width of the second portion of the horizontal electrode.

Other methods of forming the tunnel insulating layer 136 will now be described with reference to FIGS. 25A and 25B.

Figure 25A:
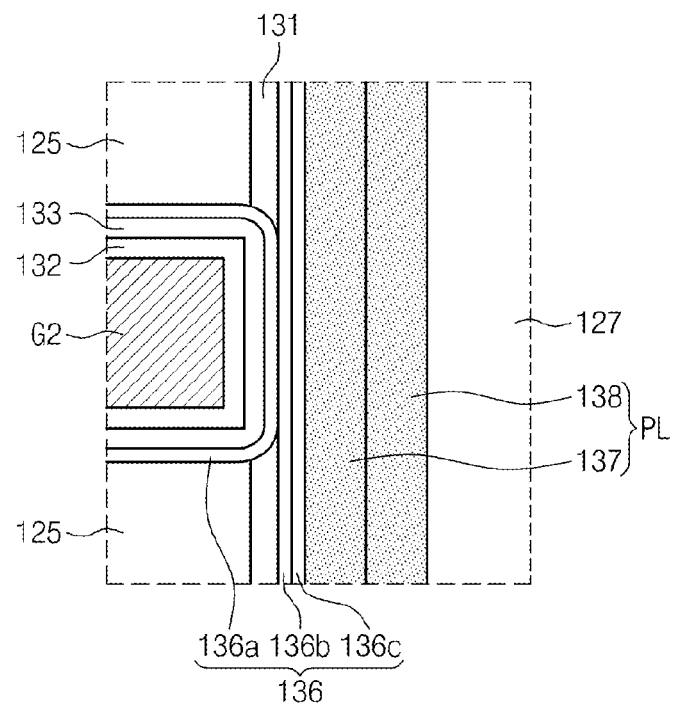
FIGS. 25A and 25B are enlarged views of a portion A of FIG. 24A to illustrate modified examples of a tunnel insulating layer.

Referring to FIG. 25A, in this example, the second tunnel insulating layer 136b and the third tunnel insulating layer 136c are formed on the protecting layer 131 at a point in the process corresponding to that shown in FIGS. 20A and 20B. Forming the second and third tunnel insulating layers 136b and 136c may include sequentially forming a second preliminary tunnel insulating layer and a third preliminary tunnel insulating layer on the protecting layer 131. For example, an energy band gap of the third preliminary tunnel insulating layer may be smaller than that of the second preliminary tunnel insulating layer. The second and third tunnel insulating layers may include at least one of a silicon oxynitride layer, a hafnium oxynitride layer, and an aluminum oxynitride layer. A nitrogen concentration of the third preliminary tunnel insulating layer may be higher than a nitrogen concentration of the second preliminary tunnel insulating layer. In an embodiment, the second and third preliminary tunnel insulating layers may be a silicon oxynitride layer having a low nitrogen concentration and a silicon oxynitride layer having a high nitrogen concentration that are sequentially stacked, respectively.

Subsequently, the energy ban gaps of the preliminary tunnel insulating layers are engineered. The method of engineering the energy band gaps of the preliminary tunnel insulating layers is similar to the engineering method described with reference to FIGS. 1A and 1B.

That is, the energy ban gaps of the preliminary tunnel insulating layers are engineered so that an energy band gap of the third tunnel insulating layer 136c is greater than that of the second tunnel insulating layer 136b. The second and third tunnel insulating layers 136b and 136c may include at least one of a silicon oxide layer, a hafnium oxide layer, and an aluminum oxide layer. The second and third tunnel insulating layers 136b and 136c may contain nitrogen, and a nitrogen concentration of the second tunnel insulating layer 136b may be higher than that of the third tunnel insulating layer 136c.

Next, the semiconductor pillar PL is formed on the third tunnel insulating layer 136c and then the recess region 150 is formed as described with reference to FIGS. 21A to 24B and 21B to 24B. The recess region 150 may expose the second tunnel insulating layer 136b through the protecting layer 131.

Referring again to FIG. 25A, the first tunnel insulating layer 136a is formed in the recess region 150. An energy band gap of the first tunnel insulating layer 136a is greater than that of the third tunnel insulating layer 136c. For example, the first tunnel insulating layer 136a may include at least one of a silicon oxide layer, a hafnium oxide layer, and an aluminum oxide layer. The charge storage layer 133, the blocking insulating layer 132, and the horizontal electrode are formed on the first tunnel insulating layer 136a in the recess region.

Figure 25B:
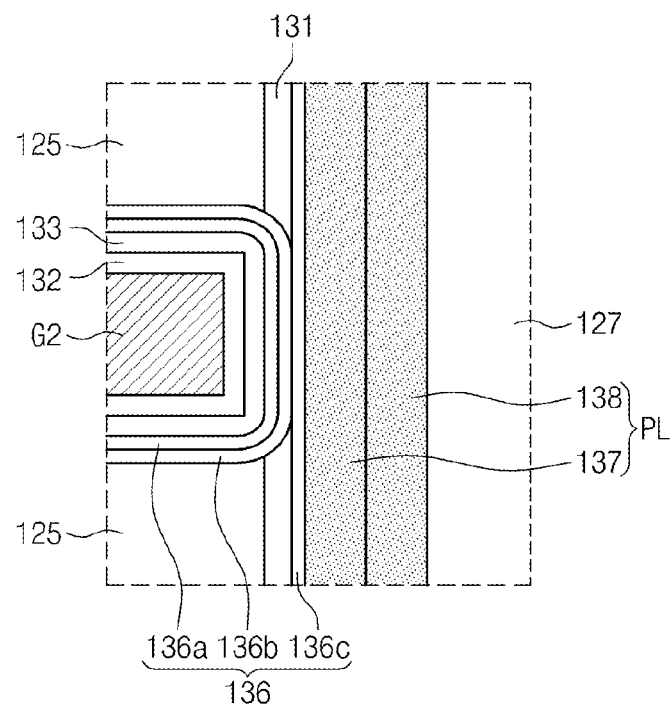

Alternatively, as shown in FIG. 25B, the third tunnel insulating layer 136c is formed on the protecting layer 131 at a point in the process corresponding to that shown in FIGS. 20A and 20B. The third tunnel insulating layer 136c may include at least one of a silicon oxynitride layer, a hafnium oxynitride layer, and an aluminum oxynitride layer.

The semiconductor pillar PL is formed on the third tunnel insulating layer 136c and then the recess region is formed as described above with reference to FIGS. 21A to 24A and 21B to 24B. Before the charge storage layer 133 is formed in the recess region, the second tunnel insulating layer 136b and the first tunnel insulating layer 136a may be sequentially formed in the recess region. The energy band gap of the second tunnel insulating layer 136b is smaller than that of the third tunnel insulating layer 136c. The energy band gap of the first tunnel insulating layer 136a is greater than that of the third tunnel insulating layer 136c. For example, the first tunnel insulating layer 136a may include at least one of a silicon oxide layer, a hafnium oxide layer, and an aluminum oxide layer. The second tunnel insulating layer 136b may include at least one of a silicon oxynitride layer, a hafnium oxynitride layer, and an aluminum oxynitride layer. The nitrogen concentration of the second tunnel insulating layer 136b may be higher than that of the third tunnel insulating layer 136c.

Figure 26:
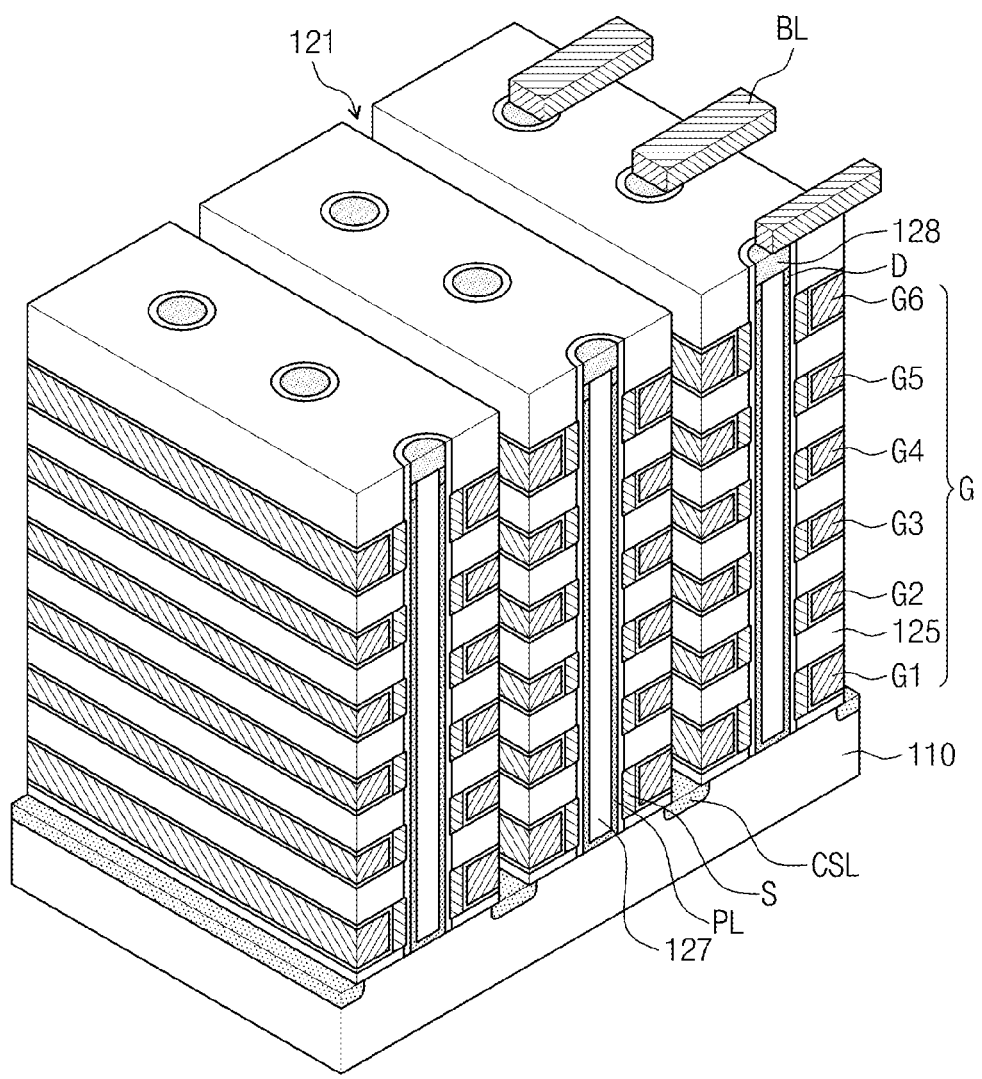
FIG. 26 is a perspective view of a memory block of another example of a semiconductor device according to the inventive concept.

FIG. 26 illustrates another example of a memory block of a semiconductor device according to of the inventive concept. In this example, features that are similar to those of the memory block of the embodiment of FIG. 5 may not be described detail or may only be described briefly. That is, mainly only the differences between the present example and that of FIG. 5 will be described hereinafter.

Referring to FIG. 26, a charge storage layer in a charge storage element S is a floating gate. The charge storage layer may be formed of, for example, poly-silicon. The charge storage layer may be confined to a space between each of the horizontal electrodes G1 to G6 and each of the semiconductor pillars PL.

FIGS. 27A and 28A and 27B and 28B illustrate yet another embodiment of a method of manufacturing a semiconductor device according to of the inventive concept.

Figure 27A:
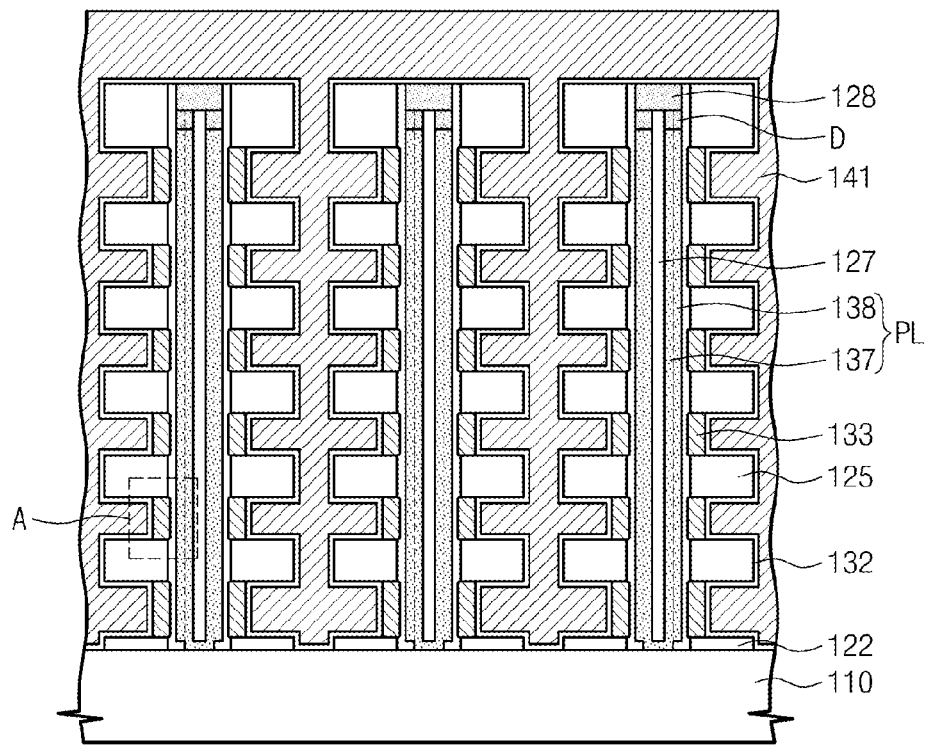
FIGS. 27A and 28A are cross-sectional views illustrating yet another embodiment of a method of manufacturing a semiconductor device according to the inventive concept.
Figure 27B:
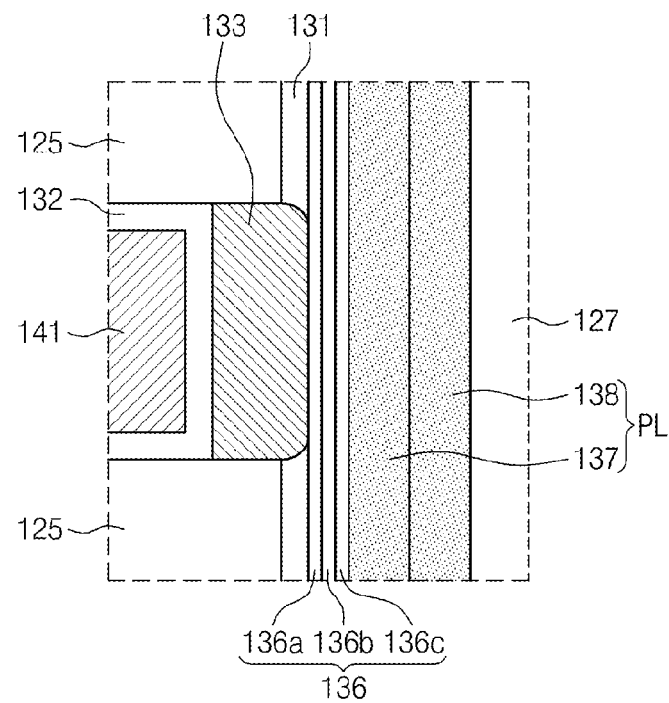
FIGS. 27B and 28B are enlarged views of portions A of FIGS. 27A and 28A, respectively.

Referring to FIGS. 27A and 27B, a poly-silicon layer is formed in the recess region 150 of FIGS. 22A and 22B. The poly-silicon layer in the separation region 121 and the poly-silicon layer adjacent to the separation region 121 in the recess region are removed. In other words, the poly-silicon layer in the separation region 121 may be removed and then the poly-silicon layer in the recess region 150 may be laterally recessed. Thus, only a portion of the poly-silicon layer, which is in contact with the tunnel insulating layer 136, remains to form the charge storage layer 133.

A blocking insulating layer 132 is formed on the charge storage layer 133. The blocking insulating layer 132 may be a multi-layer consisting of a plurality of thin layers. For example, the blocking insulating layer 132 may include an aluminum oxide layer and a silicon oxide layer. The blocking insulating layer 132 may be formed by an ALD method.

A conductive layer 141 is formed on the blocking insulating layer 132 through the separation regions 121. The conductive layer 141 may be formed of at least one of a doped poly-silicon layer, a metal layer (e.g., tungsten), and a metal nitride layer. The conductive layer 141 may be formed by an ALD method.

Figure 28A:
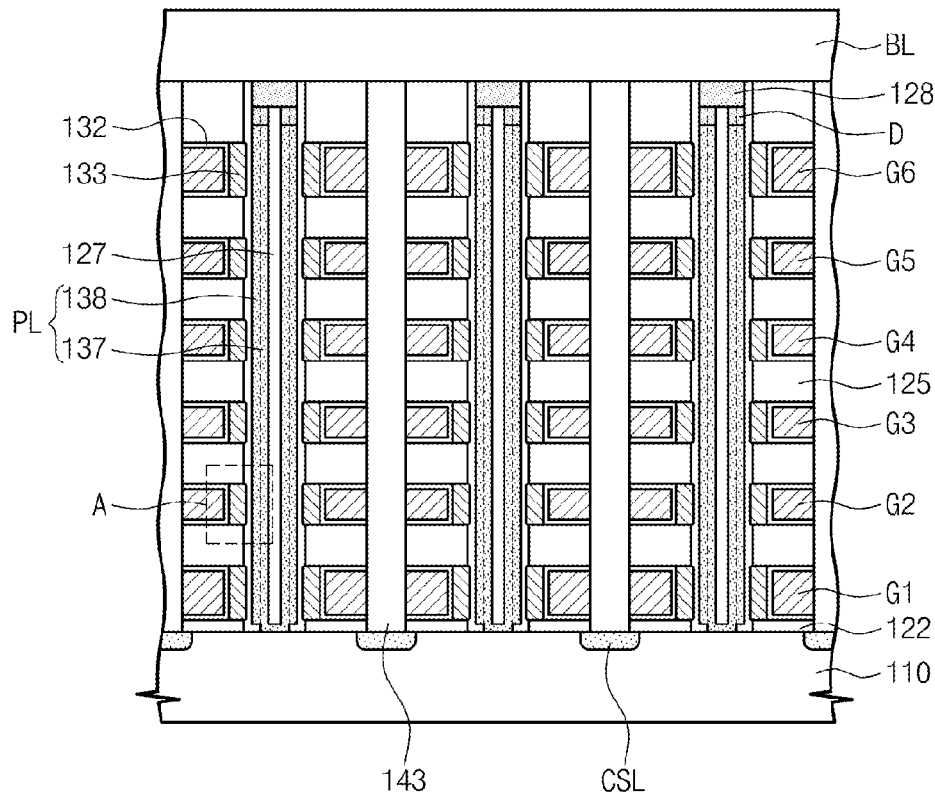
Figure 28B:
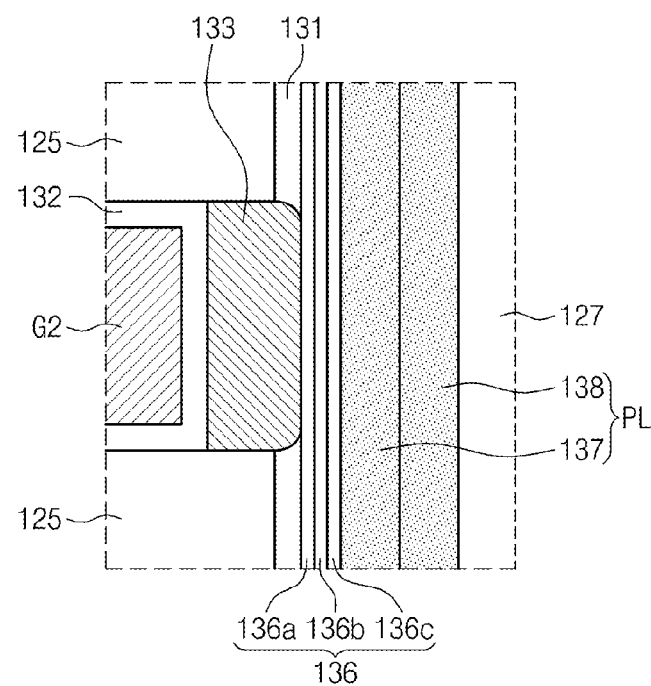

Referring to FIGS. 28A and 28B, the conductive layer 141 outside the recess regions 150 (e.g., in the separation regions 121) is removed to form horizontal electrodes G1 to G6 in the recess regions 150. If the conductive layer 141 is formed of the doped poly-silicon layer, a metal silicide layer may be additionally formed on the poly-silicon layer of each of the horizontal electrodes G1 to G6 after the horizontal electrodes G1 to G6 are formed. For example, portions of the poly-silicon layers of the horizontal electrodes G1 to G6, which are adjacent to the separation region 121, may be laterally recessed. A metal layer may be formed on the recessed poly-silicon layers of the horizontal electrodes G1 to G6 and then a thermal treatment may be performed on the metal layer to form the metal silicide layers on the recessed poly-silicon layers of the horizontal electrodes G1 to G6, respectively. Subsequently, an unreacted metal layer may be removed. The metal layer for the metal silicide layer may include tungsten, titanium, cobalt, or nickel.

The substrate 110 under the separation regions 121 is exposed by the removal of the conductive layer 141 for the formation of the horizontal electrodes G1 to G6. Dopant ions of the second conductivity type may be provided into the substrate 110 with a high dose, thereby forming common source lines CSL.

A separation insulating layer 143 is formed to fill each of the separation regions 121. The separation insulating layer 143 may extend in the first direction. The semiconductor pillars PL arranged in the second direction may be connected in common to one bit line BL.

A high voltage may be applied between the first horizontal electrode G1 and the bit line BL and between the sixth horizontal electrode G6 and the bit line BL, so that the blocking insulating layer 132 adjacent to each of the first and sixth horizontal electrodes G1 and G6 may be broken. Thus, the first horizontal electrode G1 may be electrically connected to the charge storage layer 133 adjacent thereto, and the sixth horizontal electrode G6 may be electrically connected to charge storage layer 133 adjacent thereto.

Referring to FIGS. 4, 26, 28A and 28B, the semiconductor device formed by the aforementioned method includes the semiconductor pillars PL penetrating the horizontal electrodes G1 to G6 and connected to the substrate 110, the charge storage layer 133 between the semiconductor pillars PL and the horizontal electrodes G1 to G6, the tunnel insulating layer 136 between the charge storage layer 133 and the semiconductor pillars PL, and the blocking insulating layer 132 between the charge storage layer 133 and the horizontal electrodes G1 to G6. A charge storage element S includes the blocking insulating layer 132, the charge storage layer 133, and the tunnel insulating layer 136.

The blocking insulating layer 132 may include a high-k dielectric layer (e.g., an aluminum oxide layer or a hafnium oxide layer). The blocking insulating layer 132 may be a multi-layer consisting of a plurality of thin layers. In embodiments, the blocking insulating layer 132 includes the aluminum oxide layer and/or the hafnium oxide layer. In other embodiments, the blocking insulating layer 132 includes at least one high-k dielectric layer (e.g., the aluminum oxide layer and/or the hafnium oxide layer) and a silicon oxide layer. The blocking insulating layer 132 may extend between the insulating patterns 125 and the horizontal electrodes G1 to G6.

The charge storage layer 133 is a floating gate. The charge storage layer 133 may be formed of, for example, poly-silicon. The charge storage layer 133 may be confined to a space between the blocking insulating layer 132 and the tunnel insulating layer 136.

The tunnel insulating layer 136 is similar to that formed as shown in and described with reference to FIGS. 14A and 14B.

The protecting layer 131 may be provided between the tunnel insulating layer 136 and the insulating patterns 125. The protecting layer 131 may include a silicon oxide layer.

Figure 29:
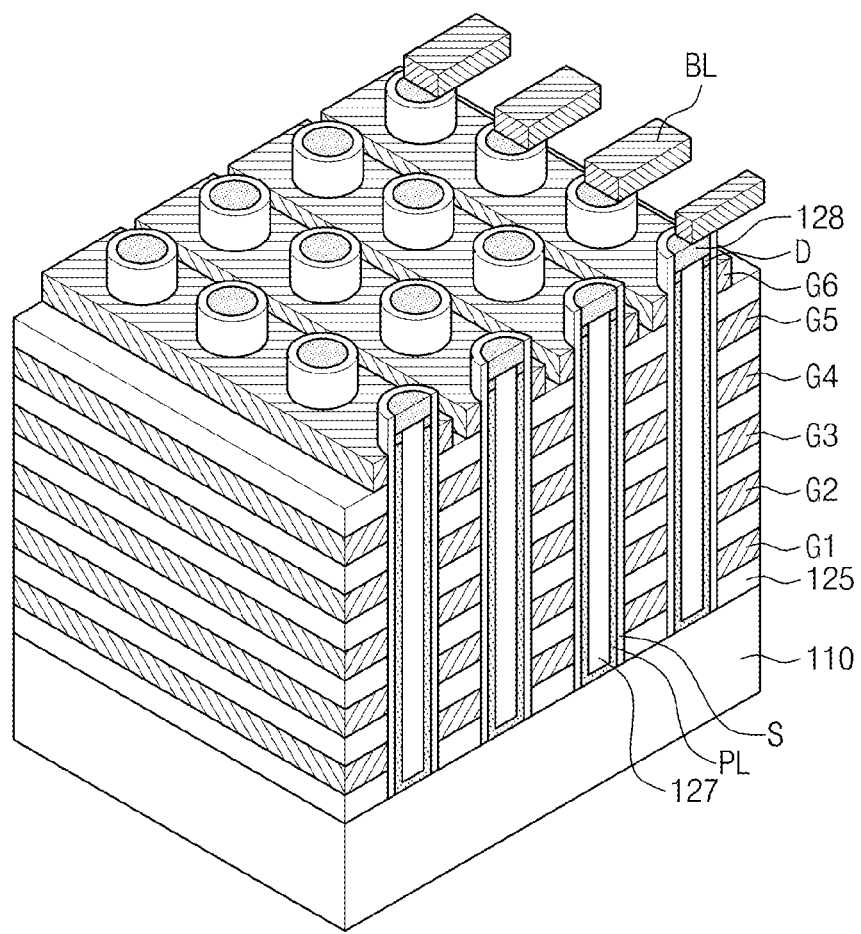
FIG. 29 is a perspective view of a memory block of another example of a semiconductor device according to the inventive concept.

FIG. 29 illustrates still another example of a memory block of a semiconductor device according to the inventive concept.

Referring to FIG. 29, a substrate 110 is provided. The substrate 110 may have a first conductivity type (e.g., a P-type). Insulating patterns 125 and horizontal electrodes are stacked on the substrate 110. The horizontal electrodes are spaced apart from each other with the insulating patterns 125 therebetween.

The horizontal electrodes may include first to sixth horizontal electrodes G1 to G6. The insulating patterns 125 may include silicon oxide. The horizontal electrodes G1 to G6 may include doped silicon, a metal (e.g., tungsten), a metal nitride, a metal silicide, or any combination thereof. An uppermost horizontal electrode G6 may extend in the first direction. The uppermost horizontal electrode G6 may be an upper selection gate of a flash memory device. A lowermost horizontal electrode G1 may be a lower selection gate of the flash memory device. The upper selection gate and the lower selection gate may be a string selection gate and a ground selection gate, respectively. Six horizontal electrodes G1 to G6 are illustrated in FIG. 29. However, the inventive concept is not limited thereto. The number of the stacked horizontal electrodes may be seven or more.

Semiconductor pillars PL penetrate the horizontal electrodes G1 to G6. Each of the semiconductor pillars PL has a long axis extending upward from the substrate (i.e., in the third direction). The semiconductor pillars PL may be coupled to the upper selection gate extending in the first direction. First ends of the semiconductor pillars PL are connected to the substrate 110, and second ends of the semiconductor pillars PL are connected to bit lines BL extending in the second direction.

A data storage element S may be provided between each of the first to sixth horizontal electrodes G1 to G6 and each of the semiconductor pillars PL. Alternatively, i.e., instead of the data storage element S, a gate insulating layer may be provided between each of the first to sixth horizontal electrodes G1 to G6 and each of the semiconductor pillars PL.

The semiconductor pillars PL include a semiconductor material. Each of the semiconductor pillars PL may have a filled cylinder shape or a hollow cylinder shape (e.g., a macaroni shape or a hollow tube shape). The inside of the semiconductor pillar PL having the macaroni shape may be filled with a filling insulating layer 127. The filling insulating layer 127 may be formed of a silicon oxide layer. The filling insulating layer 127 may be in direct contact with an inner sidewall of the semiconductor pillar PL. The semiconductor pillars PL and the substrate 110 may be contiguous without interfaces therebetween. In other words, the semiconductor pillars PL and the substrate 110 may constitute a unitary structure. In this case, the semiconductor pillars PL may be formed of a single-crystalline semiconductor. Alternatively, discontinuous interfaces may exist between the substrate 110 and the semiconductor pillars PL. In this case, the semiconductor pillars PL may be poly-crystalline or amorphous semiconductor pillars. Conductive patterns 128 may be provided on the second ends of the semiconductor pillars PL, respectively. End portions of the semiconductor pillars PL, which are in contact with the conductive patterns 128, respectively, may be drain regions D.

A plurality of cell strings are provided between the bit lines BL and the substrate 110. Each of the cell strings may include an upper selection transistor connected to the bit line BL, a lower selection transistor connected to the substrate 110, and a plurality of memory cells provided between the upper selection transistor and the lower selection transistor. The first horizontal electrode G1 may be a lower selection gate of the lower selection transistor, and the second to fifth horizontal electrodes G2 to G5 may be cell gates of the plurality of memory cells. The sixth horizontal electrode G6 may be an upper selection gate of the upper selection transistor. The plurality of memory cells are provided at one semiconductor pillar PL. A common source region may be disposed in the substrate 110, and the lower selection transistor may be connected to the common source region.

Yet another embodiment of a method of manufacturing a semiconductor device according to the inventive concept will be described hereinafter.

Figure 30A:
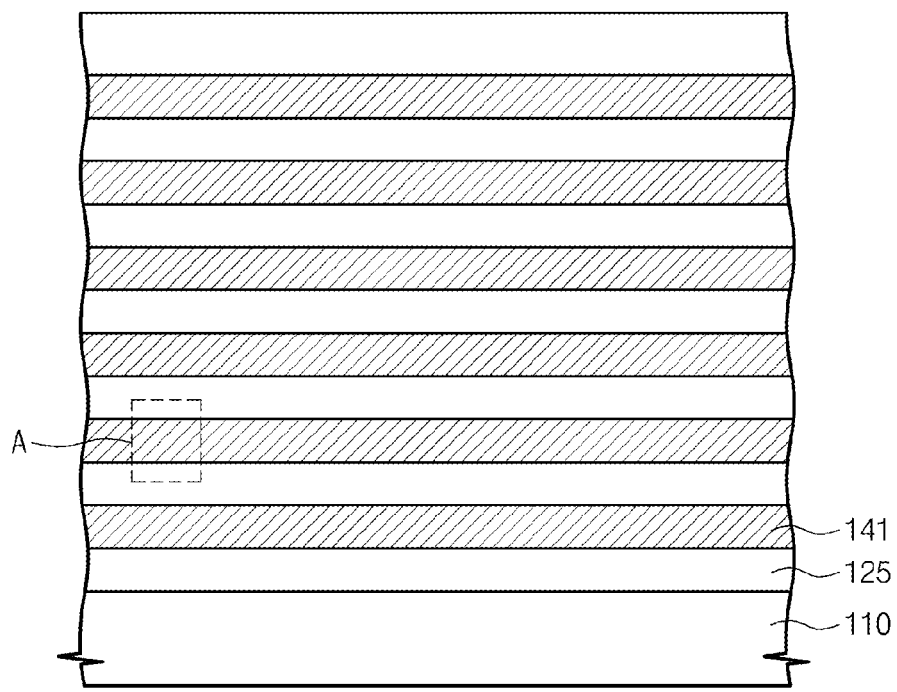
FIGS. 30A, 31A, 32A, 33A and 34A are cross-sectional views taken along a direction corresponding to that of line I-I' in FIG. 4 illustrating yet still another embodiment of a method of manufacturing a semiconductor device according to the inventive concept.
Figure 30B:
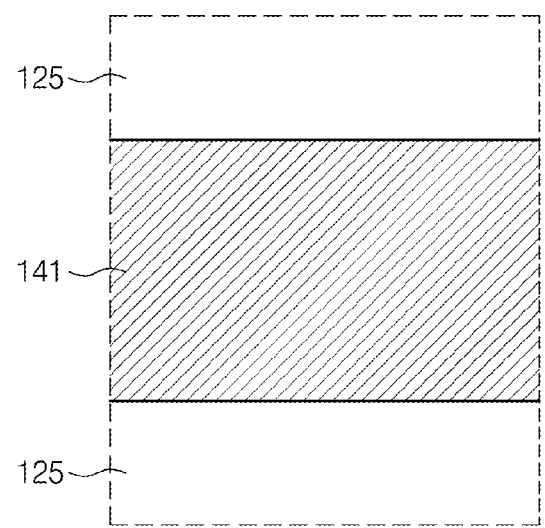
FIGS. 30B, 31B, 32B, 33B and 34B are enlarged views of portions A of FIGS. 30A, 31A, 32A, 33A and 34A, respectively.

Referring to FIGS. 30A and 30B, a substrate 110 is provided. The substrate 110 may have a first conductivity type (e.g., a P-type). Insulating patterns 125 and the conductive layers 141 may be alternately stacked on the substrate 110. The insulating patterns 125 may be formed of silicon oxide.

The conductive layers 141 may be formed of at least one of a doped poly-silicon layer, a metal layer (e.g., tungsten), a metal nitride layer, and a metal silicide layer. The conductive layers 141 may be formed by a CVD method.

Figure 31A:
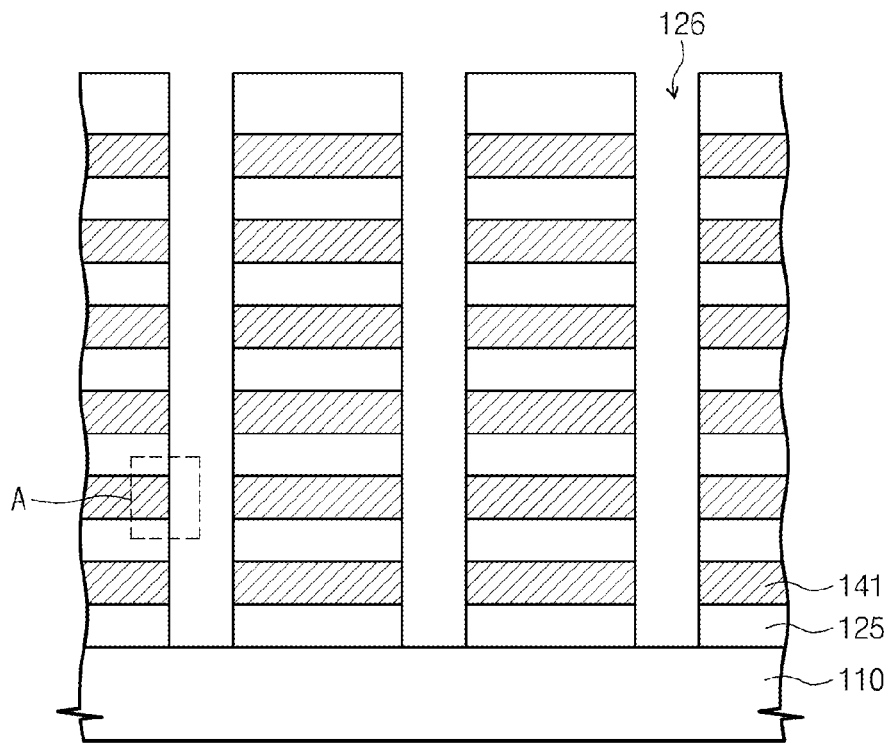
Figure 31B:
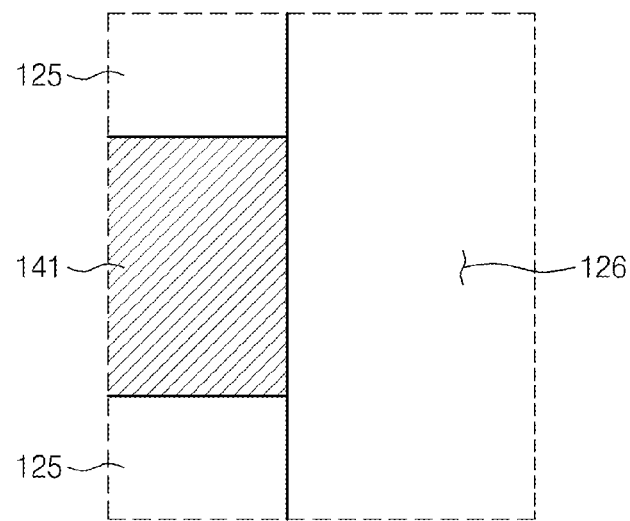

Referring to FIGS. 31A and 31B, cell holes 126 are formed to penetrate the insulating patterns 125 and the conductive layers 141. The cell holes 126 may expose the substrate 110. The cell holes 126 may be disposed at positions of the semiconductor pillars PL described with reference to FIG. 4, respectively.

Figure 32A:
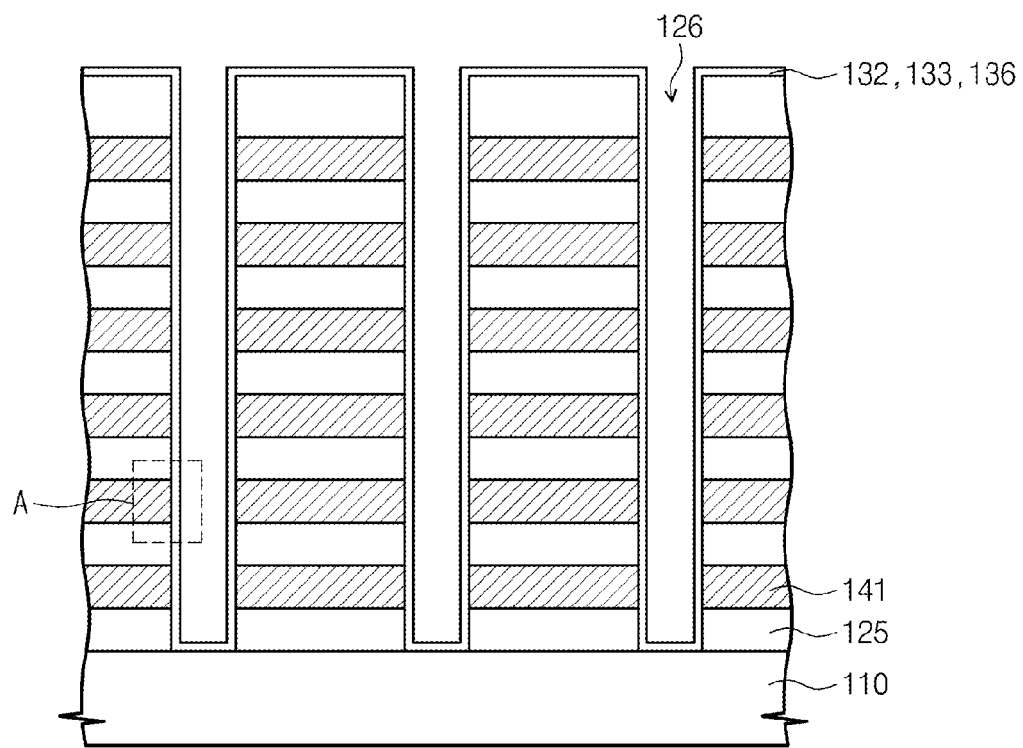
Figure 32B:
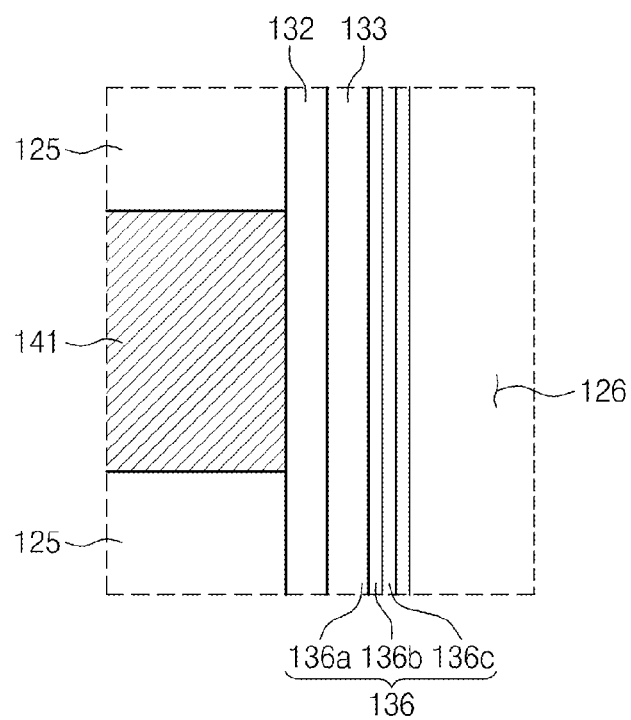

Referring to FIGS. 32A and 32B, a blocking insulating layer 132 is formed on surfaces delimiting the cell holes 126. The blocking insulating layer 132 may be a multi-layer consisting of a plurality of thin layers. For example, the blocking insulating layer 132 may include an aluminum oxide layer and a silicon oxide layer. The blocking insulating layer 132 may be formed by an ALD method.

A charge storage layer 133 is formed on the blocking insulating layer 132. The charge storage layer 133 may be a charge trap layer or an insulating layer including conductive nano particles. The charge trap layer may include, for example, a silicon nitride layer.

A tunnel insulating layer 136 is formed on the charge storage layer 133. The tunnel insulating layer 136 includes a first tunnel insulating layer 136a, a second tunnel insulating layer 136b, and a third tunnel insulating layer 136c. The tunnel insulating layer 136 is formed by the reverse type tunnel insulating layer formation process according to the inventive concept, as described with reference to FIGS. 1A and 1B. The tunnel insulating layer 136 may thus have a structure and energy band gap similar to those of any of the tunnel insulating layers 6 described with reference to FIGS. 1B and 1C.

Figure 33A:
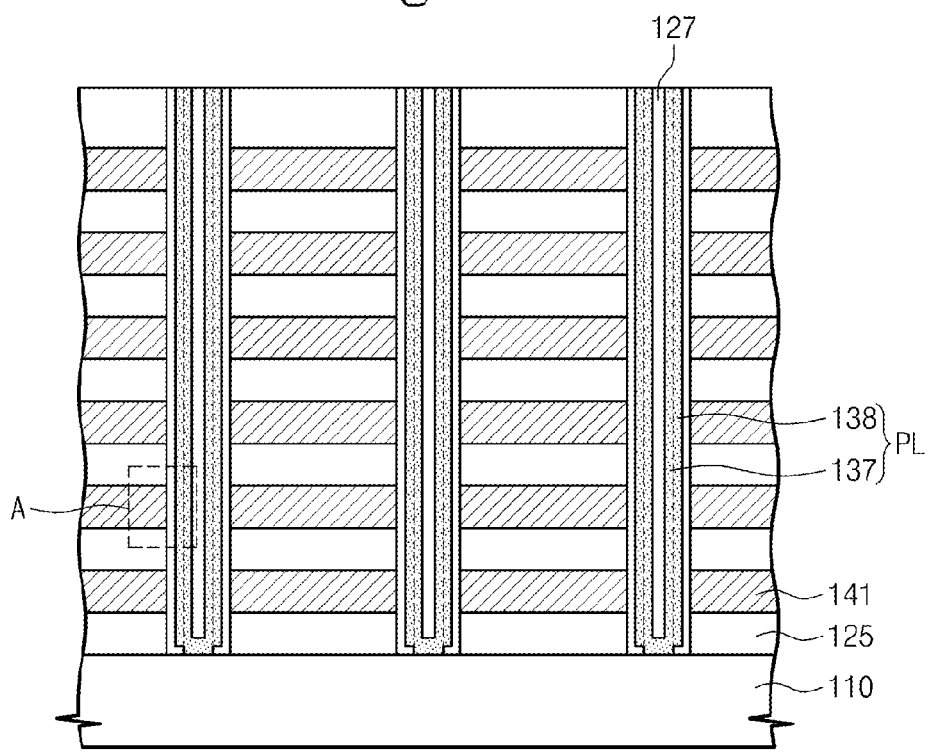
Figure 33B:
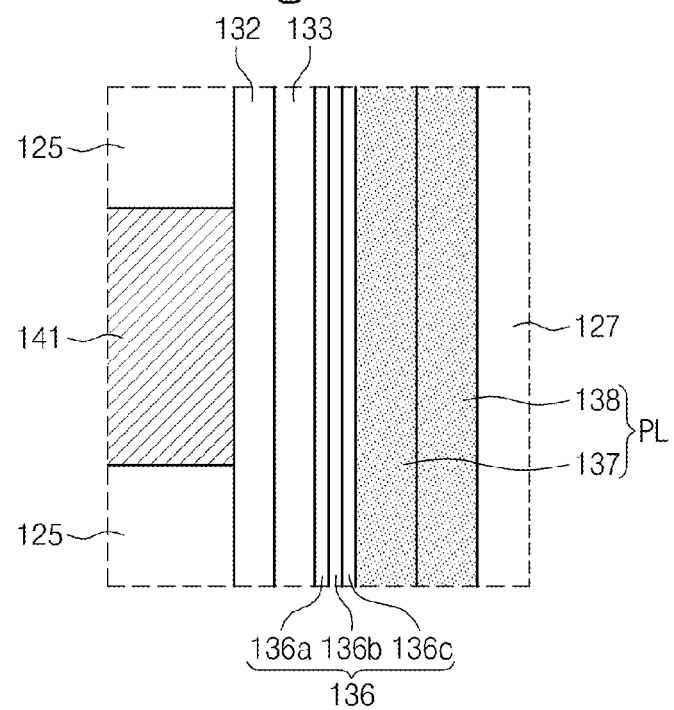

Referring to FIGS. 33A and 33B, a first semiconductor layer 137 is formed on the tunnel insulating layer 136. The first semiconductor layer 137 may be anisotropically etched to expose the substrate 110. Thus, the first semiconductor layer 137 may be formed into a semiconductor layer 137 remaining on a sidewall of the tunnel insulating layer 136. A second semiconductor layer 138 may be formed on the first semiconductor layer 137. The first and second semiconductor layers 137 and 138 may be formed by an ALD method. The first and second semiconductor layers 137 and 138 may be in an amorphous state. For example, the first and second semiconductor layers 137 and 138 may be amorphous silicon layers. A thermal treatment process may be performed to convert the amorphous state of the first and second semiconductor layers 137 and 138 into a poly-crystalline state or a single-crystalline state. For example, the amorphous silicon layers of the first and second semiconductor layers 137 and 138 may be converted into poly-silicon layers or single-crystalline silicon layers by the thermal treatment process.

The second semiconductor layer 138 does not completely fill the cell holes 126, and an insulating material is formed on the second semiconductor layer 138 to completely fill the cell holes 126. The second semiconductor layer 138 and the insulating material may be planarized to expose a tope surface of the uppermost second material layer. Thus, semiconductor pillars PL may be formed to have cylinder shapes of which the insides are filled with filling insulating layers 127, respectively. The semiconductor pillars PL may have the first conductivity type. As an alternative to the steps shown in and described with reference to FIGS. 33A and 33B, the second semiconductor layer 138 may fill the cell hole 126. In this case, the filling insulating layer 127 is omitted.

Figure 34A:
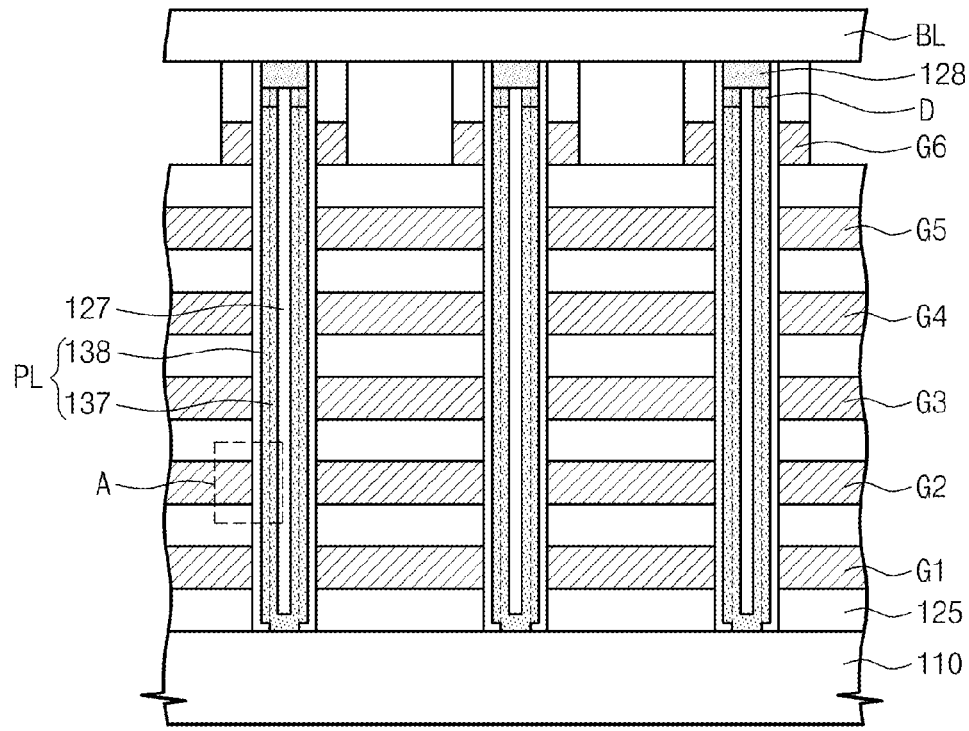
Figure 34B:
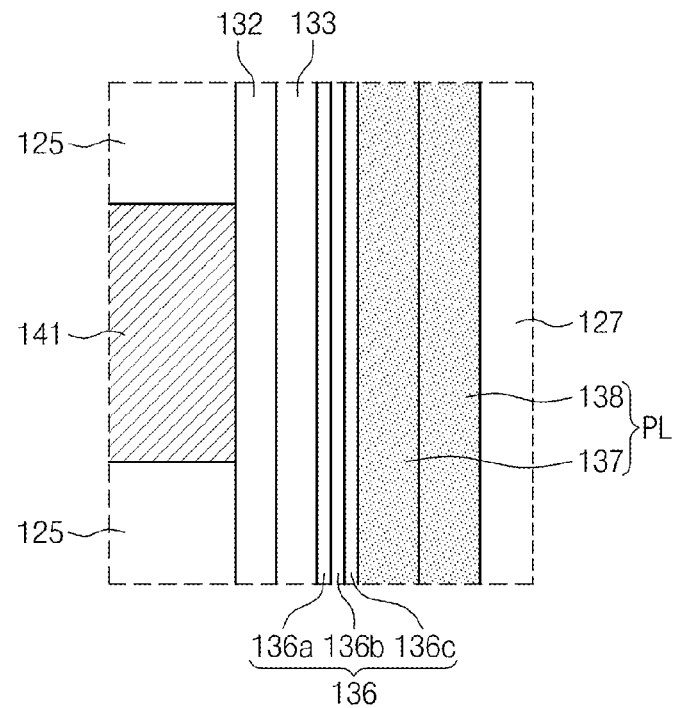

Referring to FIGS. 34A and 34B, upper portions of the semiconductor pillars PL are recessed to be lower than a top surface of the uppermost second material layer. Conductive patterns 128 are formed in the cell holes 126 on the recessed semiconductor pillars PL, respectively. The conductive patterns 128 may include doped poly-silicon and/or a metal. Dopant ions of a second conductivity type may be implanted into the conductive patterns 128 and upper portions of the semiconductor pillars PL to form drain regions D. The second conductivity type may be, for example, an N-type.

An uppermost conductive layer is patterned to form string selection gate G6 extending in the first direction. The semiconductor pillars PL arranged in the second direction may be connected in common to one bit line BL.

Referring to FIGS. 4, 26, 34A and 34B, the semiconductor device formed by the aforementioned method includes the semiconductor pillars PL penetrating the horizontal electrodes G1 to G6 and connected to the substrate 110, the charge storage layer 133 between the semiconductor pillars PL and the horizontal electrodes G1 to G6, the tunnel insulating layer 136 between the charge storage layer 133 and the semiconductor pillars PL, and the blocking insulating layer 132 between the charge storage layer 133 and the horizontal electrodes G1 to G6.

The blocking insulating layer 132 may include a high-k dielectric layer (e.g., an aluminum oxide layer or a hafnium oxide layer). The blocking insulating layer 132 may be a multi-layer consisting of a plurality of thin layers. In embodiments, the blocking insulating layer 132 may include the aluminum oxide layer and/or the hafnium oxide layer. In other embodiments, the blocking insulating layer 132 may include at least one high-k dielectric layer (e.g., the aluminum oxide layer and/or the hafnium oxide layer) and a silicon oxide layer. The blocking insulating layer 132 may extend between the insulating patterns 125 and the semiconductor pillars PL.

The charge storage layer 133 may be a charge trap layer or an insulating layer including conductive nano particles. The charge trap layer may include, for example, a silicon nitride layer. The charge storage layer 133 may extend between the insulating patterns 125 and the semiconductor pillars PL.

The tunnel insulating layer 136 is similar to any of the tunnel insulating layers 6 shown in and described with reference to FIGS. 1B and 1C.

Figure 35:
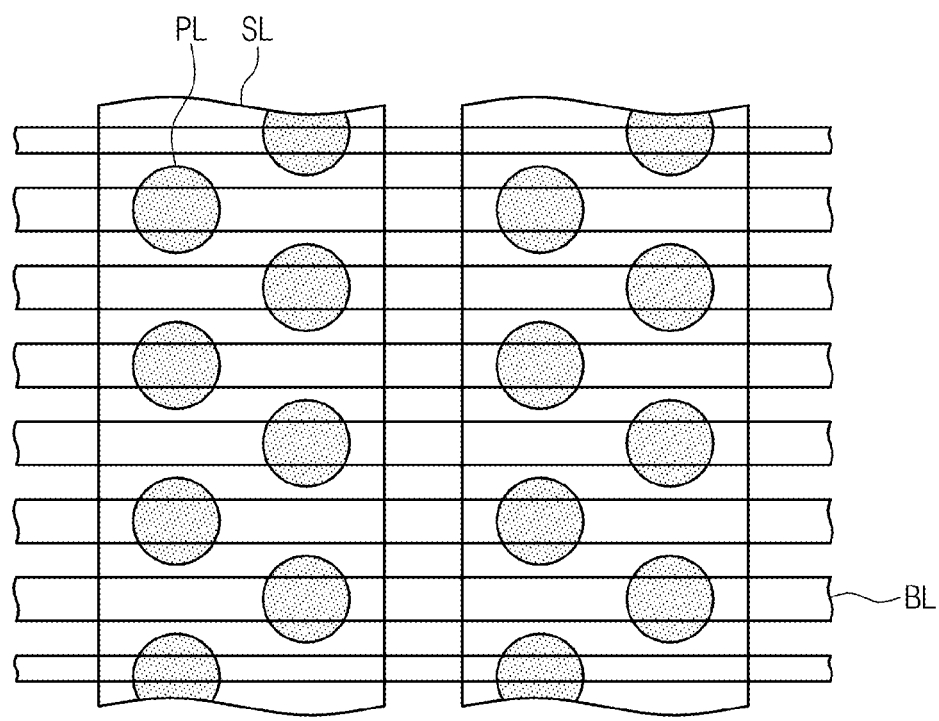
FIG. 35 is a plan view of a memory block of another example of a semiconductor device according to the inventive concept.

In the embodiments described above, the bit lines, the horizontal electrodes and the semiconductor pillars may be arranged as shown in and described with reference to FIG. 4. However, the inventive concept is not limited thereto. In another embodiment, the arrangement of the bit lines, the horizontal electrodes, and the semiconductor pillar may be similar to that shown in FIG. 35. For example, the semiconductor pillars PL coupled to each selection line SL may be arranged in zigzag form when viewed from the top. In other words, in a plan view, even numbered semiconductor pillars of the semiconductor pillars PL coupled to each selection line SL are laterally offset from odd numbered semiconductor pillars thereof.

Figure 36:
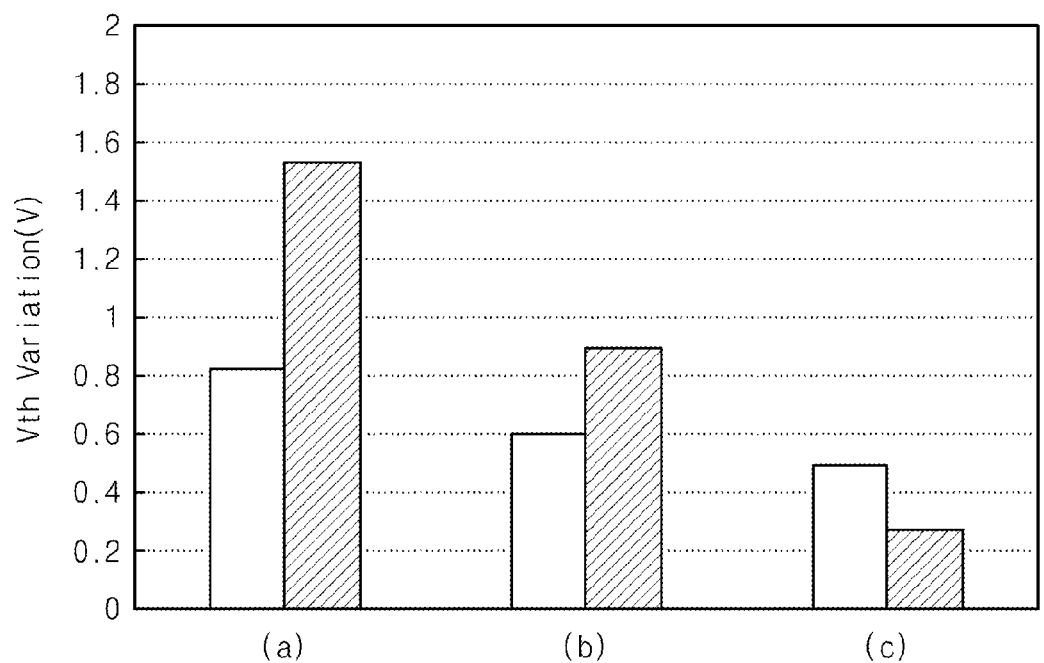
FIG. 36 is a graph illustrating retention and endurance characteristics of a tunnel insulating layer in a vertical NAND flash memory device.

FIG. 36 is a graph illustrating a retention characteristic (blank bar) and an endurance characteristic (hatched bar) of a tunnel insulating layer in a vertical NAND flash memory device. A reference designator (a) relates to a reverse type tunnel insulating layer formed by a conventional method. The conventional reverse type tunnel insulating layer was a silicon oxide layer formed in a cell hole. The engineering of the energy band gap according to the inventive concept was not applied to the general reverse type tunnel insulating layer. A semiconductor layer (i.e., a semiconductor pillar) was formed on the conventional reverse type tunnel insulating layer. A reference designator (b) relates to the reverse type tunnel insulating layer formed by the method according to the inventive concept. A reference designator (c) relates to a non-reverse tunnel insulating layer deposited on a semiconductor layer (i.e., a semiconductor pillar), not a reverse type tunnel insulating layer. In this case, the semiconductor pillar was formed in the cell hole. A tunnel insulating layer, a charge storage layer, and a blocking insulating layer were sequentially formed in the recess region. The general tunnel insulating layer was a silicon oxide layer.

Referring to FIG. 36, the conventional reverse type tunnel insulating layer (a) has poor retention and poor endurance as compared with the non-reverse tunnel insulating layer (c). In other words, a vertical NAND flash memory having a reverse type tunnel insulating layer formed by the conventional method is not highly reliable.

On the other hand, the reverse type tunnel insulating layer (b) according to the inventive concept has improved retention and improved endurance as compared with the conventional reverse type tunnel insulating layer (a). According to an aspect of the inventive concept, an interface between the semiconductor pillar and the tunnel insulating layer, which is used as a channel, is rich in nitrogen atoms. Therefore, dangling bonds are minimized at the interface between the semiconductor pillar and the tunnel insulating layer. That is, a semiconductor device formed according to the inventive concept has improved interface characteristics between the semiconductor pillar and the reverse type tunnel insulating layer.

Meanwhile, dispersion of the retention and endurance of the reverse type tunnel insulating layer (b) of the inventive concept was smaller than that of the conventional reverse type tunnel insulating layer (a).

Figure 37:
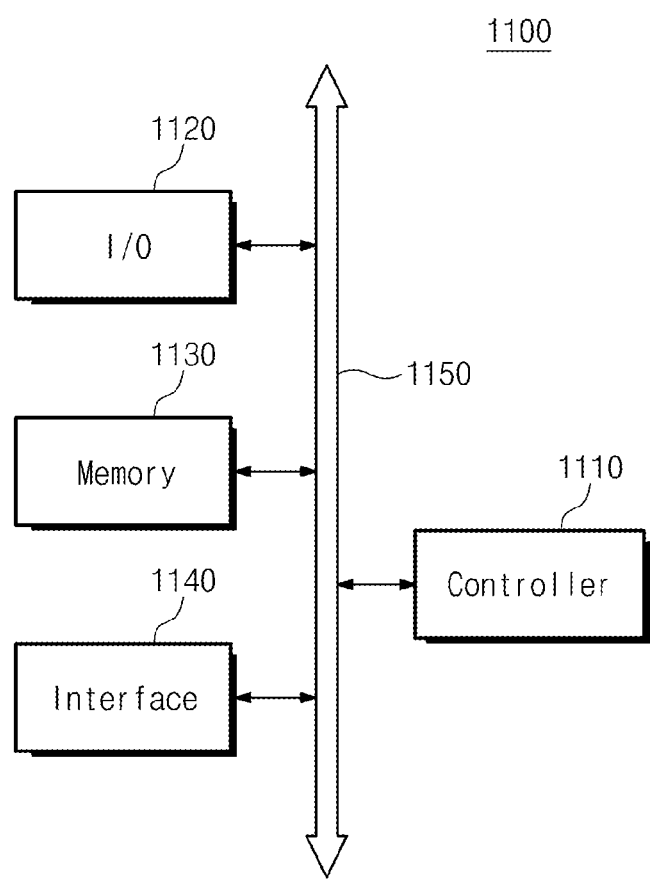
FIG. 37 is a block diagram of an example of electronic system including semiconductor devices according to the inventive concept.

FIG. 37 illustrates a basic layout of various electronic devices that may include semiconductor devices according to the inventive concept.

Referring to FIG. 37, an electronic device 1100 according to the inventive concept includes a controller 1110, an input/output (I/O) unit 1120, a memory device 1130, an interface unit 1140, and a data bus 1150. The data bus 1150 provides a path along which electrical signals are transmitted. At least two of the controller 1110, the I/O unit 1120, the memory device 1130 and the interface unit 1140 communicate with each other through the data bus 1150. The memory device 1130 includes at least one semiconductor device according to embodiments of the inventive concept.

The controller 1110 may include at least one of a microprocessor, a digital signal processor, a microcontroller and another logic device. The other logic device may have a similar function to any one of the microprocessor, the digital signal processor and the microcontroller. The I/O unit 1120 may include a keypad, a keyboard and/or a display unit. The memory device 1130 stores data and/or commands. The interface unit 1140 may transmit electrical data to a communication network or may receive electrical data from a communication network. The interface unit 1140 may operate by wireless or cable. For example, the interface unit 1140 may include an antenna for wireless communication or a transceiver for cable communication. Although not shown in the drawings, the electronic device 1100 may further include a fast DRAM device and/or a fast SRAM device which acts as a cache memory for improving an operation of the controller 1110.

The electronic device 1100 may be embodied as a personal digital assistant (PDA), a portable computer, a web tablet, a wireless phone, a mobile phone, a digital music player, a memory card, or other electronic product capable of transmitting and/or receiving data in wireless environment.

Figure 38:
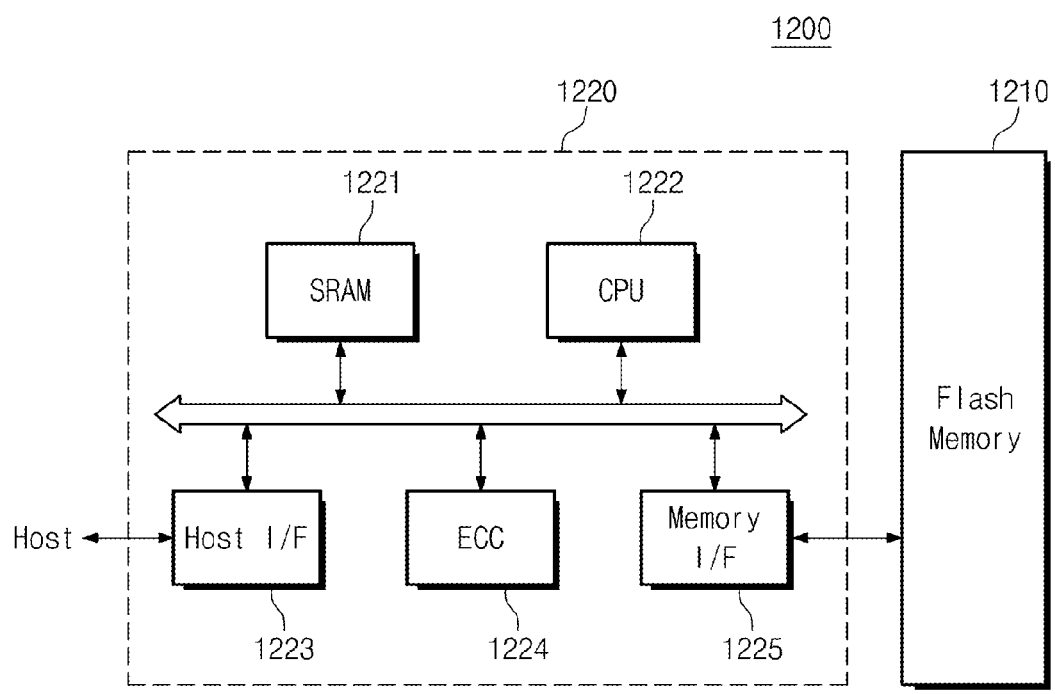
FIG. 38 is a block diagram of an example of a memory card including semiconductor devices according to the inventive concept.

FIG. 38 illustrates a basic layout of various types of memory cards that may include semiconductor devices according to the inventive concept.

Referring to FIG. 38, a memory card 1200 includes a memory device 1210. The memory card 1200 also includes a memory controller 1220 that controls data communication between a host and the memory device 1210. The memory device 1210 and/or the controller 1220 include(s) a semiconductor device according to the inventive concept. Additionally, the memory device 1210 may further include at least one other type of semiconductor memory device (constituting a DRAM and/or a SRAM, for example).

The memory controller 1220 includes a central processing unit (CPU) 1222 that controls overall operations of the memory card 1200. In addition, the memory controller 1220 includes an SRAM device 1221 used as an operation memory of the CPU 1222. Moreover, the memory controller 1220 further includes a host interface unit 1223 and a memory interface unit 1225. The host interface unit 1223 is configured to include a data communication protocol between the memory card 1200 and the host. The memory interface unit 1225 connects the memory controller 1220 to the memory device 1210. The memory controller 1220 may further include an error check and correction (ECC) block 1224. The ECC block 1224 detects and corrects errors of data which are read out from the memory device 1210. Even though not shown in the drawings, the memory card 1200 may further include a read only memory (ROM) device that stores code data to interface with the host. The memory card 1200 may be used as a portable data storage card. Alternatively, the memory card 1200 may be realized as solid state drive (SSD) used as a hard drive of a computer system.

Figure 39:
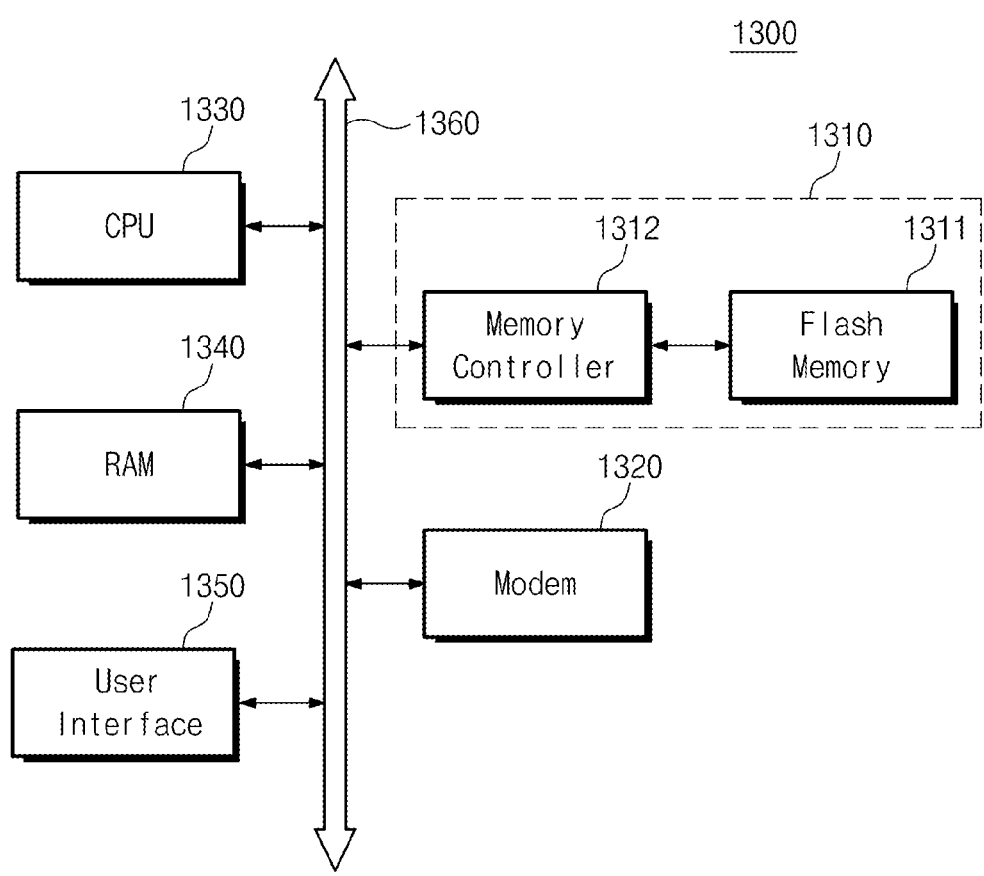
FIG. 39 is a block diagram of an information processing system including semiconductor devices according to the inventive concept.

FIG. 39 illustrates an example of the basic layout of an information processing systems that may include semiconductor devices according to the inventive concept.

Referring to FIG. 39, the information processing system 1300 may be installed that of a mobile device or a desk top computer. The information processing system 1300 may include a flash memory system 1310, and a modem 1320, a central processing unit (CPU) 1330, a RAM 1340, and a user interface unit 1350 electrically connected to the flash memory system 1310 through a system bus 1360. The flash memory system 1310 may be realized in the form of a memory card having the layout/structure described with reference to FIG. 38. Data processed by the CPU 1330 and/or inputted from an external system may be stored in the flash memory system 1310.

The flash memory system 1310 includes a semiconductor device according to the inventive concept and thus may be provided as a solid state drive SSD. In this case, the information processing system 1300 can reliably store a large amount of data in the memory system 1310. This increase in reliability enables the memory system 1310 to conserve resources for error correction, such that the information processing system 1300 may offer a high speed data exchange function. Although not shown in the drawings, the information processing system 1300 may further include an application chipset, a camera image processor (CIS), and/or an input/output device.

A semiconductor device according to the inventive concept (or memory card including such a device) may be encapsulated using various packaging techniques. For example, the semiconductor devices may be encapsulated using any one of a package on package (POP) technique, a ball grid array (BGA) technique, a chip scale package (CSP) technique, a plastic leaded chip carrier (PLCC) technique, a plastic dual in-line package (PDIP) technique, a die in waffle pack technique, a die in wafer form technique, a chip on board (COB) technique, a ceramic dual in-line package (CERDIP) technique, a plastic metric quad flat package (PMQFP) technique, a plastic quad flat package (PQFP) technique, a small outline package (SOIC) technique, a shrink small outline package (SSOP) technique, a thin small outline package (TSOP) technique, a thin quad flat package (TQFP) technique, a system in package (SIP) technique, a multi chip package (MCP) technique, a wafer-level fabricated package (WFP) technique and a wafer-level processed stack package (WSP) technique.

According to the inventive concept, the retention and endurance characteristics of the reverse type tunnel insulating layer may be improved. Additionally, the interface characteristics between the semiconductor pillar and the reverse type tunnel insulating layer may be improved.

Finally, embodiments of the inventive concept and examples thereof have been described above in detail. The inventive concept may, however, be embodied in many different forms and should not be construed as being limited to the embodiments described above. Rather, these embodiments were described so that this disclosure is thorough and complete, and fully conveys the inventive concept to those skilled in the art. Thus, the true spirit and scope of the inventive concept is not limited by the embodiment and examples described above but by the following claims.

What is claimed is:

1. A method of manufacturing a semiconductor device comprising:
   alternately forming first material layers and second material layers on a substrate;
   forming a hole through the second material layers and the first material layers and exposing the substrate;
   forming a first tunnel insulation layer on an inner sidewall surface delimiting sides of the hole, forming a second tunnel insulating layer on the first tunnel insulating layer, and forming a third tunnel insulating layer on the second tunnel insulating layer such that the second tunnel insulating layer is located between the first and third tunnel insulating layers, and such that the nitrogen concentration of the third tunnel insulating layer is lower than that of the second tunnel insulating layer and higher than that of the first tunnel insulating layer; and
   subsequently forming a semiconductor layer directly on the third tunnel insulation layer so as to be in contact with the third tunnel insulation layer,
   wherein the forming the tunnel insulating layers comprises:
   sequentially forming a first preliminary insulating layer, a second preliminary insulating layer, and a third preliminary insulating layer on the inner sidewall surface delimiting the sides of the hole, and
   performing an oxidation treatment to convert the first preliminary insulating layer, the second preliminary insulating layer, and the third preliminary insulating layer to the first tunnel insulating layer, the second tunnel insulating layer, and the third tunnel insulating layer, respectively,
   the first preliminary insulating layer includes at least one of a silicon oxide layer, a hafnium oxide layer, and an aluminum oxide layer,
   wherein the second and third preliminary insulating layers each include at least one of a silicon oxynitride layer, a hafnium oxynitride layer, and an aluminum oxynitride layer, and
   wherein a nitrogen concentration of the third preliminary insulating layer is higher than that of the second preliminary insulating layer.

2. The method of claim 1, wherein the first, second, and third tunnel insulating layers include at least one of a silicon oxide layer, a hafnium oxide layer, and an aluminum oxide layer.

3. The method of claim 1, further comprising:
   selectively removing the first material layers to form recesses between the second material layers, and
   forming gate electrodes in the recesses, respectively.

4. The method of claim 3, further comprising:
   forming a charge storage layer on the inner sidewall surface, that delimits the sides of the hole, before forming the first preliminary insulating layer.

5. The method of claim 4, further comprising:
   forming a blocking insulating layer in the recesses before forming the gate electrodes.

6. The method of claim 4, further comprising:
   forming a blocking insulating layer on the inner sidewall surface, that delimits the sides of the hole, before forming the charge storage layer.

7. The method of claim 3, further comprising:
   sequentially forming a charge storage layer and a blocking insulating layer in the recesses before forming the gate electrodes.

8. The method of claim 1, wherein each of the first material layers comprises a silicon oxide layer, and
   each of the second material layers comprises a conductive layer.

9. A method of manufacturing a semiconductor device, comprising:
   alternately forming first material layers and second material layers on a substrate;
   forming a hole through the second material layers and the first material layers and exposing the substrate;
   forming a first tunnel insulating layer on an inner sidewall surface delimiting sides of the hole, forming a second tunnel insulating layer on the first tunnel insulating layer, and forming a third tunnel insulating layer on the second tunnel insulating layer such that the second tunnel insulating layer is located between the first and third tunnel insulating layers, and such that the nitrogen concentration of the third tunnel insulating layer is lower than that of the second tunnel insulating layer and higher than that of the first tunnel insulating layer; and
   subsequently forming a semiconductor layer directly on the third tunnel insulating layer so as to be in contact with the third tunnel insulating layer,
   wherein the forming the tunnel insulating layers comprises forming a first preliminary insulating layer on the inner sidewall surface delimiting the sides of the hole,
   forming a second preliminary insulating layer on the first preliminary insulating layer,
   forming a third preliminary insulating layer, having a nitrogen concentration higher than that of the second preliminary insulating layer, on the second preliminary insulating layer, and
   performing a treatment that decreases the nitrogen concentration of the third preliminary insulating layer relative to that of the second preliminary insulating layer.

10. The method of claim 9, wherein the treatment comprises thermally treating the structure constituted by the substrate and the preliminary insulating layers.

11. The method of claim 10, wherein the treatment is performed under an oxidation atmosphere.

12. The method of claim 11, wherein the oxidation atmosphere is an $N_2O$ gas atmosphere or an NO gas atmosphere.

13. The method of claim 10, wherein the treatment is a radical oxidation process or a plasma oxidation process.

14. The method of claim 10, wherein the treatment is performed at a temperature in a range of 750 degrees Celsius to 950 degrees Celsius.

15. The method of claim 9, wherein the treatment comprises supplying oxygen into the second preliminary insulating layer, and supplying oxygen into the third preliminary insulating layer in an amount greater than that supplied into the second preliminary insulating layer.

* * * * *